(12) United States Patent
Masuoka et al.

(10) Patent No.: US 7,919,990 B2
(45) Date of Patent: Apr. 5, 2011

(54) SEMICONDUCTOR DEVICE

(75) Inventors: Fujio Masuoka, Tokyo (JP); Hiroki Nakamura, Tokyo (JP)

(73) Assignee: Unisantis Electronics (Japan) Ltd., Tokyo (JP)

( * ) Notice: Subject to any disclaimer, the term of this patent is extended or adjusted under 35 U.S.C. 154(b) by 0 days.

(21) Appl. No.: 12/697,683

(22) Filed: Feb. 1, 2010

(65) Prior Publication Data
US 2010/0194438 A1    Aug. 5, 2010

Related U.S. Application Data

(63) Continuation of application No. PCT/JP2008/059731, filed on May 27, 2008.

(60) Provisional application No. 61/207,653, filed on Feb. 13, 2009.

(30) Foreign Application Priority Data

Aug. 2, 2007  (JP) .................. 2007-201687

(51) Int. Cl.
  *H03K 19/20*   (2006.01)
  *H03K 19/094*  (2006.01)
  *H01L 23/52*   (2006.01)
(52) U.S. Cl. .................. 326/121; 438/599; 257/208
(58) Field of Classification Search .............. 257/60, 257/136, 263, 302, 329, 330, 343, 369, 904; 437/52, 56, 57, 89; 438/156, 157, 173, 176, 438/192, 199, 212, 268
See application file for complete search history.

(56) References Cited

U.S. PATENT DOCUMENTS

| 5,258,635 | A  | 11/1993 | Nitayama et al. |
| 5,308,782 | A  | 5/1994  | Mazuré et al. |
| 6,461,900 | B1 | 10/2002 | Sundaresan et al. |

(Continued)

FOREIGN PATENT DOCUMENTS

| JP | 61-013661 A | 1/1986 |
| JP | 02-071556 A | 3/1990 |
| JP | 02-188966 A | 7/1990 |

(Continued)

OTHER PUBLICATIONS

Watanabe, S. et al., "A Nobel Circuit Technology with Surrounding Gate Transistors (SGT's) for Ultra High Density DRAM's", IEEE Journal of Solid-State Circuits, vol. 30, No. 9, Sep. 1995, pp. 960-971.

*Primary Examiner* — Vibol Tan
*Assistant Examiner* — Dylan White
(74) *Attorney, Agent, or Firm* — Brinks Hofer Gilson & Lione

(57) ABSTRACT

A semiconductor device of the present invention comprises an SGT based, at least two-stage CMOS inverter cascade circuit configured to allow a pMOS SGT to have a gate width two times greater than that of an nMOS SGT. A first CMOS inverter includes two pMOS SGT arranged at respective ones of an intersection of the 1st row and the 1st column and an intersection of the 2nd row and the 1st column, and an nMOS SGT arranged at an intersection of the 1st row and the 2nd column. A second CMOS inverter includes two pMOS SGT arranged at respective ones of an intersection of the 1st row and the 3rd column and an intersection of the 2nd row and the 3rd column, and an nMOS SGT arranged at an intersection of the 2nd row and the 2nd column.

12 Claims, 81 Drawing Sheets

U.S. PATENT DOCUMENTS

| | | | |
|---|---|---|---|
| 2005/0281119 A1* | 12/2005 | Shibata et al. | 365/230.06 |
| 2009/0032955 A1* | 2/2009 | Tanaka et al. | 257/758 |
| 2009/0057722 A1* | 3/2009 | Masuoka et al. | 257/207 |
| 2009/0218626 A1* | 9/2009 | Shibata et al. | 257/357 |
| 2010/0213539 A1* | 8/2010 | Masuoka et al. | 257/329 |

FOREIGN PATENT DOCUMENTS

| | | |
|---|---|---|
| JP | 03-145761 A | 6/1991 |
| JP | 06-069441 A | 3/1994 |
| JP | 2003-179160 A | 6/2003 |
| JP | 2004-079694 A | 3/2004 |

\* cited by examiner $Y_1$          $Y'_1$ $Y_2$          $Y'_2$ $X_1$          $X'_1$ $X_2$            $X'_2$ $Y_1$            $Y'_1$ $Y_2$            $Y'_2$

SEMICONDUCTOR DEVICE

RELATED APPLICATIONS

This application is a continuation of PCT/JP2008/059731 filed on May 27, 2008, which claims priority to JP2007-201687 filed on Aug. 2, 2007. Pursuant to 35 U.S.C. §119(e), this application also claims the benefit of the filing date of Provisional U.S. Patent Application Ser. No. 61/207,653 filed on Feb. 13, 2009. The entire contents of these applications are hereby incorporated by reference.

BACKGROUND OF THE INVENTION

1. Field of the Invention

The present invention relates to a semiconductor device.

2. Description of the Background Art

A degree of integration in a semiconductor integrated circuit, particularly in an integrated circuit using a MOS transistor, has been increasing year by year. Along with the increase in the degree of integration, miniaturization of the MOS transistor used therein has progressed to a nano region. The progress in miniaturization of the MOS transistor, which constitutes an inverter circuit as a basic circuitry for digital circuits, gives rise to a problem, such as difficulty in suppressing a leak current, which causes deterioration in reliability due to hot carrier effects and poses an impediment to sufficiently reducing a circuit occupancy area while meeting a requirement of ensuring a necessary current magnitude. With a view to solving this problem, there have been proposed a surrounding gate transistor (SGT) having a structure in which a source, a gate and a drain are arranged in a direction perpendicular to a substrate, wherein the gate is formed to surround an island-shaped semiconductor layer, and a CMOS inverter circuit using the SGT (see, for example, the following Patent Documents 1 to 3).

FIGS. 1(a) and 1(b) show a conventional SGT-based two-stage CMOS inverter configured to input an output of a first inverter into a second inverter (see the following Non-Patent Document 1). A sectional view of the two-stage CMOS inverter is shown in FIGS. 2(b) and 2(c). The first inverter is made up of two pMOS SGTs 01, 02 and one nMOS SGT 03. The second inverter is made up of two pMOS SGTs 04, 05 and two nMOS SGTs 06, 07. The conventional SGT-based two-stage CMOS inverter employs a structure where a first power supply potential Vss and a second power supply potential Vcc are supplied to SGTs from respective ones of a first power supply line (Vss line) Vssl and a second power supply line (Vcc line) Vccl via corresponding ones of drain and source diffusion layers in a silicon substrate and through a plurality of contacts. Specifically, the power supply lines for the nMOS and pMOS SGTs are arranged on one side of a lower portion of a gate region which is different from an on-substrate region where the nMOS and pMOS SGTs are arranged. Generally, a resistance of a diffusion layer is extremely larger than that of a metal line for power supply. If a resistance of the first power supply line Vssl and the second power supply line Vccl increases, a source potential to be applied to each of the nMOS SGTs will increase relative to the first power supply potential Vss, and a source potential to be supplied to each of the pMOS SGTs will decrease relative to the second power supply potential Vcc. The increase in source potential of the nMOS SGT relative to the first power supply potential Vss leads to a decrease in drive current of the nMOS SGT. The decrease in source potential of the pMOS SGT relative to the second power supply potential Vcc leads to a decrease in drive current of the pMOS SGT. The decrease in drive current of each of the SGTs leads to a decrease in charge/discharge rate of a capacitance in an output terminal of the inverter. The decrease in charge/discharge rate of the capacitance in an output terminal of the inverter leads to an increase in delay time of the inverter. Therefore, a metal line is connected to the diffusion layer through a large number of contacts to apply the first power supply potential Vss to a source of each of the nMOS SGTs and apply the second power supply potential Vcc to a source of each of the pMOS SGTs.

Further, in the conventional SGT CMOS inverter, a contact is arranged on the drain diffusion layer and connected to a metal line to form an output section of the first inverter. The metal line in the output section of the first inverter is connected to a polysilicon gate as an input section of the second inverter through a contact.

Thus, in the conventional grounded substrate-type SGT-based two-stage CMOS inverter, a percentage of a contact area in a circuit occupancy area is large. Moreover, if a resistance of the first power supply line Vssl and the second power supply line Vccl increases, a delay time of the inverter will increases.

Further, in the inverter, the pMOS SGT is required to have a gate width two times greater than that of the nMOS SGT, because a hole mobility is one-half of an electron mobility.

[Patent Document 1] JP 02-071556A
[Patent Document 2] JP 02-188966A
[Patent Document 3] JP 03-145761A
[Non-Patent Document 1] S. Watanabe, K. Tsuchida, D. Takashima, Y. Oowaki, A. Nitayama, K. Hieda, H. Takato, K. Sunouchi, F. Horiguchi, K. Ohuchi, F. Masuoka, H. Hara, "A Novel Circuit Technology with Surrounding Gate Transistors (SGT's) for Ultra High Density DRAM's," IEEE JSSC, Vol. 30, No. 9, 1995

SUMMARY OF THE INVENTION

It is therefore an object of the present invention to provide a semiconductor device which comprises an SGT-based, highly-integrated, high-speed, at least two-stage CMOS inverter cascade circuit configured to allow a pMOS SGT to have a gate width two times greater than that of an nMOS SGT, and reduce an area of a first power supply line as a Vss line and a second power supply line as a Vcc line to reduce a resistance thereof.

In order to achieve the above object, according to one aspect of the present invention, there is provided a semiconductor device which comprises a CMOS inverter cascade circuit having a plurality of CMOS inverters cascade-connected in at least two stages, wherein the CMOS inverter cascade circuit includes a first CMOS inverter and a second CMOS inverter which are formed as a two-stage CMOS inverter made up of six MOS transistors arranged on a substrate in a two-row by three-column array, and wherein: each of two MOS transistors in a respective one of the 1st column and the 3rd column is a p-channel MOS transistor; and two MOS transistors in the 2nd column is an n-channel MOS transistor, and wherein each of the p-channel MOS transistors and the n-channel MOS transistors has a structure where a drain, a source and a gate thereof are arranged in a direction perpendicular to the substrate while allowing the gate to surround an island-shaped semiconductor layer, and wherein: the first inverter CMOS inverter includes the two p-channel MOS transistors in the 1st column, a first one of the two n-channel MOS transistors in the 2nd column, a first-CMOS-inverter input terminal arranged to interconnect the gate of the first n-channel MOS transistor in the 2nd column and the gate of each of the two p-channel MOS transistors in the 1st column, a first-CMOS-inverter output terminal arranged to interconnect a drain diffusion layer of the first n-channel MOS transistor in the 2nd column and a drain diffusion layer of each of the two p-channel MOS transistors in the 1st column through an island-shaped semiconductor lower layer, a first power supply line provided for the first CMOS inverter and arranged on a source diffusion layer of the first n-channel MOS transistor in the 2nd column, and a second power supply line provided for the first CMOS inverter and arranged on a source diffusion layer of each of the two p-channel MOS transistors in the 1st column; and the second CMOS inverter has the two p-channel MOS transistors in the 3rd column, a second one of the two n-channel MOS transistors in the 2nd column, other than the first n-channel MOS transistor in the 2nd column, a second-CMOS-inverter input terminal arranged to interconnect the gate of the second n-channel MOS transistor in the 2nd column, and the gate of each of the two p-channel MOS transistors in the 3rd column, a second-CMOS-inverter output terminal arranged to interconnect a drain diffusion layer of the second n-channel MOS transistor in the 2nd column and a drain diffusion layer of each of the two p-channel MOS transistors in the 3rd column, through an island-shaped semiconductor lower layer, a first power supply line provided for the second CMOS inverter and arranged on a source diffusion layer of the second n-channel MOS transistor in the 2nd column, and a second power supply line provided for the second CMOS inverter and arranged on a source diffusion layer of each of the two p-channel MOS transistors in the 3rd column, and wherein: the first power supply line provided for the first CMOS inverter and the first power supply line provided for the second CMOS inverter are connected to each other on the source diffusion layers of the two n-channel MOS transistors in the 2nd column; and the first-CMOS-inverter output terminal is connected to the second-CMOS-inverter input terminal.

In a preferred embodiment of the present invention, the CMOS inverter cascade circuit includes a (2×N)-stage CMOS inverter having a number N of the two-stage CMOS inverters arranged on the substrate in a row direction (wherein N is an integer of 2 or more), and wherein: each of the first-CMOS-inverter output terminal and the second-CMOS-inverter output terminal is connected to a respective one of the second-CMOS-inverter input terminal and the first-CMOS-inverter input terminal adjacent thereto; and the second power supply lines arranged on the source diffusion layers of adjacent four of the p-channel MOS transistors are connected to each other on the source diffusion layers of the adjacent four p-channel MOS transistors.

In another preferred embodiment of the present invention, the CMOS inverter cascade circuit includes, on the substrate, a CMOS inverter array configured such that a number N of the two-stage CMOS inverters are arranged in a row direction, and a number M of the two-stage CMOS inverters are arranged in a column direction (wherein N is an integer of 2 or more, and M is an integer of 2 or more), and wherein the second power supply lines provided for respective ones of the M first CMOS inverters arranged in the column direction are connected to each other on the source diffusion layers of the p-channel MOS transistors in the M first CMOS inverters; the second power supply lines provided for respective ones of the M second CMOS inverters arranged in the column direction are connected to each other on the source diffusion layers of the p-channel MOS transistors in the M second CMOS inverters; and the first power supply lines provided for respective ones of the M first CMOS inverters arranged in the column direction, and the first power supply lines provided for respective ones of the M second CMOS inverters arranged in the column direction are connected to each other on the source diffusion layers of the n-channel MOS transistors in the M first CMOS inverters and the M second CMOS inverters.

In yet another preferred embodiment of the present invention, the CMOS inverter cascade circuit has, on the substrate, a CMOS inverter array configured such that a number N of the two-stage CMOS inverters are arranged in a row direction, and a number M of the two-stage CMOS inverters are arranged in a column direction (wherein N is an integer of 2 or more, and M is an integer of 2 or more, and wherein: the first power supply lines provided for respective ones of the first and second CMOS inverters successively arranged in the column direction are connected to each other on the source diffusion layers of the n-channel MOS transistors of the first and second CMOS inverters over the column direction; the second power supply lines provided for respective ones of the first and second CMOS inverters successively arranged in the column direction are connected to each other on the source diffusion layers of the p-channel MOS transistors of the first CMOS inverters over the column direction; the second power supply lines provided for respective ones of a part of the first and second CMOS inverters adjacent to each other in the row direction are further connected to each other in the row direction on the p-channel transistors of the adjacent first and second CMOS inverters; and each of the first-CMOS-inverter output terminal and the second-CMOS-inverter output terminal is connected to a respective one of the second-CMOS-inverter input terminal and the first-CMOS-inverter input terminal adjacent thereto in the row direction.

In other words, the present invention provides a semiconductor device which comprises a CMOS inverter cascade circuit having a plurality of CMOS inverters cascade-connected in at least two stages, wherein the CMOS inverter cascade circuit includes a first CMOS inverter and a second CMOS inverter. The first CMOS inverter comprises: an n-channel semiconductor device formed in a structure where a drain, a source and a gate thereof are arranged in a direction perpendicular to a substrate while allowing the gate to surround an island-shaped semiconductor layer, and arranged at an intersection of the 1st row and the 2nd column; a p-channel semiconductor device formed in a structure where a drain, a source and a gate thereof are arranged in a direction perpendicular to the substrate while allowing the gate to surround an island-shaped semiconductor layer, and arranged at an intersection of the 1st row and the 1st column; a p-channel semiconductor device formed in a structure where a drain, a source and a gate thereof are arranged in a direction perpendicular to the substrate while allowing the gate to surround an island-shaped semiconductor layer, and arranged at an intersection of the 2nd row and the 1st column; a first-CMOS-inverter input terminal arranged to interconnect the gate of the n-channel semiconductor device at the intersection of the 1st row and the 2nd column, and the gate of each of the two p-channel semiconductor devices at respective ones of the intersection of the 1st row and the 1st column and the intersection of the 2nd row and the 1st column; a first-CMOS-inverter output terminal arranged to interconnect a drain diffusion layer of the n-channel semiconductor device at the intersection of the 1st row and the 2nd column, and a drain diffusion layer of each of the two p-channel semiconductor devices at respective ones of the intersection of the 1st row and the 1st column and the intersection of the 2nd row and the 1st column, through an island-shaped semiconductor lower layer; a first power supply line Vss1 connected to a source diffusion layer of the n-channel semiconductor device at the intersection of the 1st row and the 2nd column to serve as a Vss line; a second power supply line Vcc1 connected to a source diffusion layer of each of the two p-channel semiconductor devices at respective ones of the intersection of the 1st row and the 1st column and the intersection of the 2nd row and the 1st column to serve as a Vcc line. The second CMOS inverter comprises: an n-channel semiconductor device formed in a structure where a drain, a source and a gate thereof are arranged in a direction perpendicular to the substrate while allowing the gate to surround an island-shaped semiconductor layer, and arranged at an intersection of the 2nd row and the 2nd column; a p-channel semiconductor device formed in a structure where a drain, a source and a gate thereof are arranged in a direction perpendicular to the substrate while allowing the gate to surround an island-shaped semiconductor layer, and arranged at an intersection of the 1st row and the 3rd column; a p-channel semiconductor device formed in a structure where a drain, a source and a gate thereof are arranged in a direction perpendicular to the substrate while allowing the gate to surround an island-shaped semiconductor layer, and arranged at an intersection of the 2nd row and the 3rd column; a second-CMOS-inverter input terminal arranged to interconnect the gate of the n-channel semiconductor device at the intersection of the 2nd row and the 2nd column, and the gate of each of the two p-channel semiconductor devices at respective ones of the intersection of the 1st row and the 3rd column and the intersection of the 2nd row and the 3rd column; a second-CMOS-inverter output terminal arranged to interconnect a drain diffusion layer of the n-channel semiconductor device at the intersection of the 2nd row and the 2nd column, and a drain diffusion layer of each of the two p-channel semiconductor devices at respective ones of the intersection of the 1st row and the 3rd column and the intersection of the 2nd row and the 3rd column, through an island-shaped semiconductor lower layer; a first power supply line Vssl connected to a source diffusion layer of the n-channel semiconductor device at the intersection of the 2nd row and the 2nd column to serve as a Vss line; a second power supply line Vccl connected to a source diffusion layer of each of the two p-channel semiconductor devices at respective ones of the intersection of the 1st row and the 3rd column and the intersection of the 2nd row and the 3rd column to serve as a Vcc line. The first-CMOS-inverter output terminal is connected to the second-CMOS-inverter input terminal. A first power supply line Vssl is connected to a source diffusion layer of the n-channel semiconductor device of the first CMOS inverter; a first power supply line Vssl is connected to a source diffusion layer of the n-channel semiconductor device of the second CMOS inverter; a second power supply line Vccl is connected to a source diffusion layer of each of the two p-channel semiconductor devices of the first CMOS inverter; and a second power supply line Vccl is connected to a source diffusion layer of each of the two p-channel semiconductor devices of the second CMOS inverter.

The present invention also provides a semiconductor device which comprises a CMOS inverter cascade circuit having a plurality of CMOS inverters cascade-connected in at least two stages, wherein the CMOS inverter cascade circuit includes a first CMOS inverter, a second CMOS inverter, a third CMOS inverter and a fourth CMOS inverter. The first CMOS inverter comprises: an n-channel semiconductor device formed in a structure where a drain, a source and a gate thereof are arranged in a direction perpendicular to a substrate while allowing the gate to surround an island-shaped semiconductor layer, and arranged at an intersection of the 1st row and the 2nd column; a p-channel semiconductor device formed in a structure where a drain, a source and a gate thereof are arranged in a direction perpendicular to the substrate while allowing the gate to surround an island-shaped semiconductor layer, and arranged at an intersection of the 1st row and the 1st column; a p-channel semiconductor device formed in a structure where a drain, a source and a gate thereof are arranged in a direction perpendicular to the substrate while allowing the gate to surround an island-shaped semiconductor layer, and arranged at an intersection of the 2nd row and the 1st column; a first-CMOS-inverter input terminal arranged to interconnect the gate of the n-channel semiconductor device at the intersection of the 1st row and the 2nd column, and the gate of each of the two p-channel semiconductor devices at respective ones of the intersection of the 1st row and the 1st column and the intersection of the 2nd row and the 1st column; a first-CMOS-inverter output terminal arranged to interconnect a drain diffusion layer of the n-channel semiconductor device at the intersection of the 1st row and the 2nd column, and a drain diffusion layer of each of the two p-channel semiconductor devices at respective ones of the intersection of the 1st row and the 1st column and the intersection of the 2nd row and the 1st column, through an island-shaped semiconductor lower layer; a first power supply line Vssl connected to a source diffusion layer of the n-channel semiconductor device at the intersection of the 1st row and the 2nd column to serve as a Vss line; a second power supply line Vccl connected to a source diffusion layer of each of the two p-channel semiconductor devices at respective ones of the intersection of the 1st row and the 1st column and the intersection of the 2nd row and the 1st column to serve as a Vcc line. The second CMOS inverter comprises: an n-channel semiconductor device formed in a structure where a drain, a source and a gate thereof are arranged in a direction perpendicular to the substrate while allowing the gate to surround an island-shaped semiconductor layer, and arranged at an intersection of the 2nd row and the 2nd column; a p-channel semiconductor device formed in a structure where a drain, a source and a gate thereof are arranged in a direction perpendicular to the substrate while allowing the gate to surround an island-shaped semiconductor layer, and arranged at an intersection of the 1st row and the 3rd column; a p-channel semiconductor device formed in a structure where a drain, a source and a gate thereof are arranged in a direction perpendicular to the substrate while allowing the gate to surround an island-shaped semiconductor layer, and arranged at an intersection of the 2nd row and the 3rd column; a second-CMOS-inverter input terminal arranged to interconnect the gate of the n-channel semiconductor device at the intersection of the 2nd row and the 2nd column, and the gate of each of the two p-channel semiconductor devices at respective ones of the intersection of the 1st row and the 3rd column and the intersection of the 2nd row and the 3rd column; a second-CMOS-inverter output terminal arranged to interconnect a drain diffusion layer of the n-channel semiconductor device at the intersection of the 2nd row and the 2nd column, and a drain diffusion layer of each of the two p-channel semiconductor devices at respective ones of the intersection of the 1st row and the 3rd column and the intersection of the 2nd row and the 3rd column, through an island-shaped semiconductor lower layer; a first power supply line Vssl connected to a source diffusion layer of the n-channel semiconductor device at the intersection of the 2nd row and the 2nd column to serve as a Vss line; a second power supply line Vccl connected to a source diffusion layer of each of the two p-channel semiconductor devices at respective ones of the intersection of the 1st row and the 3rd column and the intersection of the 2nd row and the 3rd column to serve as a Vcc line. The third CMOS inverter comprises: an n-channel semiconductor device formed in a structure where a drain, a source and a gate thereof are arranged in a direction perpendicular to a substrate while allowing the gate to surround an island-shaped semiconductor layer, and arranged at an intersection of the 1st row and the 5th column; a p-channel semiconductor device formed in a structure where a drain, a source and a gate thereof are arranged in a direction perpendicular to the substrate while allowing the gate to surround an island-shaped semiconductor layer, and arranged at an intersection of the 1st row and the 4th column; a p-channel semiconductor device formed in a structure where a drain, a source and a gate thereof are arranged in a direction perpendicular to the substrate while allowing the gate to surround an island-shaped semiconductor layer, and arranged at an intersection of the 2nd row and the 4th column; a third-CMOS-inverter input terminal arranged to interconnect the gate of the n-channel semiconductor device at the intersection of the 1st row and the 5th column, and the gate of each of the two p-channel semiconductor devices at respective ones of the intersection of the 1st row and the 4th column and the intersection of the 2nd row and the 4th column; a third-CMOS-inverter output terminal arranged to interconnect a drain diffusion layer of the n-channel semiconductor device at the intersection of the 1st row and the 5th column, and a drain diffusion layer of each of the two p-channel semiconductor devices at respective ones of the intersection of the 1st row and the 4th column and the intersection of the 2nd row and the 4th column, through an island-shaped semiconductor lower layer; a first power supply line Vssl connected to a source diffusion layer of the n-channel semiconductor device at the intersection of the 1st row and the 5th column to serve as a Vss line; a second power supply line Vccl connected to a source diffusion layer of each of the two p-channel semiconductor devices at respective ones of the intersection of the 1st row and the 4th column and the intersection of the 2nd row and the 4th column to serve as a Vcc line. The fourth CMOS inverter comprises: an n-channel semiconductor device formed in a structure where a drain, a source and a gate thereof are arranged in a direction perpendicular to the substrate while allowing the gate to surround an island-shaped semiconductor layer, and arranged at an intersection of the 2nd row and the 5th column; a p-channel semiconductor device formed in a structure where a drain, a source and a gate thereof are arranged in a direction perpendicular to the substrate while allowing the gate to surround an island-shaped semiconductor layer, and arranged at an intersection of the 1st row and the 6th column; a p-channel semiconductor device formed in a structure where a drain, a source and a gate thereof are arranged in a direction perpendicular to the substrate while allowing the gate to surround an island-shaped semiconductor layer, and arranged at an intersection of the 2nd row and the 6th column; a fourth-CMOS-inverter input terminal arranged to interconnect the gate of the n-channel semiconductor device at the intersection of the 2nd row and the 5th column, and the gate of each of the two p-channel semiconductor devices at respective ones of the intersection of the 1st row and the 6th column and the intersection of the 2nd row and the 6th column; a fourth-CMOS-inverter output terminal arranged to interconnect a drain diffusion layer of the n-channel semiconductor device at the intersection of the 2nd row and the 5th column, and a drain diffusion layer of each of the two p-channel semiconductor devices at respective ones of the intersection of the 1st row and the 6th column and the intersection of the 2nd row and the 6th column, through an island-shaped semiconductor lower layer; a first power supply line Vssl connected to a source diffusion layer of the n-channel semiconductor device at the intersection of the 2nd row and the 5th column to serve as a Vss line; a second power supply line Vccl connected to a source diffusion layer of each of the two p-channel semiconductor devices at respective ones of the intersection of the 1st row and the 6th column and the intersection of the 2nd row and the 6th column to serve as a Vcc line. The first-CMOS-inverter output terminal is connected to the second-CMOS-inverter input terminal. Further, the second-CMOS-inverter output terminal is connected to the third-CMOS-inverter input terminal, and the third-CMOS-inverter output terminal is connected to the fourth-CMOS-inverter input terminal. A first power supply line Vssl is connected to a source diffusion layer of the n-channel semiconductor device of the first CMOS inverter; a first power supply line Vssl is connected to a source diffusion layer of the n-channel semiconductor device of the second CMOS inverter; a first power supply line Vssl is connected to a source diffusion layer of the n-channel semiconductor device of the third CMOS inverter; a first power supply line Vssl is connected to a source diffusion layer of the n-channel semiconductor device of the fourth CMOS inverter; a second power supply line Vccl is connected to a source diffusion layer of each of the two p-channel semiconductor devices of the first CMOS inverter; a second power supply line Vccl is connected to a source diffusion layer of each of the two p-channel semiconductor devices of the second CMOS inverter; a second power supply line Vccl is connected to a source diffusion layer of each of the two p-channel semiconductor devices of the third CMOS inverter; and a second power supply line Vccl is connected to a source diffusion layer of each of the two p-channel semiconductor devices of the fourth CMOS inverter.

According to another aspect of the present invention, there is provided an n-channel MOS transistor for use in the above semiconductor device. The n-channel MOS transistor comprises: a drain, a gate and a source which are arranged in a direction perpendicular to a substrate while allowing the gate to surround an island-shaped semiconductor layer; a dielectric layer formed above and below the gate; a polysilicon line formed as an island-shaped semiconductor lower layer to surround a part of a drain diffusion layer; and a metal line formed on a source diffusion layer, wherein each of the drain diffusion layer, the polysilicon line, the gate and the source diffusion layer has a salicided structure.

According to yet another aspect of the present invention, there is provided a p-channel MOS transistor for use in the above semiconductor device. The p-channel MOS transistor comprises: a drain, a gate and a source which are arranged in a direction perpendicular to a substrate while allowing the gate to surround an island-shaped semiconductor layer; a dielectric layer formed above and below the gate; a polysilicon line formed as an island-shaped semiconductor lower layer to surround a part of a drain diffusion layer; and a metal line formed on a source diffusion layer, wherein each of the drain diffusion layer, the polysilicon line, the gate and the source diffusion layer has a salicided structure.

The conventional SGT-based two-stage CMOS inverter employs a structure where a first power supply potential Vss and a second power supply potential Vcc are supplied to respective diffusion layers in a silicon substrate SGTs through a plurality of contacts. Specifically, two power supply lines for the nMOS and pMOS SGTs are arranged on one side of a lower portion of a gate region which is different from an on-substrate region where nMOS and pMOS layers are arranged.

In contrast, the semiconductor device of the present invention comprises a first power supply line Vssl and a second power supply line Vccl each arranged to supply a respective one of a first power supply potential Vss and a second power supply potential Vcc to a corresponding one of an nMOS SGT and a pMOS SGT from thereabove, wherein: the first power supply line Vssl includes a first power supply line Vssl connected to a source diffusion layer of an n-channel semiconductor device in a first inverter, and a first power supply line Vssl connected to a source diffusion layer of an n-channel semiconductor device in a second inverter; and the second power supply line Vccl includes a second power supply line Vccl connected to respective source diffusion layers of two p-channel semiconductor devices in the first inverter, and a second power supply line Vccl connected to respective source diffusion layers of two p-channel semiconductor device in the second inverter. This makes it possible to reduce an area of the first power supply line Vssl and the second power supply line Vccl, to allow the semiconductor device to have an SGT-based highly-integrated CMOS inverter cascade circuit.

In addition, the above feature in which each of the first power supply line Vssl and the second power supply line Vccl is arranged to supply a respective one of a first power supply potential Vss and a second power supply potential Vcc to a corresponding one of an nMOS SGT and a pMOS SGT from thereabove, wherein: the first power supply line Vssl includes a first power supply line Vssl connected to a source diffusion layer of an n-channel semiconductor device in a first inverter, and a first power supply line Vssl connected to a source diffusion layer of an n-channel semiconductor device in a second inverter; and the second power supply line Vccl includes a second power supply line Vccl connected to respective source diffusion layers of two p-channel semiconductor devices in the first inverter, and a second power supply line Vccl connected to respective source diffusion layers of two p-channel semiconductor device in the second inverter, makes it possible reduce a resistance of the first power supply line Vssl and the second power supply line Vccl, to allow the semiconductor device to have an SGT-based high-speed CMOS inverter cascade circuit.

Further, the semiconductor device of the present invention comprises an output terminal arranged to interconnect the drain diffusion layer of the n-channel semiconductor device and the drain diffusion layers of the p-channel semiconductor devices, through an island-shaped semiconductor lower layer. This makes it possible to eliminate a need for providing a contact for use in connecting a metal line and the drain diffusion layer of the n-channel semiconductor device, a contact for use in connecting a metal line and each of the drain diffusion layers of the p-channel semiconductor devices, and the metal lines to be connected to the contacts, to allow the semiconductor device to have an SGT-based highly-integrated CMOS inverter cascade circuit.

In the semiconductor device of the present invention, the two p-MOS SGTs of the first inverter are arranged at respective ones of the intersection of the 1st row and the 1st column and the intersection of the 2nd row and the 1st column, and the n-MOS SGT of the first inverter is arranged at the intersection of the 1st row and the 2nd column. Further, the two p-MOS SGTs of the second inverter are arranged at respective ones of the intersection of the 1st row and the 3rd column and the intersection of the 2nd row and the 3rd column, and the n-MOS SGT of the second inverter is arranged at the intersection of the 2nd row and the 2nd column. This makes it possible to allow the semiconductor device to have an SGT-based highly-integrated CMOS inverter cascade circuit.

BRIEF DESCRIPTION OF THE DRAWINGS

FIGS. 1(a) and 1(b) shows a conventional SGT-based two-stage CMOS inverter, wherein FIG. 1(a) is a layout diagram, and FIG. 1(b) is an equivalent circuit diagram.

FIGS. 2(a) to 2(c) shows the conventional SGT-based two-stage CMOS inverter, wherein FIG. 2(b) is a sectional view taken along the line $Y_1$-$Y'_1$ in FIG. 2(a) which is the layout diagram in FIG. 1(a), and FIG. 2(c) is a sectional view taken along the line $Y_2$-$Y'_2$ in FIG. 2(a).

FIG. 120 is a sectional view ($Y_2$-$Y'_2$ section) showing the step in the example of the production method for the semiconductor device according to the first embodiment.

FIG. 121 is a sectional view ($X_1$-$X'_1$ section) showing a step in the example of the production method for the semiconductor device according to the first embodiment.

FIG. 122 is a sectional view ($X_2$-$X'_2$ section) showing the step in the example of the production method for the semiconductor device according to the first embodiment.

FIG. 123 is a sectional view ($Y_1$-$Y'_1$ section) showing the step in the example of the production method for the semiconductor device according to the first embodiment.

FIG. 124 is a sectional view ($Y_2$-$Y'_2$ section) showing the step in the example of the production method for the semiconductor device according to the first embodiment.

FIG. 125 is a sectional view ($X_1$-$X'_1$ section) showing a step in the example of the production method for the semiconductor device according to the first embodiment.

FIG. 126 is a sectional view ($X_2$-$X'_2$ section) showing the step in the example of the production method for the semiconductor device according to the first embodiment.

FIG. 127 is a sectional view ($Y_1$-$Y'_1$ section) showing the step in the example of the production method for the semiconductor device according to the first embodiment.

FIG. 128 is a sectional view ($Y_2$-$Y'_2$ section) showing the step in the example of the production method for the semiconductor device according to the first embodiment.

FIG. 129 is a sectional view ($X_1$-$X'_1$ section) showing a step in the example of the production method for the semiconductor device according to the first embodiment.

FIG. 130 is a sectional view ($X_2$-$X'_2$ section) showing the step in the example of the production method for the semiconductor device according to the first embodiment.

FIG. 131 is a sectional view ($Y_1$-$Y'_1$ section) showing the step in the example of the production method for the semiconductor device according to the first embodiment.

Figure 132:
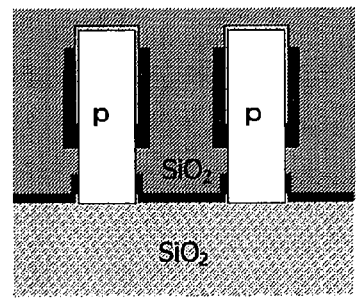

FIG. 132 is a sectional view ($Y_2$-$Y'_2$ section) showing the step in the example of the production method for the semiconductor device according to the first embodiment.

Figure 133:
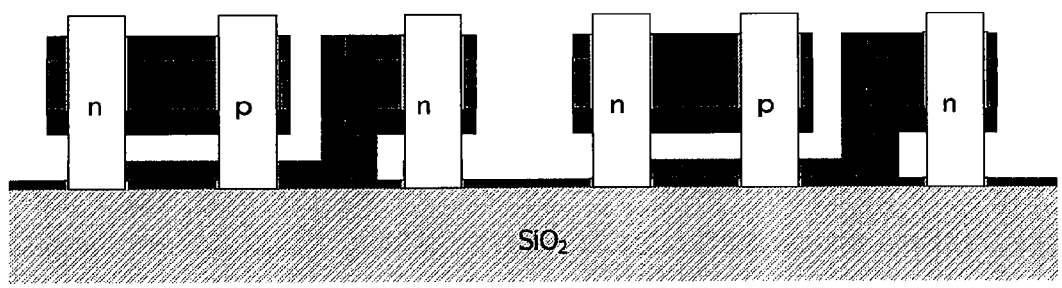

FIG. 133 is a sectional view ($X_1$-$X'_1$ section) showing a step in the example of the production method for the semiconductor device according to the first embodiment.

Figure 134:
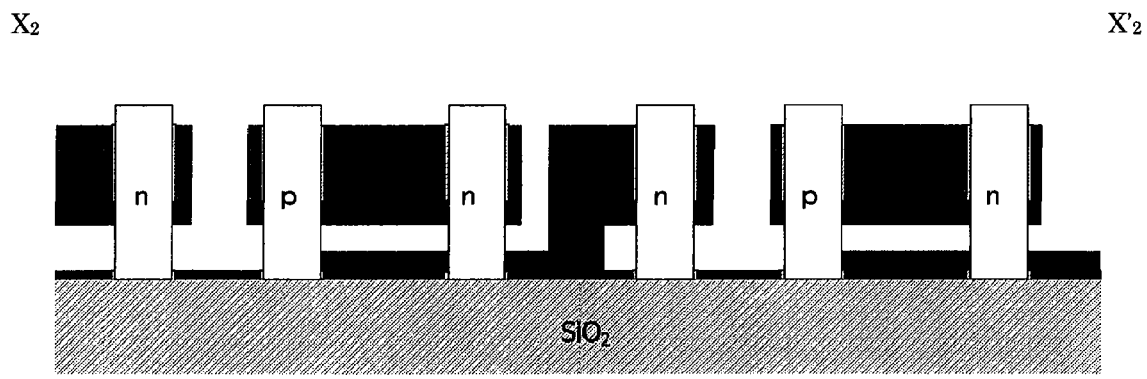

FIG. 134 is a sectional view ($X_2$-$X'_2$ section) showing the step in the example of the production method for the semiconductor device according to the first embodiment.

Figure 135:
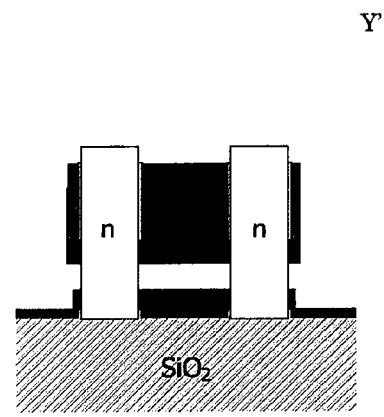

FIG. 135 is a sectional view ($Y_1$-$Y'_1$ section) showing the step in the example of the production method for the semiconductor device according to the first embodiment.

Figure 136:
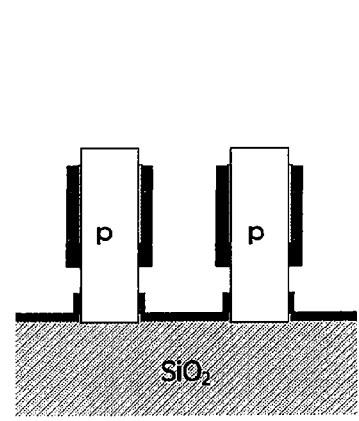

FIG. 136 is a sectional view ($Y_2$-$Y'_2$ section) showing the step in the example of the production method for the semiconductor device according to the first embodiment.

Figure 137:
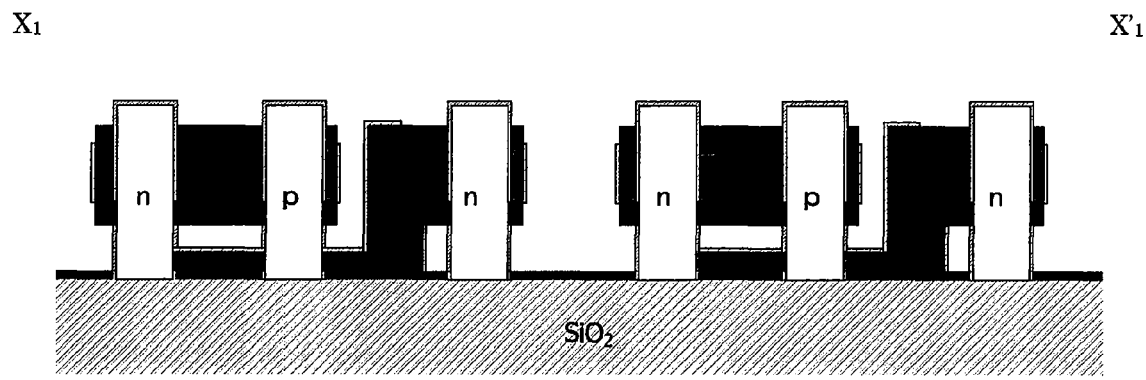

FIG. 137 is a sectional view ($X_1$-$X'_1$ section) showing a step in the example of the production method for the semiconductor device according to the first embodiment.

Figure 138:
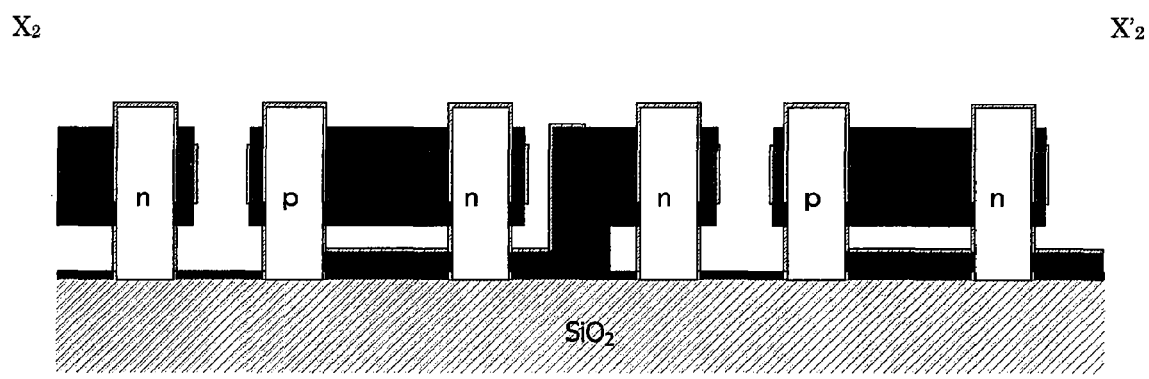

FIG. 138 is a sectional view ($X_2$-$X'_2$ section) showing the step in the example of the production method for the semiconductor device according to the first embodiment.

Figure 139:
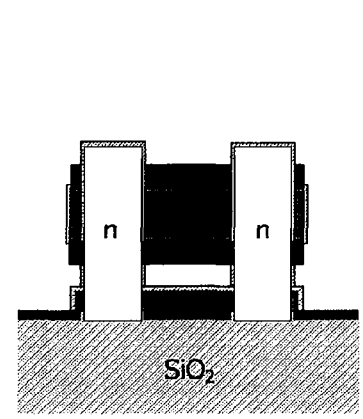

FIG. 139 is a sectional view ($Y_1$-$Y'_1$ section) showing the step in the example of the production method for the semiconductor device according to the first embodiment.

Figures 140, 141, 142:
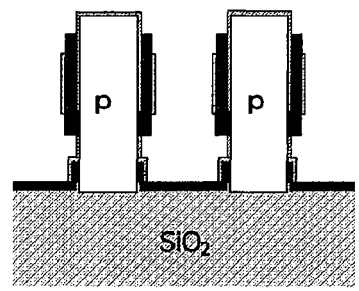

FIG. 140 is a sectional view ($Y_2$-$Y'_2$ section) showing the step in the example of the production method for the semiconductor device according to the first embodiment.

FIG. 141 is a sectional view ($X_1$-$X'_1$ section) showing a step in the example of the production method for the semiconductor device according to the first embodiment.

FIG. 142 is a sectional view ($X_2$-$X'_2$ section) showing the step in the example of the production method for the semiconductor device according to the first embodiment.

Figure 143:
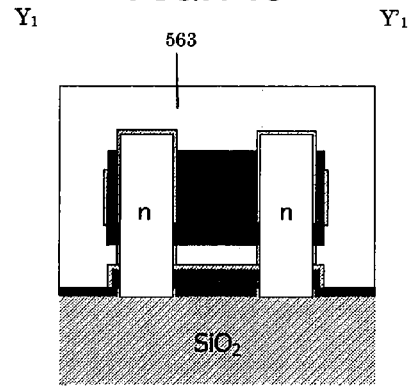

FIG. 143 is a sectional view ($Y_1$-$Y'_1$ section) showing the step in the example of the production method for the semiconductor device according to the first embodiment.

Figure 144:

FIG. 144 is a sectional view ($Y_2$-$Y'_2$ section) showing the step in the example of the production method for the semiconductor device according to the first embodiment.

Figure 145:
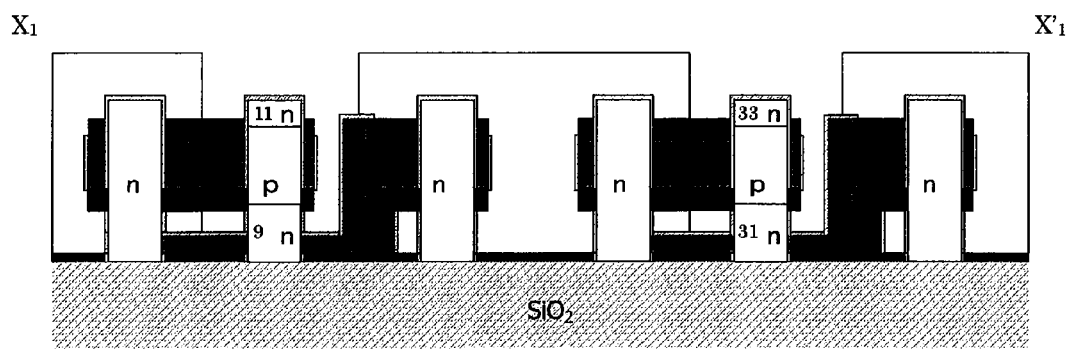

FIG. 145 is a sectional view ($X_1$-$X'_1$ section) showing a step in the example of the production method for the semiconductor device according to the first embodiment.

Figure 146:
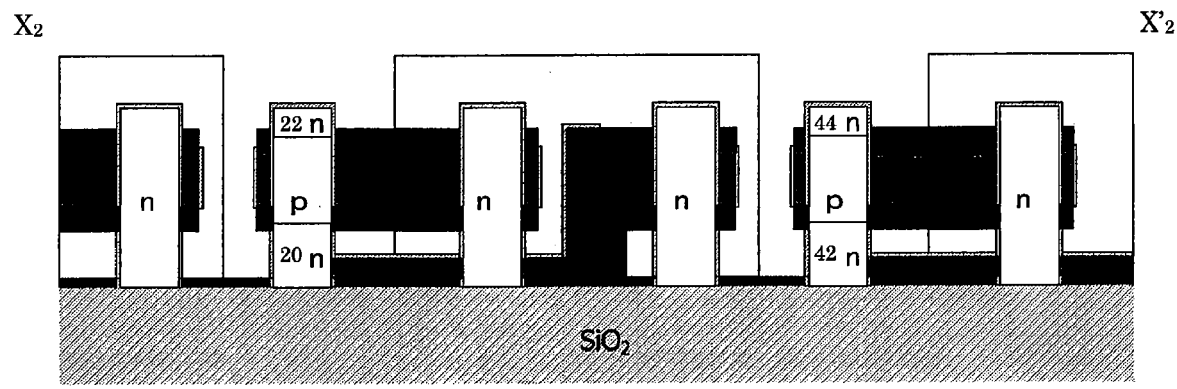

FIG. 146 is a sectional view ($X_2$-$X'_2$ section) showing the step in the example of the production method for the semiconductor device according to the first embodiment.

Figure 147:
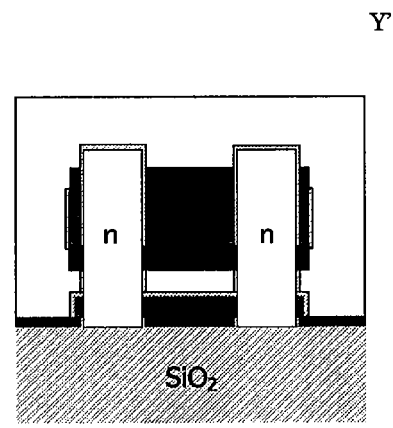

FIG. 147 is a sectional view ($Y_1$-$Y'_1$ section) showing the step in the example of the production method for the semiconductor device according to the first embodiment.

Figure 148:
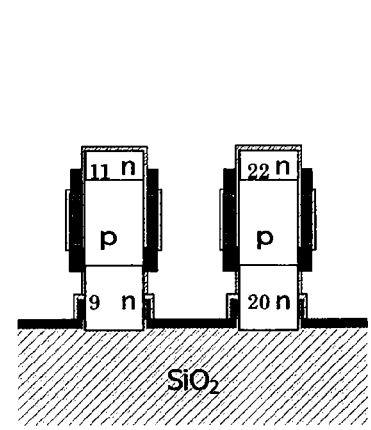

FIG. 148 is a sectional view ($Y_2$-$Y'_2$ section) showing the step in the example of the production method for the semiconductor device according to the first embodiment.

Figure 149:
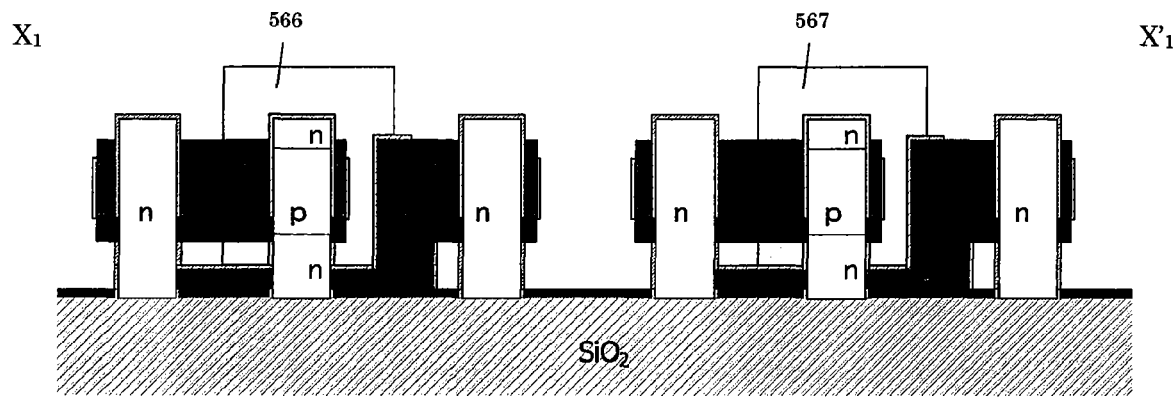

FIG. 149 is a sectional view ($X_1$-$X'_1$ section) showing a step in the example of the production method for the semiconductor device according to the first embodiment.

Figure 150:
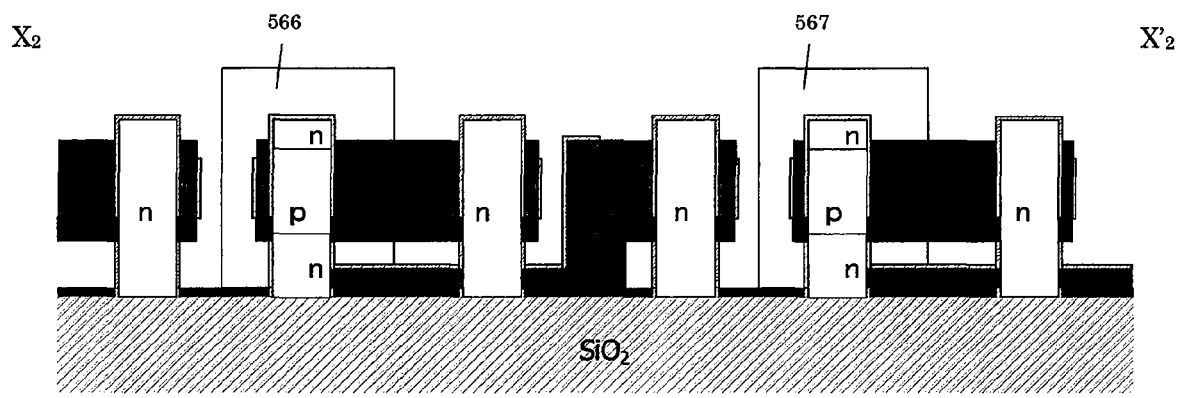

FIG. 150 is a sectional view ($X_2$-$X'_2$ section) showing the step in the example of the production method for the semiconductor device according to the first embodiment.

Figure 151:
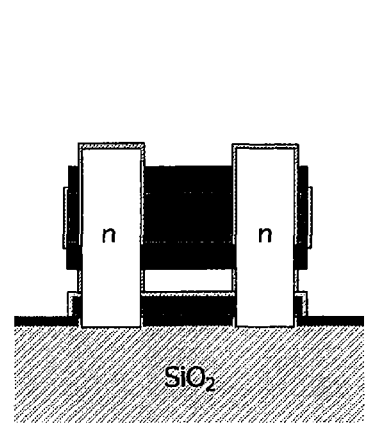

FIG. 151 is a sectional view ($Y_1$-$Y'_1$ section) showing the step in the example of the production method for the semiconductor device according to the first embodiment.

Figure 152:
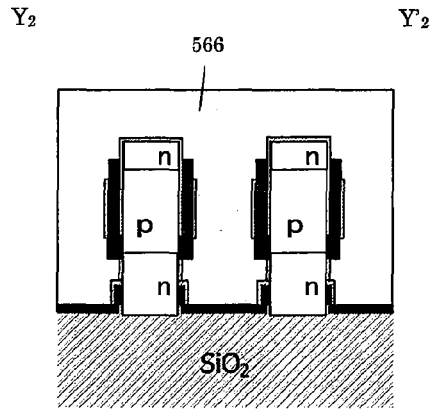

FIG. 152 is a sectional view ($Y_2$-$Y'_2$ section) showing the step in the example of the production method for the semiconductor device according to the first embodiment.

Figure 153:
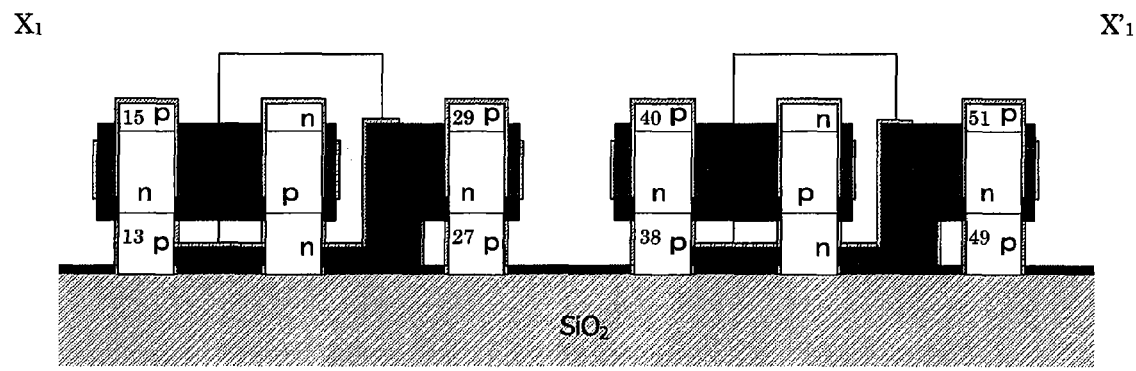

FIG. 153 is a sectional view ($X_1$-$X'_1$ section) showing a step in the example of the production method for the semiconductor device according to the first embodiment.

Figure 154:
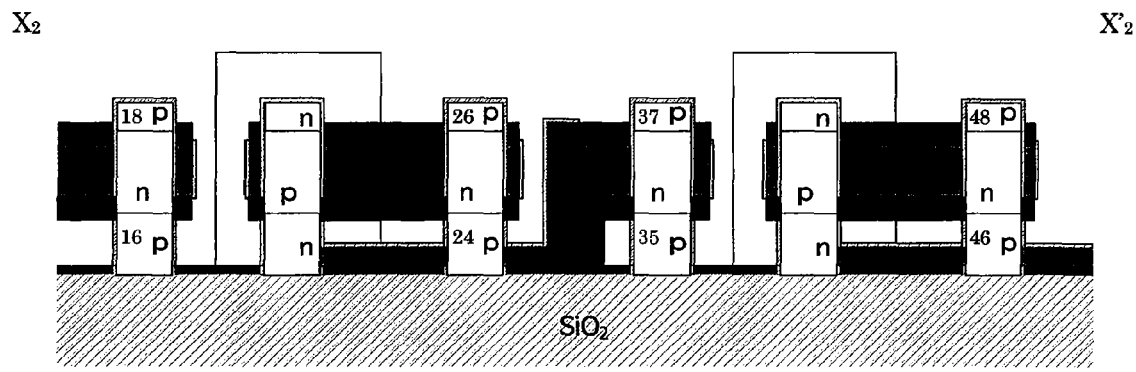

FIG. 154 is a sectional view ($X_2$-$X'_2$ section) showing the step in the example of the production method for the semiconductor device according to the first embodiment.

Figure 155:
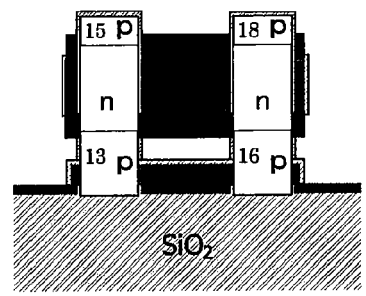

FIG. 155 is a sectional view ($Y_1$-$Y'_1$ section) showing the step in the example of the production method for the semiconductor device according to the first embodiment.

Figure 156:
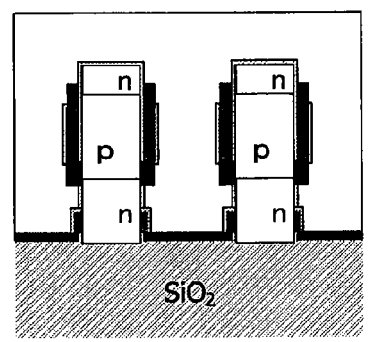

FIG. 156 is a sectional view ($Y_2$-$Y'_2$ section) showing the step in the example of the production method for the semiconductor device according to the first embodiment.

Figure 157:
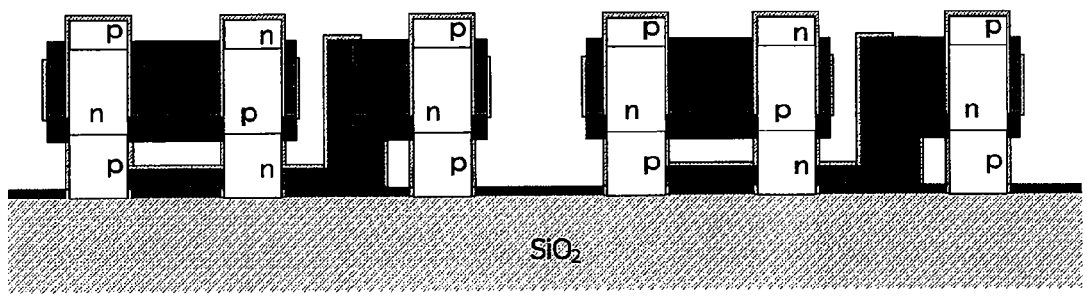

FIG. 157 is a sectional view ($X_1$-$X'_1$ section) showing a step in the example of the production method for the semiconductor device according to the first embodiment.

Figure 158:
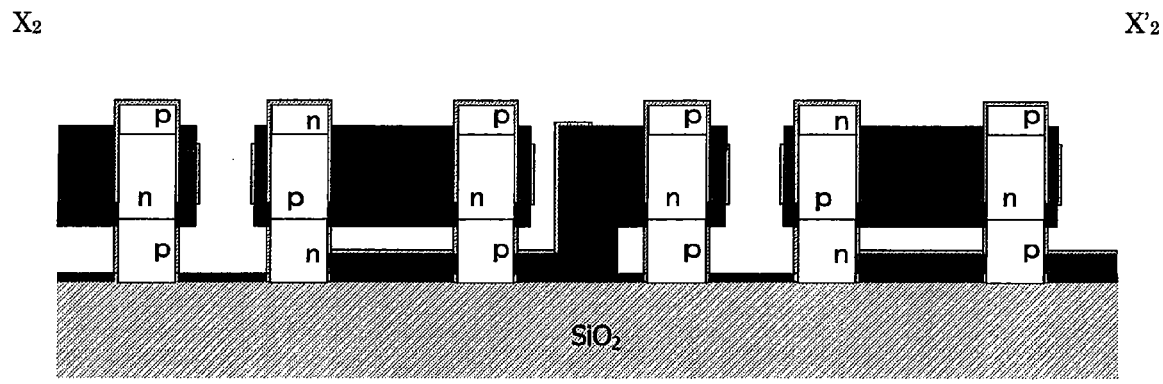

FIG. 158 is a sectional view ($X_2$-$X'_2$ section) showing the step in the example of the production method for the semiconductor device according to the first embodiment.

Figure 159:
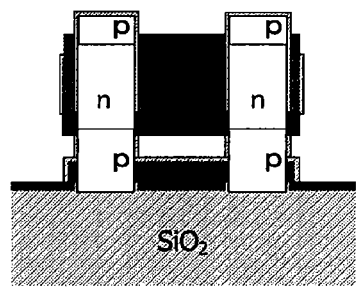

FIG. 159 is a sectional view ($Y_1$-$Y'_1$ section) showing the step in the example of the production method for the semiconductor device according to the first embodiment.

Figure 160:
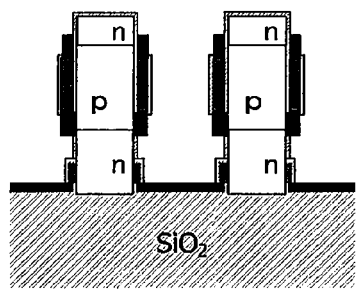

FIG. 160 is a sectional view ($Y_2$-$Y'_2$ section) showing the step in the example of the production method for the semiconductor device according to the first embodiment.

Figure 161:
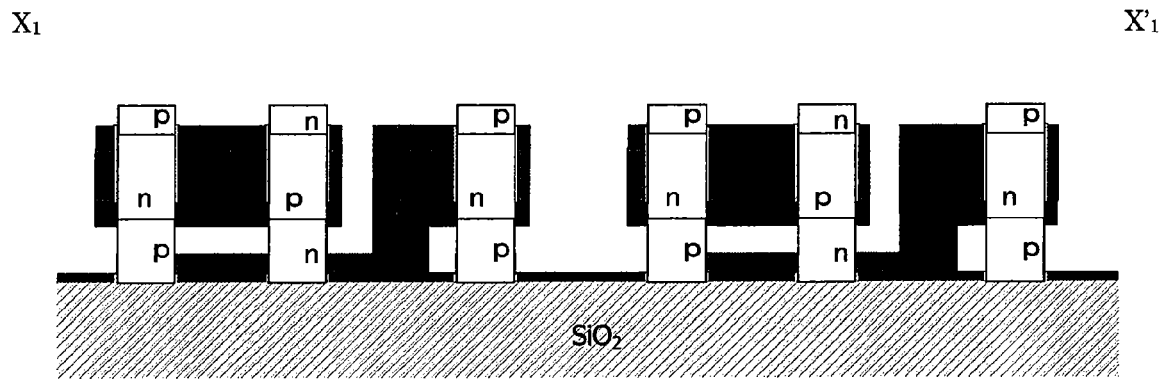

FIG. 161 is a sectional view ($X_1$-$X'_1$ section) showing a step in the example of the production method for the semiconductor device according to the first embodiment.

Figure 162:
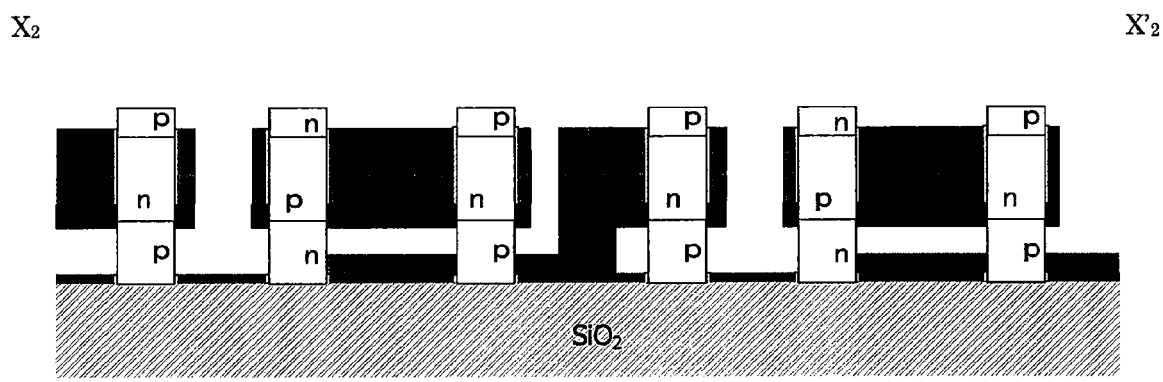

FIG. 162 is a sectional view ($X_2$-$X'_2$ section) showing the step in the example of the production method for the semiconductor device according to the first embodiment.

Figure 163:
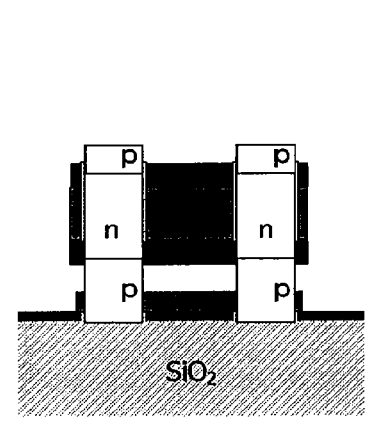

FIG. 163 is a sectional view ($Y_1$-$Y'_1$ section) showing the step in the example of the production method for the semiconductor device according to the first embodiment.

Figure 164:
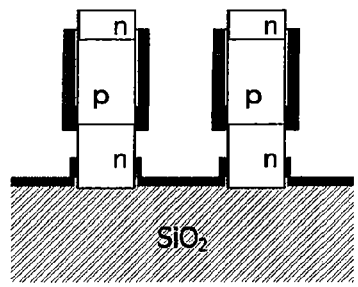

FIG. 164 is a sectional view ($Y_2$-$Y'_2$ section) showing the step in the example of the production method for the semiconductor device according to the first embodiment.

Figure 165:
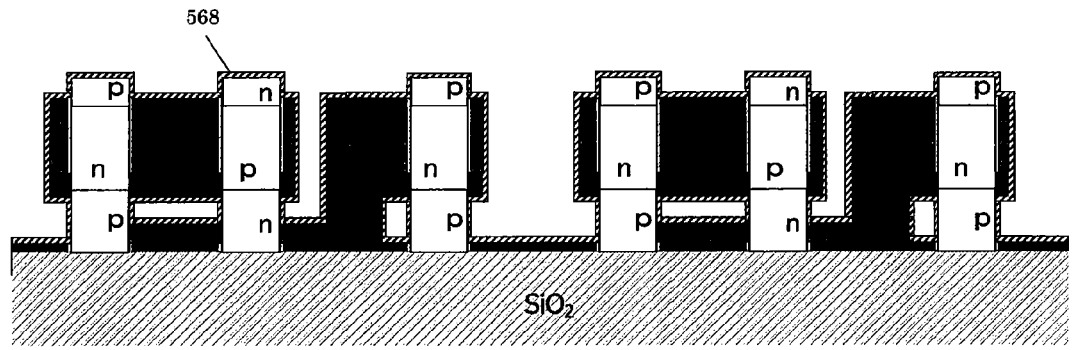

FIG. 165 is a sectional view ($X_1$-$X'_1$ section) showing a step in the example of the production method for the semiconductor device according to the first embodiment.

Figure 166:
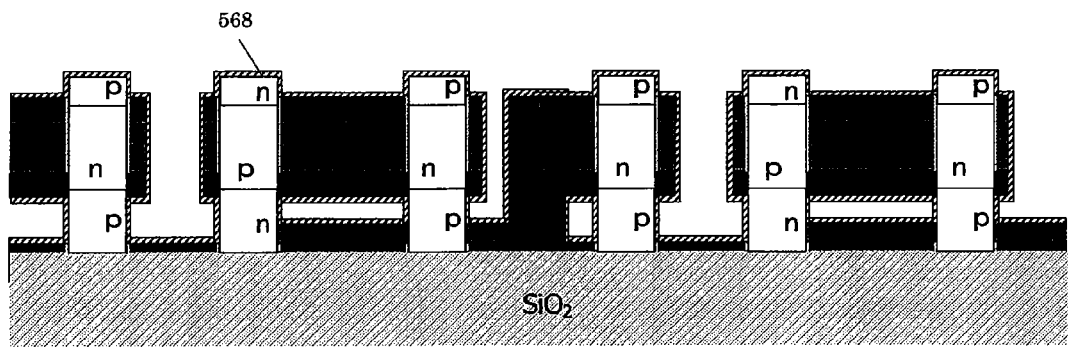

FIG. 166 is a sectional view ($X_2$-$X'_2$ section) showing the step in the example of the production method for the semiconductor device according to the first embodiment.

Figure 167:
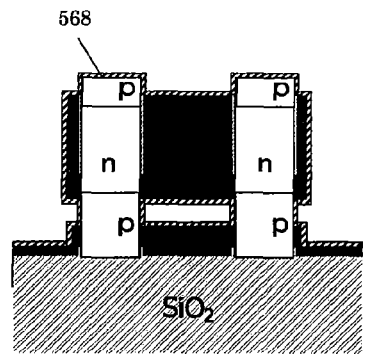

FIG. 167 is a sectional view ($Y_1$-$Y'_1$ section) showing the step in the example of the production method for the semiconductor device according to the first embodiment.

Figure 168:
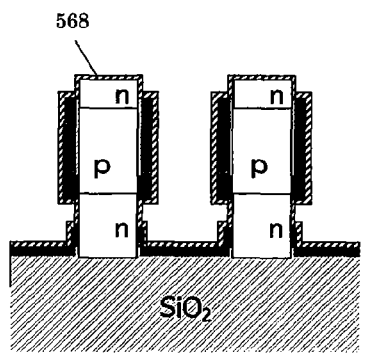

FIG. 168 is a sectional view ($Y_2$-$Y'_2$ section) showing the step in the example of the production method for the semiconductor device according to the first embodiment.

Figure 169:
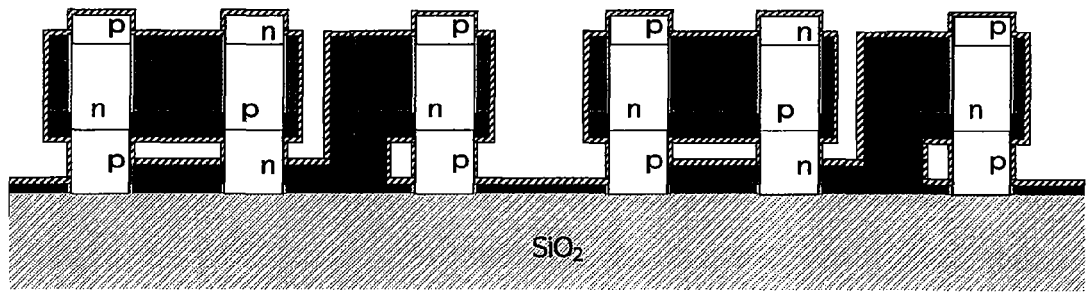

FIG. 169 is a sectional view ($X_1$-$X'_1$ section) showing a step in the example of the production method for the semiconductor device according to the first embodiment.

Figure 170:
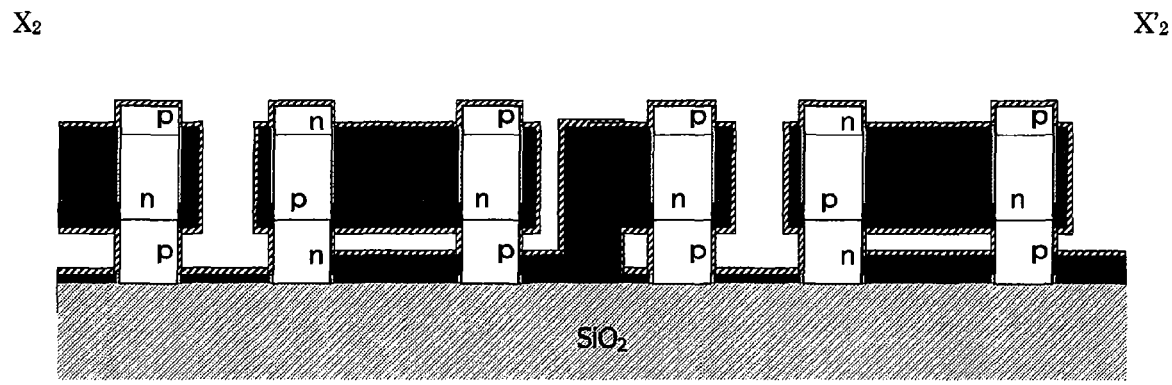

FIG. 170 is a sectional view ($X_2$-$X'_2$ section) showing the step in the example of the production method for the semiconductor device according to the first embodiment.

Figure 171:
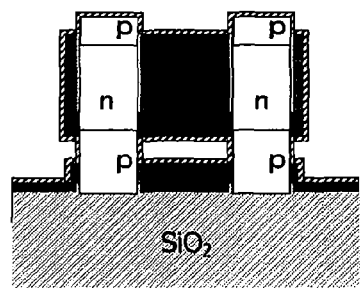

FIG. 171 is a sectional view ($Y_1$-$Y'_1$ section) showing the step in the example of the production method for the semiconductor device according to the first embodiment.

Figure 172:
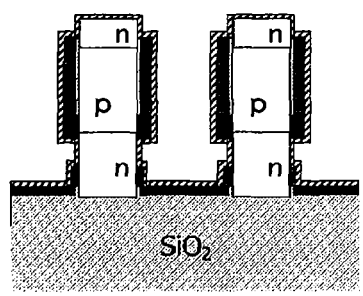

FIG. 172 is a sectional view ($Y_2$-$Y'_2$ section) showing the step in the example of the production method for the semiconductor device according to the first embodiment.

Figure 173:
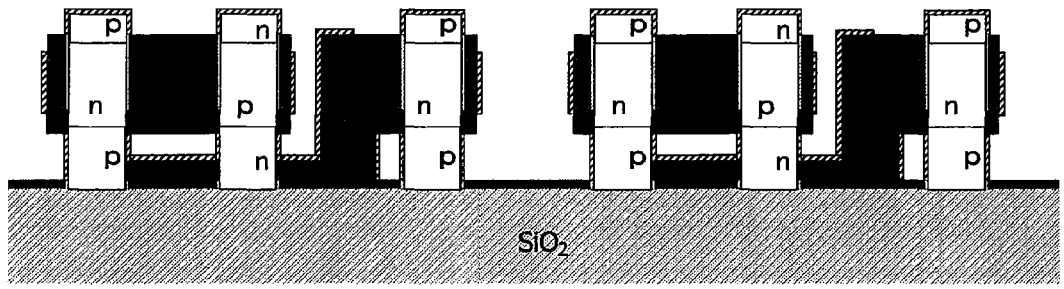

FIG. 173 is a sectional view ($X_1$-$X'_1$ section) showing a step in the example of the production method for the semiconductor device according to the first embodiment.

Figure 174:
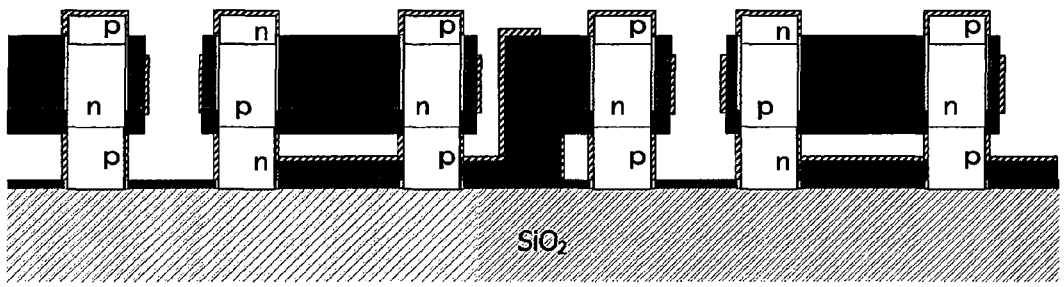

FIG. 174 is a sectional view ($X_2$-$X'_2$ section) showing the step in the example of the production method for the semiconductor device according to the first embodiment.

Figure 175:
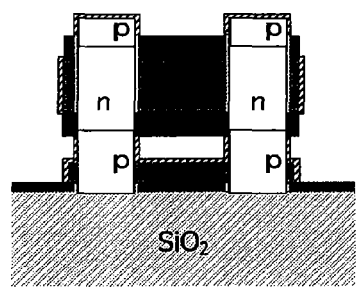

FIG. 175 is a sectional view ($Y_1$-$Y'_1$ section) showing the step in the example of the production method for the semiconductor device according to the first embodiment.

Figure 176:
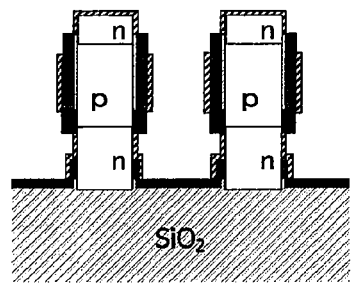

FIG. 176 is a sectional view ($Y_2$-$Y'_2$ section) showing the step in the example of the production method for the semiconductor device according to the first embodiment.

Figure 177:
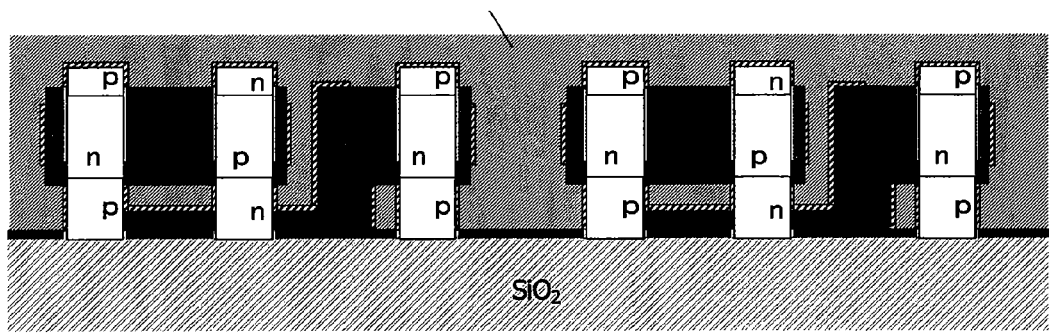

FIG. 177 is a sectional view ($X_1$-$X'_1$ section) showing a step in the example of the production method for the semiconductor device according to the first embodiment.

Figure 178:
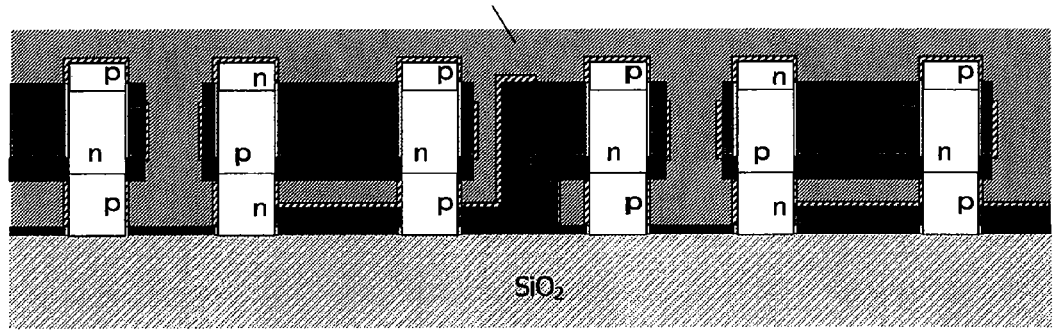

FIG. 178 is a sectional view ($X_2$-$X'_2$ section) showing the step in the example of the production method for the semiconductor device according to the first embodiment.

Figure 179:
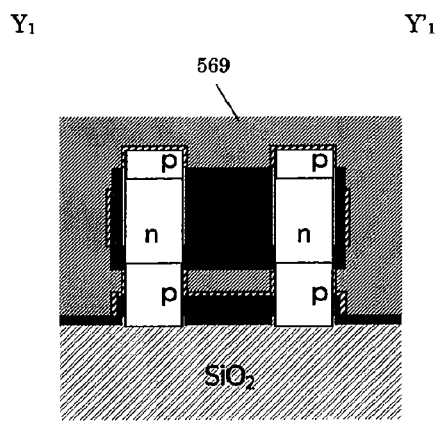

FIG. 179 is a sectional view ($Y_1$-$Y'_1$ section) showing the step in the example of the production method for the semiconductor device according to the first embodiment.

Figure 180:
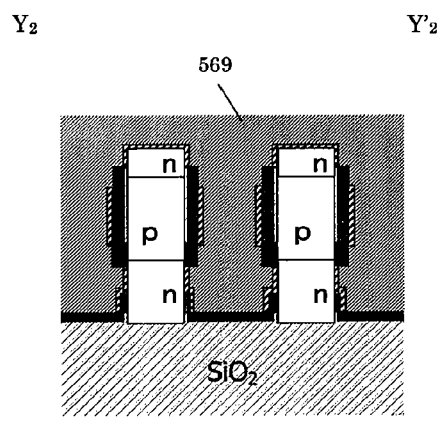

FIG. 180 is a sectional view ($Y_2$-$Y'_2$ section) showing the step in the example of the production method for the semiconductor device according to the first embodiment.

Figure 181:
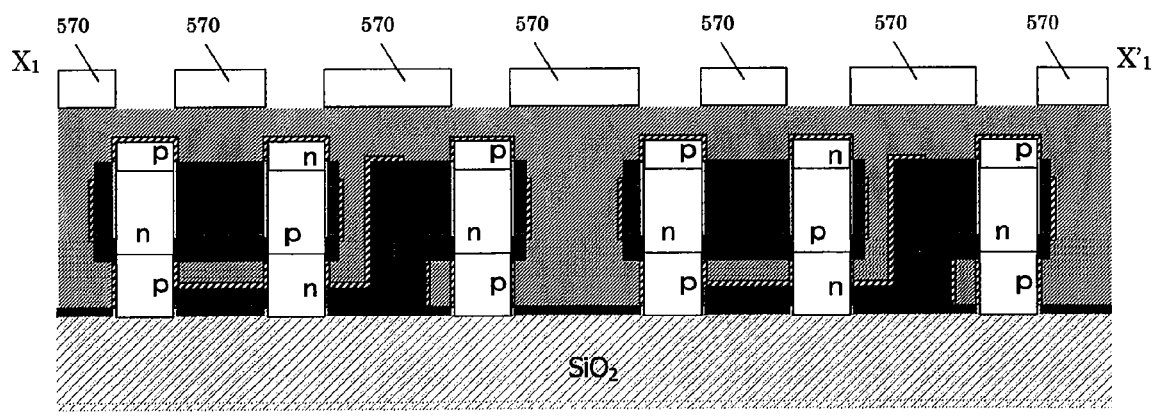

FIG. 181 is a sectional view ($X_1$-$X'_1$ section) showing a step in the example of the production method for the semiconductor device according to the first embodiment.

Figure 182:
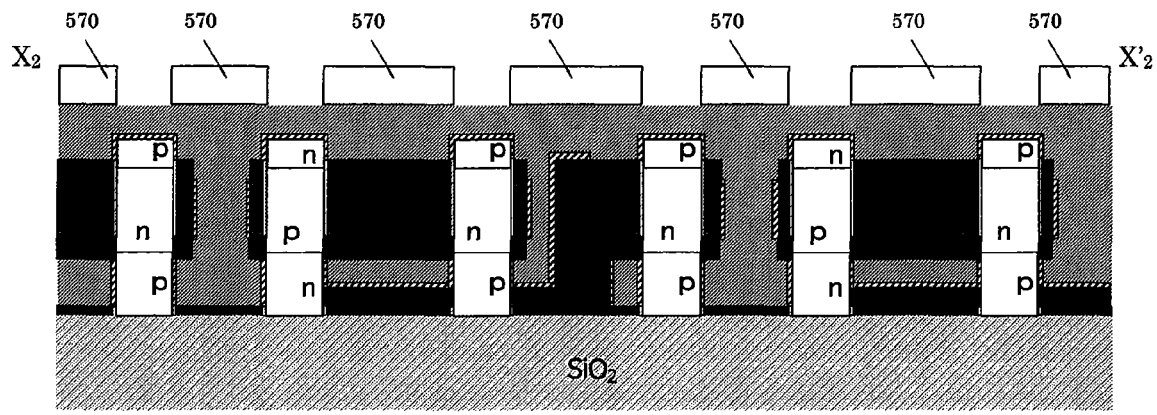

FIG. 182 is a sectional view ($X_2$-$X'_2$ section) showing the step in the example of the production method for the semiconductor device according to the first embodiment.

Figure 183:
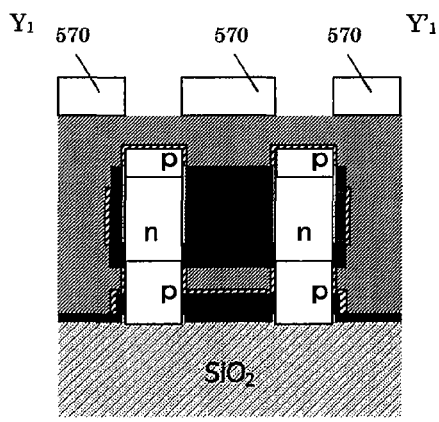

FIG. 183 is a sectional view ($Y_1$-$Y'_1$ section) showing the step in the example of the production method for the semiconductor device according to the first embodiment.

Figure 184:
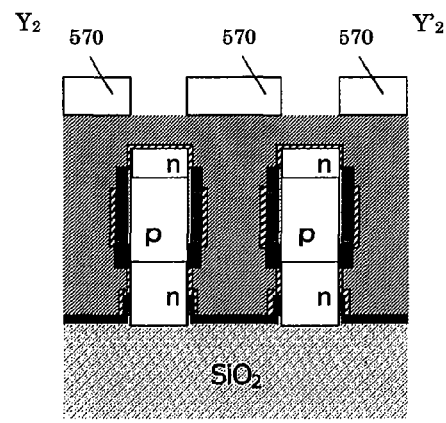

FIG. 184 is a sectional view ($Y_2$-$Y'_2$ section) showing the step in the example of the production method for the semiconductor device according to the first embodiment.

Figure 185:
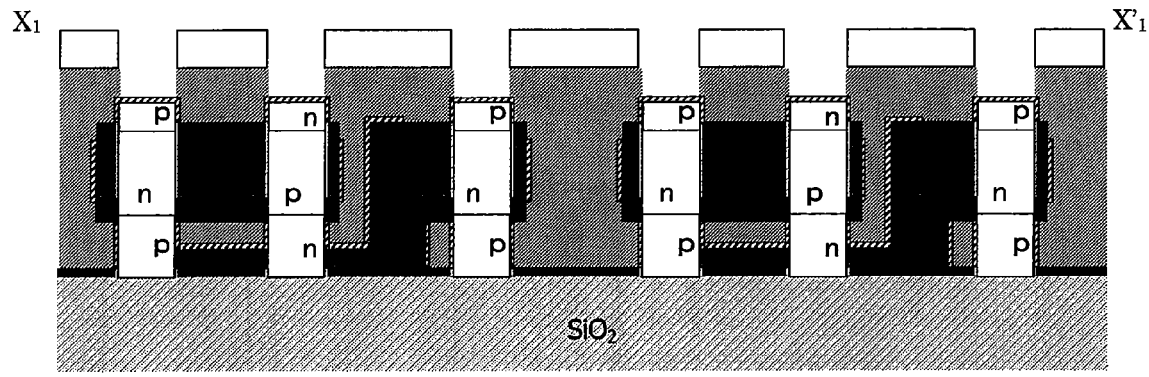

FIG. 185 is a sectional view ($X_1$-$X'_1$ section) showing a step in the example of the production method for the semiconductor device according to the first embodiment.

Figure 186:
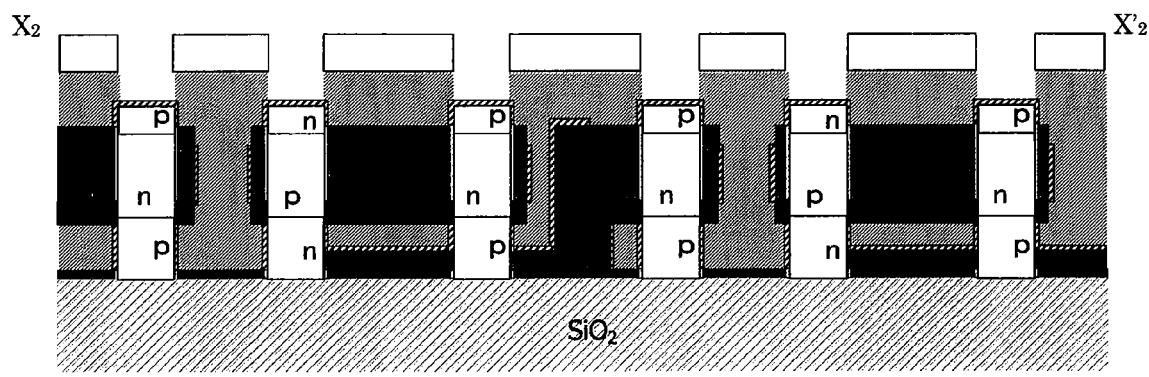

FIG. 186 is a sectional view ($X_2$-$X'_2$ section) showing the step in the example of the production method for the semiconductor device according to the first embodiment.

Figure 187:
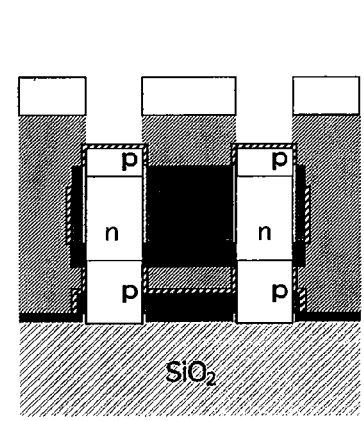

FIG. 187 is a sectional view ($Y_1$-$Y'_1$ section) showing the step in the example of the production method for the semiconductor device according to the first embodiment.

Figure 188:
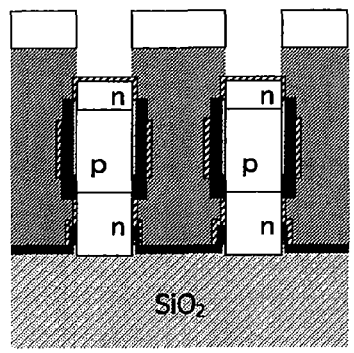

FIG. 188 is a sectional view ($Y_2$-$Y'_2$ section) showing the step in the example of the production method for the semiconductor device according to the first embodiment.

Figure 189:
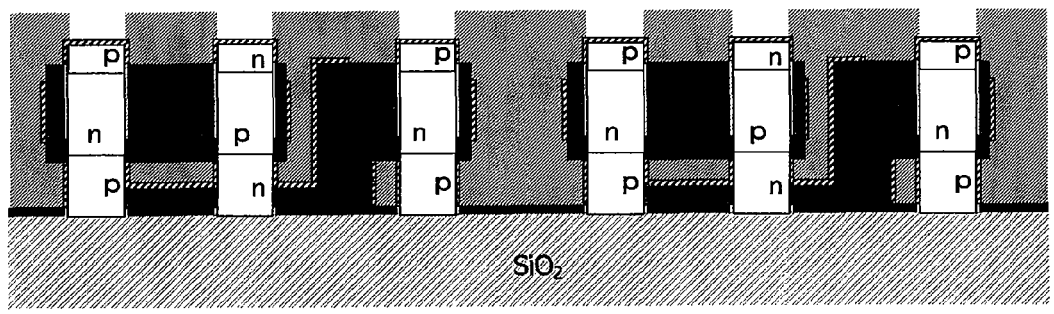

FIG. 189 is a sectional view ($X_1$-$X'_1$ section) showing a step in the example of the production method for the semiconductor device according to the first embodiment.

Figure 190:
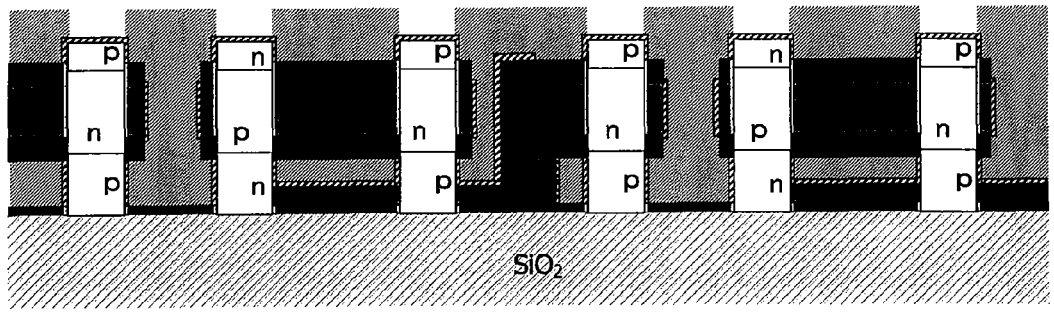

FIG. 190 is a sectional view ($X_2$-$X'_2$ section) showing the step in the example of the production method for the semiconductor device according to the first embodiment.

Figure 191:
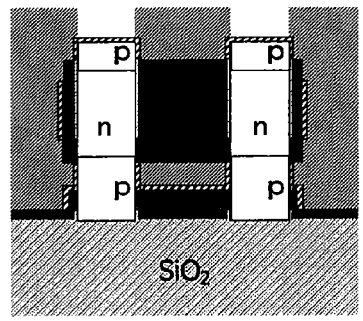

FIG. 191 is a sectional view ($Y_1$-$Y'_1$ section) showing the step in the example of the production method for the semiconductor device according to the first embodiment.

Figure 192:
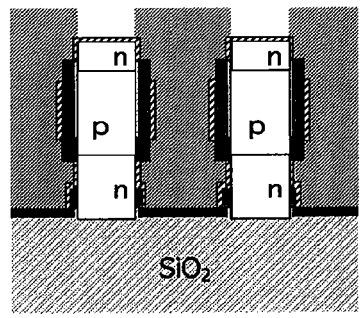

FIG. 192 is a sectional view ($Y_2$-$Y'_2$ section) showing the step in the example of the production method for the semiconductor device according to the first embodiment.

Figure 193:
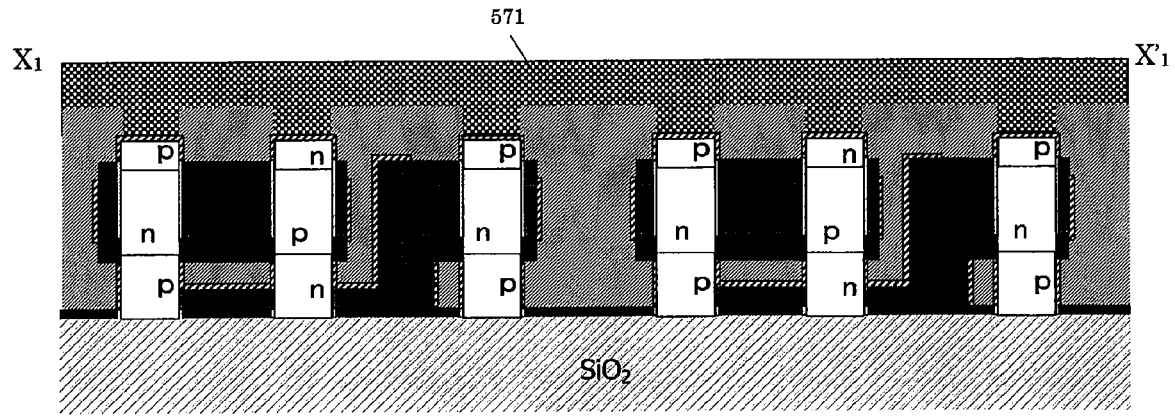

FIG. 193 is a sectional view ($X_1$-$X'_1$ section) showing a step in the example of the production method for the semiconductor device according to the first embodiment.

Figure 194:
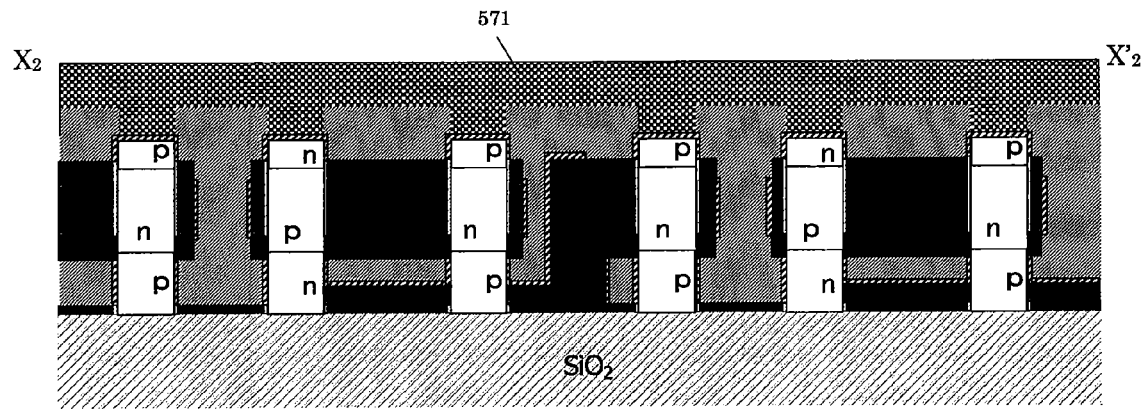

FIG. 194 is a sectional view ($X_2$-$X'_2$ section) showing the step in the example of the production method for the semiconductor device according to the first embodiment.

Figure 195:
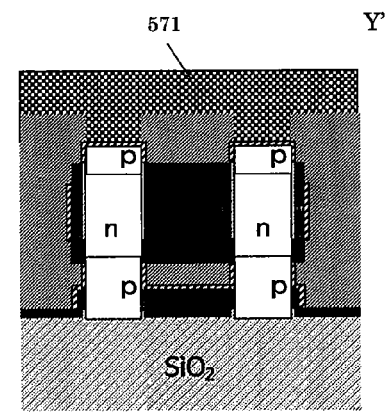

FIG. 195 is a sectional view ($Y_1$-$Y'_1$ section) showing the step in the example of the production method for the semiconductor device according to the first embodiment.

Figure 196:
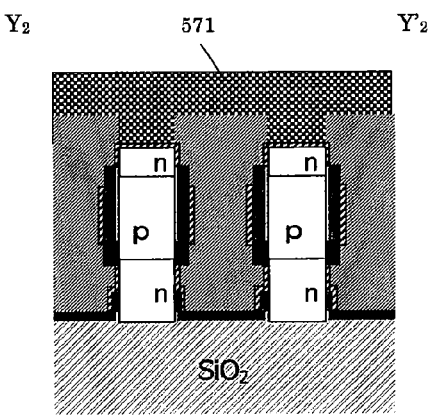

FIG. 196 is a sectional view ($Y_2$-$Y'_2$ section) showing the step in the example of the production method for the semiconductor device according to the first embodiment.

Figure 197:
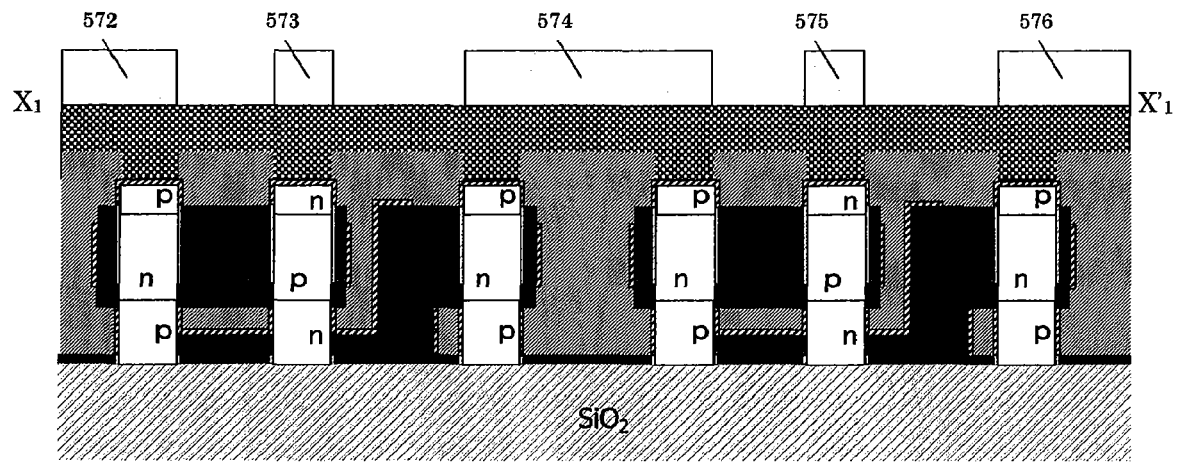

FIG. 197 is a sectional view ($X_1$-$X'_1$ section) showing a step in the example of the production method for the semiconductor device according to the first embodiment.

Figure 198:
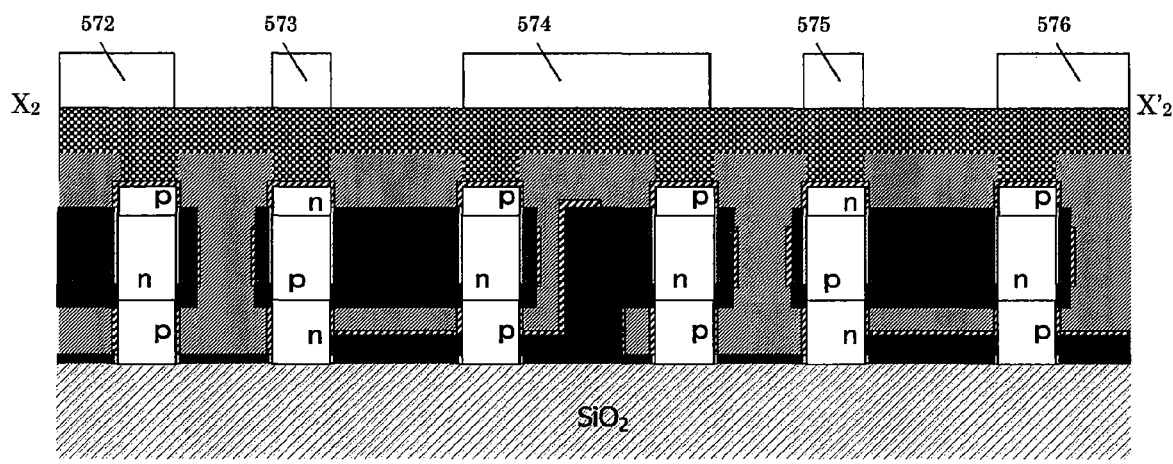

FIG. 198 is a sectional view ($X_2$-$X'_2$ section) showing the step in the example of the production method for the semiconductor device according to the first embodiment.

Figure 199:
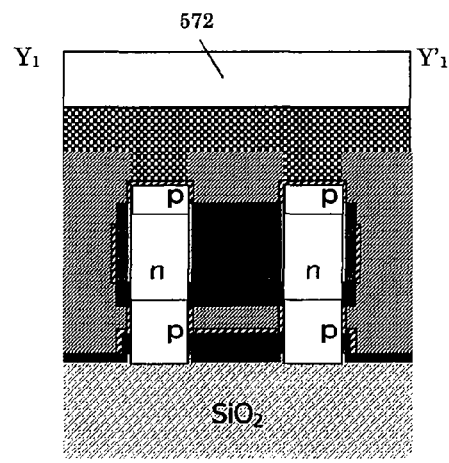

FIG. 199 is a sectional view ($Y_1$-$Y'_1$ section) showing the step in the example of the production method for the semiconductor device according to the first embodiment.

Figure 200:
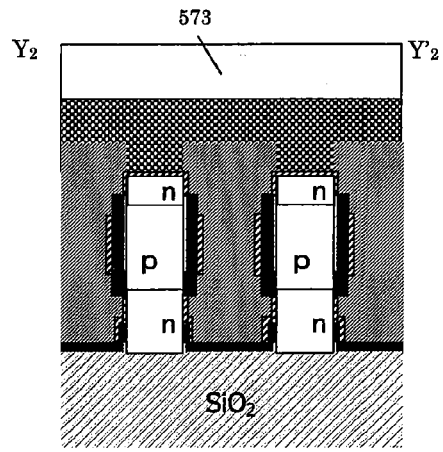

FIG. 200 is a sectional view (Y$_2$-Y'$_2$ section) showing the step in the example of the production method for the semiconductor device according to the first embodiment.

Figure 201:
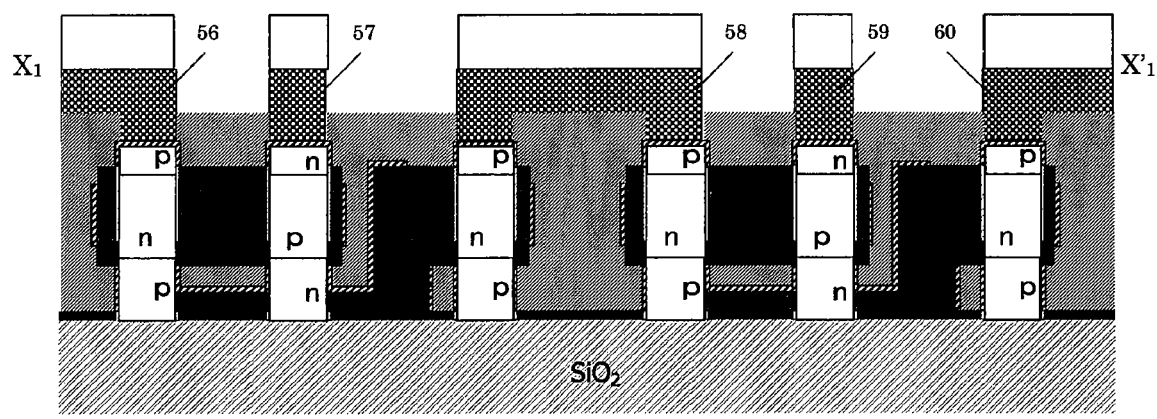

FIG. 201 is a sectional view (X$_1$-X'$_1$ section) showing a step in the example of the production method for the semiconductor device according to the first embodiment.

Figure 202:
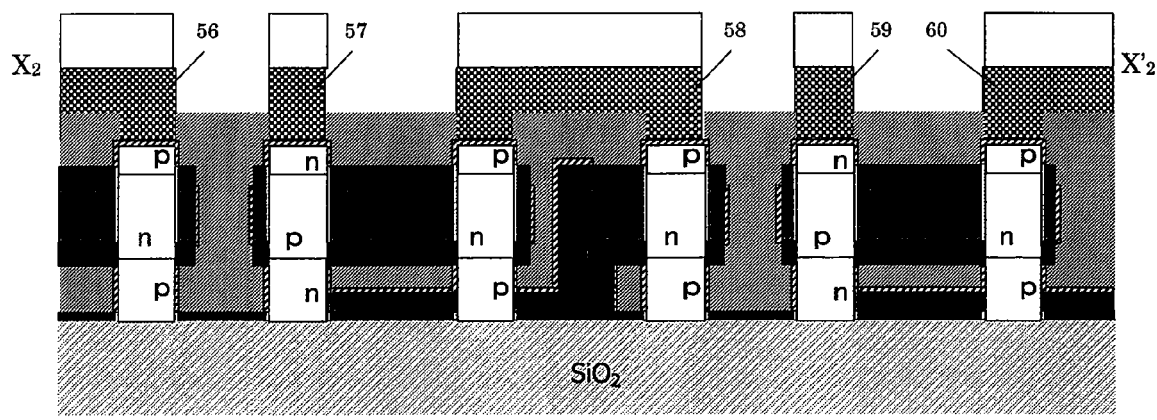

FIG. 202 is a sectional view (X$_2$-X'$_2$ section) showing the step in the example of the production method for the semiconductor device according to the first embodiment.

Figure 203:
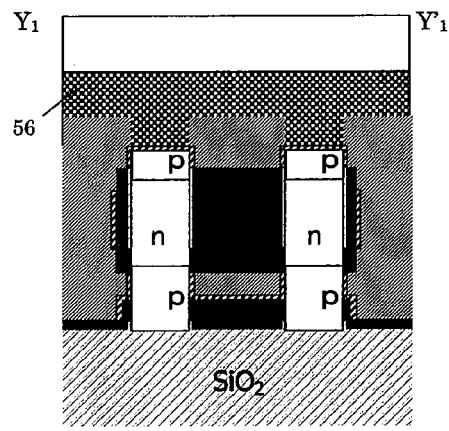

FIG. 203 is a sectional view (Y$_1$-Y'$_1$ section) showing the step in the example of the production method for the semiconductor device according to the first embodiment.

Figure 204:
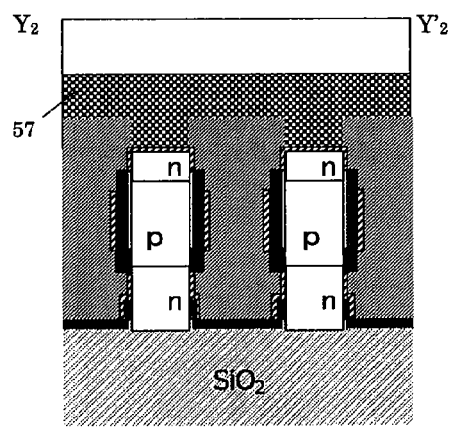

FIG. 204 is a sectional view (Y$_2$-Y'$_2$ section) showing the step in the example of the production method for the semiconductor device according to the first embodiment.

Figure 205:
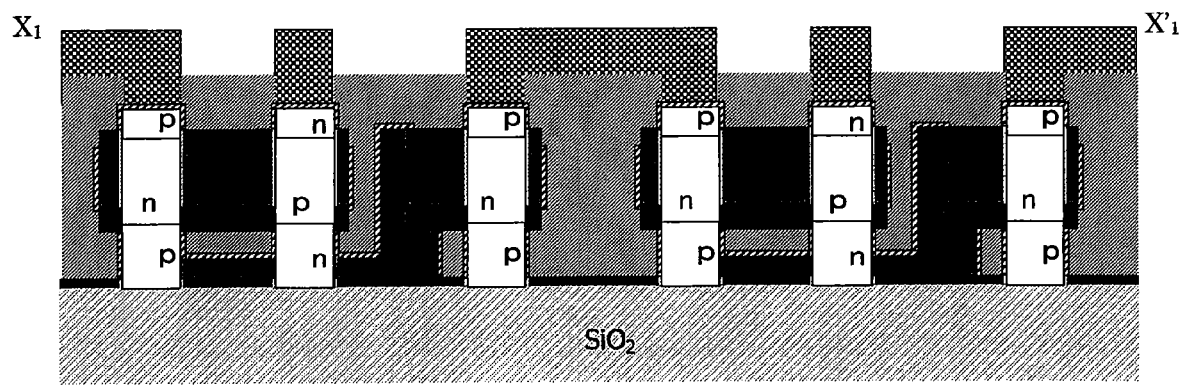

FIG. 205 is a sectional view (X$_1$-X'$_1$ section) showing a step in the example of the production method for the semiconductor device according to the first embodiment.

Figure 206:
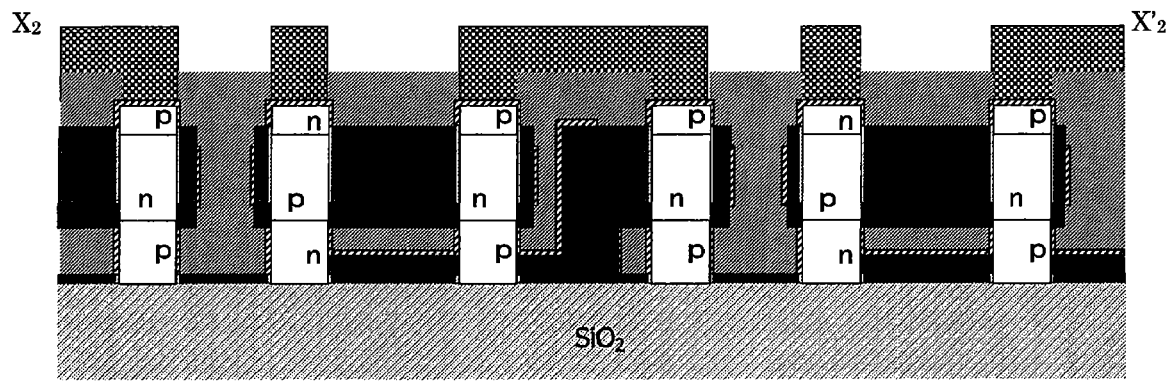

FIG. 206 is a sectional view (X$_2$-X'$_2$ section) showing the step in the example of the production method for the semiconductor device according to the first embodiment.

Figure 207:
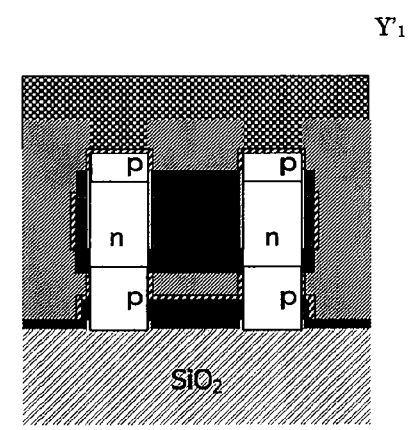

FIG. 207 is a sectional view (Y$_1$-Y'$_1$ section) showing the step in the example of the production method for the semiconductor device according to the first embodiment.

Figure 208:
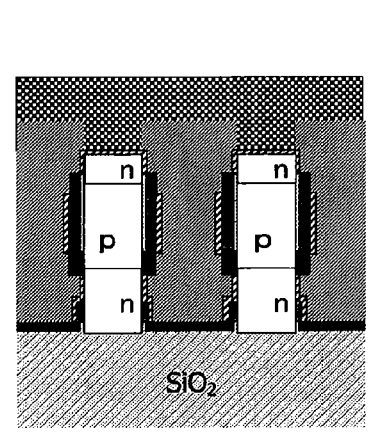

FIG. 208 is a sectional view (Y$_2$-Y'$_2$ section) showing the step in the example of the production method for the semiconductor device according to the first embodiment.

Figure 209:
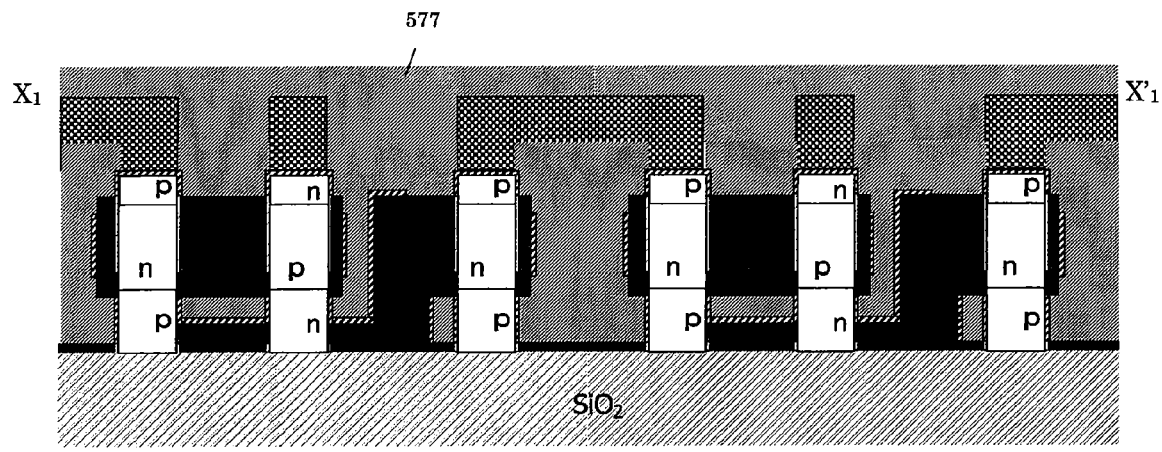

FIG. 209 is a sectional view (X$_1$-X'$_1$ section) showing a step in the example of the production method for the semiconductor device according to the first embodiment.

Figure 210:
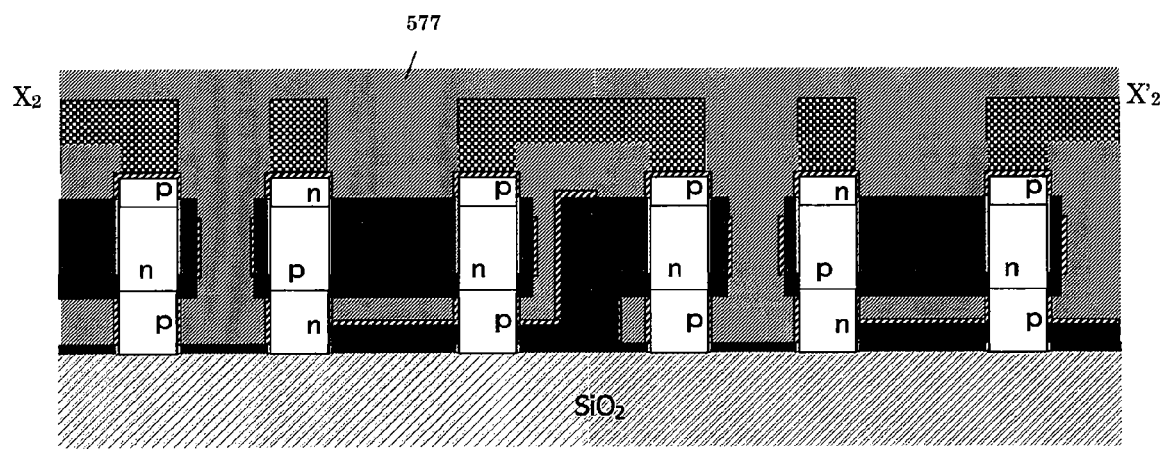

FIG. 210 is a sectional view (X$_2$-X'$_2$ section) showing the step in the example of the production method for the semiconductor device according to the first embodiment.

Figure 211:
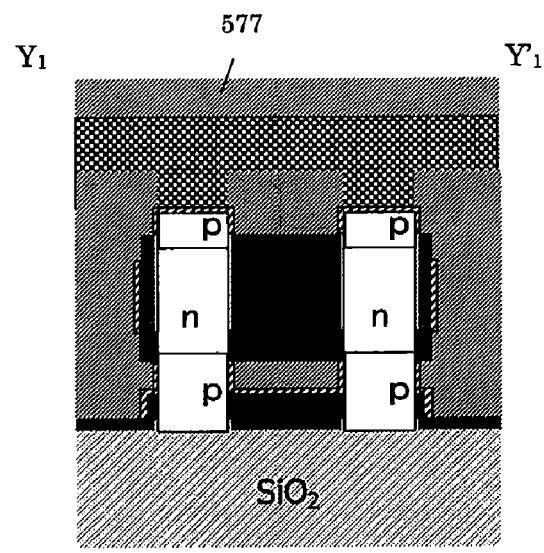

FIG. 211 is a sectional view (Y$_1$-Y'$_1$ section) showing the step in the example of the production method for the semiconductor device according to the first embodiment.

Figure 212:
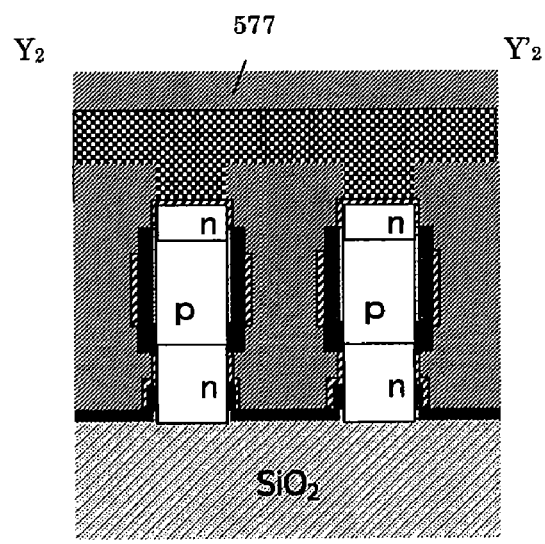

FIG. 212 is a sectional view (Y$_2$-Y'$_2$ section) showing the step in the example of the production method for the semiconductor device according to the first embodiment.

DETAILED DESCRIPTION OF THE PREFERRED EMBODIMENTS

The present invention will now be described based on an embodiment thereof illustrated in the drawings. However, it should be understood that the present invention is not limited to the following embodiment.

FIGS. 3 to 7 show a layout and a cross-sectional structure of a semiconductor device according to a first embodiment of the present invention.

In the first embodiment, one n-channel semiconductor device (n-channel MOS transistor) is arranged at an intersection of the 1st row and the 2nd column, wherein the n-channel semiconductor device comprises: an output terminal line 19 based on an island-shaped semiconductor lower layer (island-shaped semiconductor lower layer-based line 19), and a drain diffusion layer 9, each formed on a silicon oxide film 8 of a substrate; an island-shaped semiconductor layer 10 formed on the drain diffusion layer 9; a source diffusion layer 11 formed on top of the island-shaped semiconductor layer 10; and a gate 12 formed on a channel region of a sidewall of the island-shaped semiconductor layer 10 sandwiched between the drain diffusion layer 9 and the source diffusion layer 11, through a gate dielectric film.

One of two p-channel semiconductor devices (p-channel MOS transistors) is arranged at an intersection of the 1st row and the 1st column, wherein the p-channel semiconductor device comprises: the island-shaped semiconductor lower layer-based line 19 and a drain diffusion layer 13 each formed on the silicon oxide film 8; an island-shaped semiconductor layer 14 formed on the drain diffusion layer 13; a source diffusion layer 15 formed on top of the island-shaped semiconductor layer 14; and the gate 12 formed on a channel region of a sidewall of the island-shaped semiconductor layer 14 sandwiched between the drain diffusion layer 13 and the source diffusion layer 15, through a gate dielectric film. The other p-channel semiconductor device is arranged at an intersection of the 2nd row and the 1st column, wherein the p-channel the semiconductor device comprises: the island-shaped semiconductor lower layer-based line 19 and a drain diffusion layer 16 each formed on the silicon oxide film 8; an island-shaped semiconductor layer 17 formed on the drain diffusion layer 16; a source diffusion layer 18 formed on top of the island-shaped semiconductor layer 17; and the gate 12 formed on a channel region of a sidewall of the island-shaped semiconductor layer 17 sandwiched between the drain diffusion layer 16 and the source diffusion layer 18, through a gate dielectric film.

In this manner, the two p-channel semiconductor devices and the one re-channel semiconductor device make up a first inverter.

Further, one n-channel semiconductor device is arranged at an intersection of the 2nd row and the 2nd column, wherein the n-channel semiconductor device comprises: an output terminal line 30 based on an island-shaped semiconductor lower layer (island-shaped semiconductor lower layer-based line 30), and a drain diffusion layer 20, each formed on the silicon oxide film 8; an island-shaped semiconductor layer 21 formed on the drain diffusion layer 20; a source diffusion layer 22 formed on top of the island-shaped semiconductor layer 21; and a gate 23 formed on a channel region of a sidewall of the island-shaped semiconductor layer 21 sandwiched between the drain diffusion layer 20 and the source diffusion layer 22, through a gate dielectric film.

One of two p-channel semiconductor devices is arranged at an intersection of the 1st row and the 3rd column, wherein the p-channel semiconductor device comprises: the island-shaped semiconductor lower layer-based line 30 and a drain diffusion layer 27 each formed on the silicon oxide film 8; an island-shaped semiconductor layer 28 formed on the drain diffusion layer 27; a source diffusion layer 29 formed on top of the island-shaped semiconductor layer 28; and the gate 23 formed on a channel region of a sidewall of the island-shaped semiconductor layer 28 sandwiched between the drain diffusion layer 27 and the source diffusion layer 29, through a gate dielectric film. The other p-channel semiconductor device is arranged at an intersection of the 2nd row and the 3rd column, wherein the p-channel semiconductor device comprises: the island-shaped semiconductor lower layer-based line 30 and a drain diffusion layer 24 each formed on the silicon oxide film 8; an island-shaped semiconductor layer 25 formed on the drain diffusion layer 24; a source diffusion layer 26 formed on top of the island-shaped semiconductor layer 25; and the gate 23 formed on a channel region of a sidewall of the island-shaped semiconductor layer 25 sandwiched between the drain diffusion layer 24 and the source diffusion layer 25, through a gate dielectric film.

In this manner, the two p-channel semiconductor devices and the one n-channel semiconductor device make up a second inverter.

Further, one n-channel semiconductor device is arranged at an intersection of the 1st row and the 5th column, wherein the n-channel semiconductor device comprises: an output terminal line 41 based on an island-shaped semiconductor lower layer (island-shaped semiconductor lower layer-based line 41), and a drain diffusion layer 31, each formed on the silicon oxide film 8; an island-shaped semiconductor layer 32 formed on the drain diffusion layer 31; a source diffusion layer 33 formed on top of the island-shaped semiconductor layer 32; and a gate 34 formed on a channel region of a sidewall of the island-shaped semiconductor layer 32 sandwiched between the drain diffusion layer 31 and the source diffusion layer 33, through a gate dielectric film.

One of two p-channel semiconductor devices is arranged at an intersection of the 1st row and the 4th column, wherein the p-channel semiconductor device comprises: the island-shaped semiconductor lower layer-based line 41 and a drain diffusion layer 38 each formed on the silicon oxide film 8; an island-shaped semiconductor layer 39 formed on the drain diffusion layer 38; a source diffusion layer 40 formed on top of the island-shaped semiconductor layer 39; and the gate 34 formed on a channel region of a sidewall of the island-shaped semiconductor layer 39 sandwiched between the drain diffusion layer 38 and the source diffusion layer 40, through a gate dielectric film. The other p-channel semiconductor device is arranged at an intersection of the 2nd row and the 4th column, wherein the p-channel semiconductor device comprises: the island-shaped semiconductor lower layer-based line 41 and a drain diffusion layer 35 each formed on the silicon oxide film 8; an island-shaped semiconductor layer 36 formed on the drain diffusion layer 35; a source diffusion layer 37 formed on top of the island-shaped semiconductor layer 36; and the gate 34 formed on a channel region of a sidewall of the island-shaped semiconductor layer 36 sandwiched between the drain diffusion layer 35 and the source diffusion layer 37, through a gate dielectric film.

In this manner, the two p-channel semiconductor devices and the one n-channel semiconductor device make up a third inverter.

Further, one n-channel semiconductor device is arranged at an intersection of the 2nd row and the 5th column, wherein the n-channel semiconductor device comprises: an output terminal line 52 based on an island-shaped semiconductor lower layer (island-shaped semiconductor lower layer-based line 52), and a drain diffusion layer 42, each formed on the silicon oxide film 8; an island-shaped semiconductor layer 43 formed on the drain diffusion layer 42; a source diffusion layer 44 formed on top of the island-shaped semiconductor layer 43; and a gate 45 formed on a channel region of a sidewall of the island-shaped semiconductor layer 43 sandwiched between the drain diffusion layer 42 and the source diffusion layer 44, through a gate dielectric film.

One of two p-channel semiconductor devices is arranged at an intersection of the 1st row and the 6th column, wherein the p-channel semiconductor device comprises: the island-shaped semiconductor lower layer-based line 52 and a drain diffusion layer 49 each formed on the silicon oxide film 8; an island-shaped semiconductor layer 50 formed on the drain diffusion layer 49; a source diffusion layer 51 formed on top of the island-shaped semiconductor layer 50; and the gate 45 formed on a channel region of a sidewall of the island-shaped semiconductor layer 50 sandwiched between the drain diffusion layer 49 and the source diffusion layer 51, through a gate dielectric film. The other p-channel semiconductor device is arranged at an intersection of the 2nd row and the 6th column, wherein the p-channel semiconductor device comprises: the island-shaped semiconductor lower layer-based line 52 and a drain diffusion layer 46 each formed on the silicon oxide film 8; an island-shaped semiconductor layer 47 formed on the drain diffusion layer 46; a source diffusion layer 48 formed on top of the island-shaped semiconductor layer 47; and the gate 45 formed on a channel region of a sidewall of the island-shaped semiconductor layer 47 sandwiched between the drain diffusion layer 46 and the source diffusion layer 48, through a gate dielectric film.

In this manner, the two p-channel semiconductor devices and the one re-channel semiconductor device make up a fourth inverter.

A first power supply line Vss1 57 as a Vss line is formed on the source diffusion layers 11, 22 of the two n-channel semiconductor devices of the first and second inverters, and a first power supply line Vss1 59 as a Vss line is formed on the source diffusion layers 33, 44 of the two n-channel semiconductor devices of the third and fourth inverters. Further, a second power supply line Vcc1 56 as a Vcc line is formed on the source diffusion layers 15, 18 of the two p-channel semiconductor devices of the first inverter. A second power supply line Vcc1 58 as a Vcc line is formed on the source diffusion layers 29, 26, 40, 37 of the four p-channel semiconductor devices of the second and third inverters, and a second power supply line Vcc1 60 as a Vcc line is formed on the source diffusion layers 48, 51 of the two p-channel semiconductor devices of the fourth inverter.

The gate 12 serves as an input terminal line of the first inverter.

The gate 23 serves as an input terminal line of the second inverter.

The gate 34 serves as an input terminal line of the third inverter.

The gate 45 serves as an input terminal line of the fourth inverter.

A contact 53 is formed to connect the gate 23 and the island-shaped semiconductor lower layer-based output terminal line 19 of the first inverter.

A contact 54 is formed to connect the gate 34 and the island-shaped semiconductor lower layer-based output terminal line 30 of the second inverter.

A contact 55 is formed to connect the gate 45 and the island-shaped semiconductor lower layer-based output terminal line 41 of the third inverter.

In the above CMOS inverter cascade circuit, the p-channel MOS transistors and the n-channel MOS transistors are arranged on the substrate in such a manner that two of them having the same channel type are located in the same column over a row direction. Further, each of the power supply lines is configured such that two or more of the MOS transistors having the same channel type are connected to each other on the source diffusion layers thereof. This makes it possible to reduce a layout distance for the power supply line so as to reduce a resistance of the power supply line to achieve a high-speed circuit. This also makes it possible to eliminate a need for arranging the power supply line in a region different from a layout region of the MOS transistors to achieve a CMOS inverter cascade circuit at a higher degree of integration than ever before.

The first embodiment shows a one-row-by-four-column CMOS inverter cascade circuit, wherein: a first inverter at an intersection of the 1st row and the 1st column in a one-row by four-column array is formed by arranging two p-channel MOS SGTs at respective ones of an intersection of the 1st row and the 1st column and an intersection of the 2nd row and the 1st column, and arranging one n-channel MOS SGT at an intersection of the 1st row and the 2nd column; a second inverter at an intersection of the 1st row and the 2nd column in the one-row by four-column array is formed by arranging two p-channel MOS SGTs at respective ones of an intersection of the 1st row and the 3rd column and the intersection of the 2nd row and the 3rd column, and arranging one n-channel MOS SGT at an intersection of the 2nd row and the 2nd column; a third inverter at an intersection of the 1st row and the 3rd column in the one-row by four-column array is formed by arranging two p-channel MOS SGTs at respective ones of an intersection of the 1st row and the 4th column and an intersection of the 2nd row and the 4th column, and arranging one n-channel MOS SGT at an intersection of the 1st row and the 5th column; and a fourth inverter at an intersection of the 1st row and the 4th column in the one-row by four-column array is formed by arranging two p-channel MOS SGTs at respective ones of an intersection of the 1st row and the 6th column and an intersection of the 2nd row and the 6th column, and arranging one n-channel MOS SGT at an intersection of the 2nd row and the 5th column.

Figure 1:
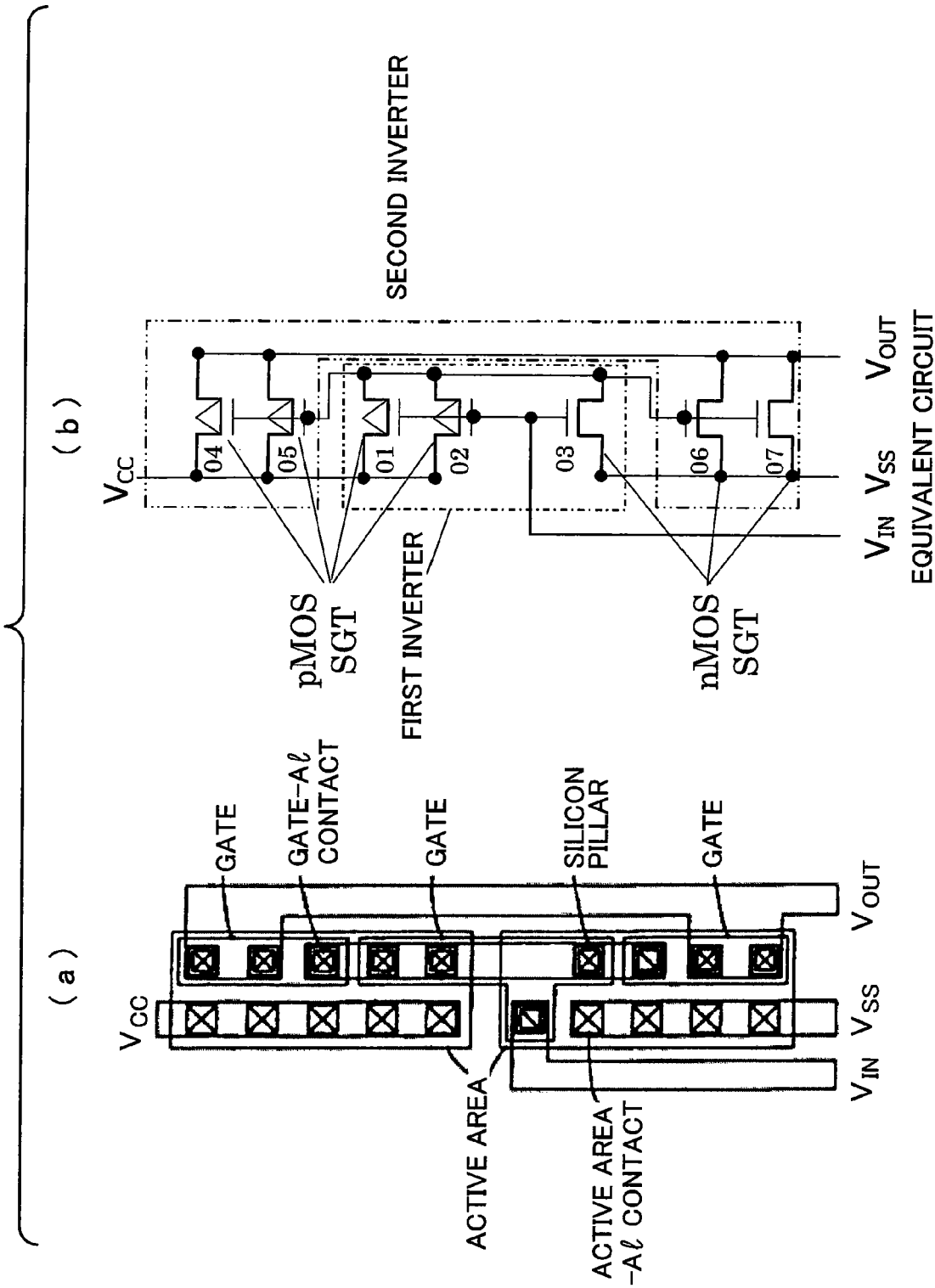
Figure 2:
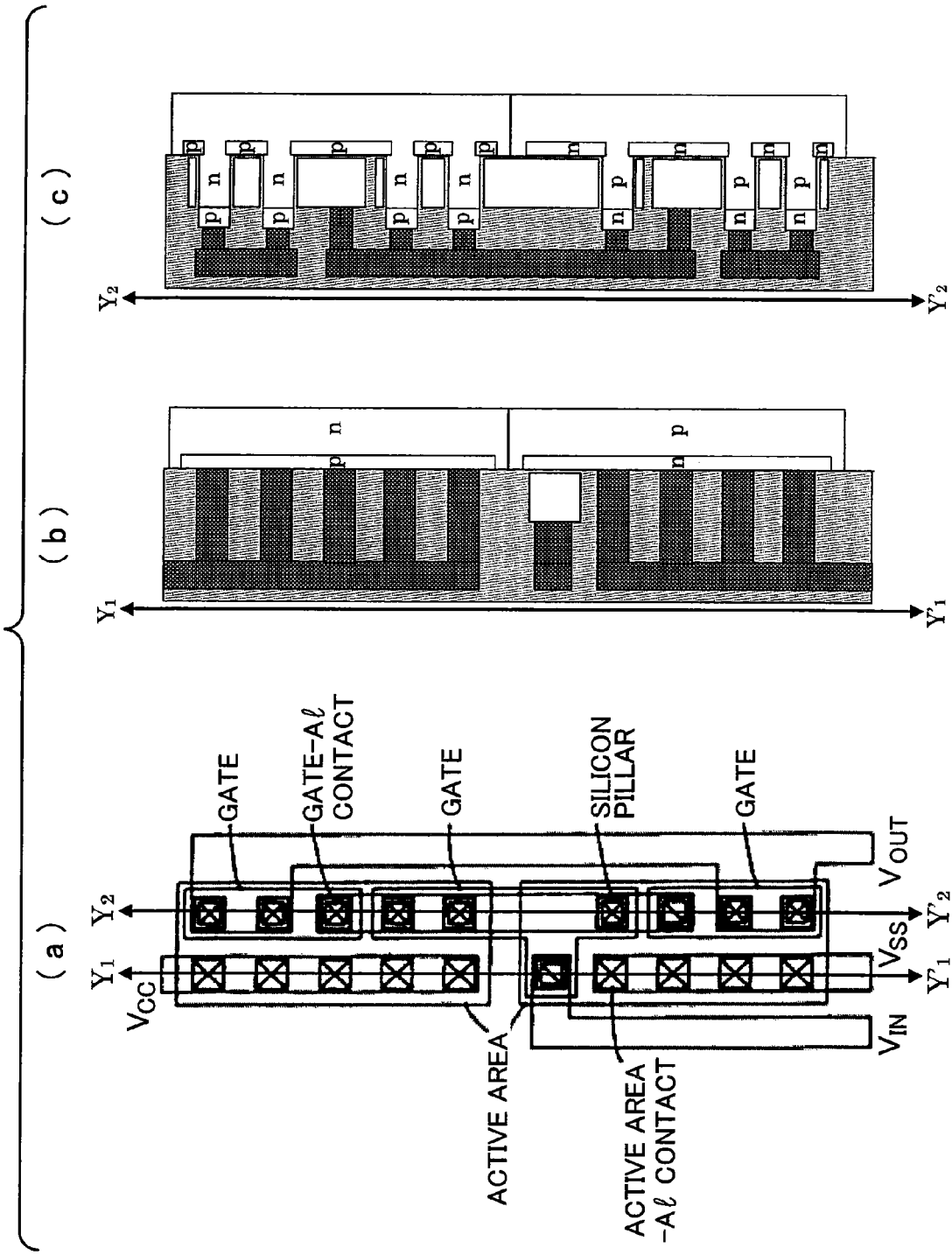
Figure 3:
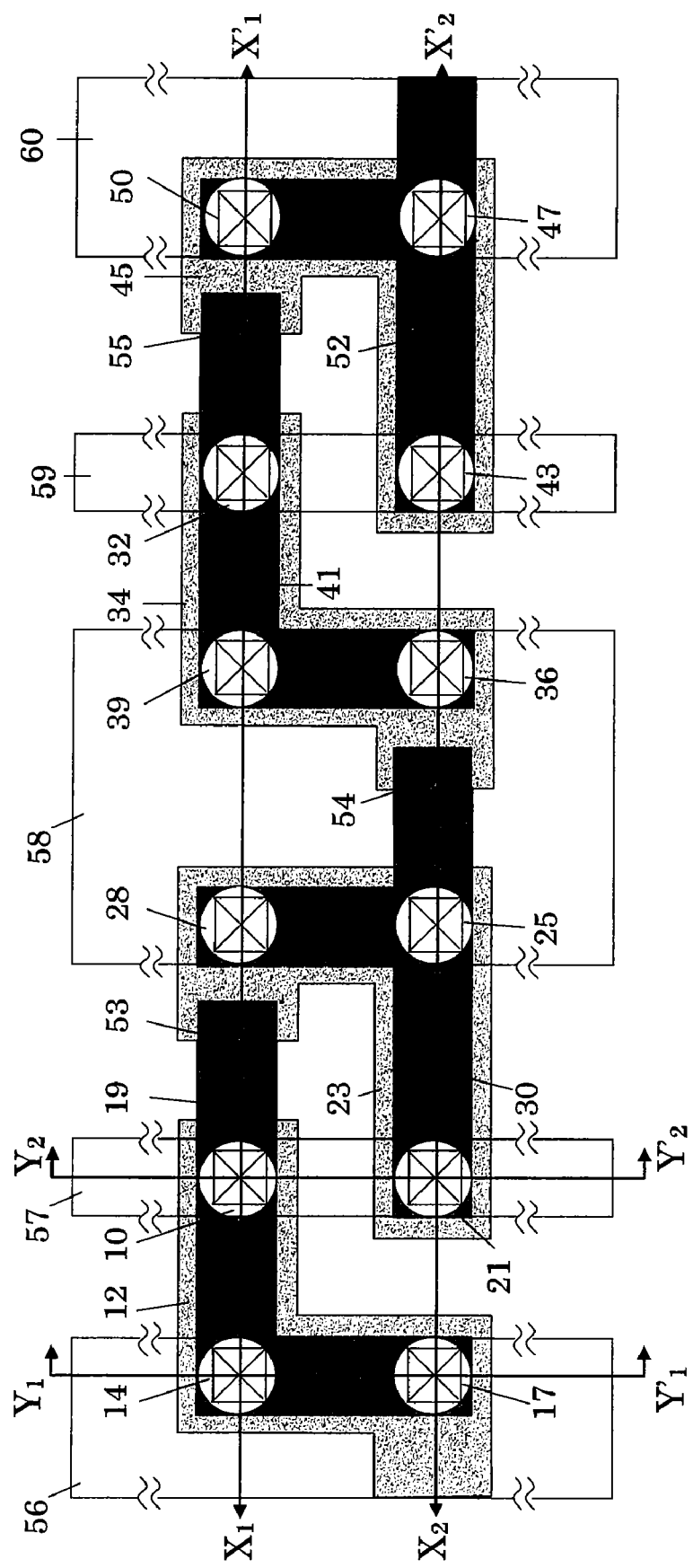
FIG. 3 is a layout diagram of a semiconductor device according to a first embodiment of the present invention.
Figure 4:
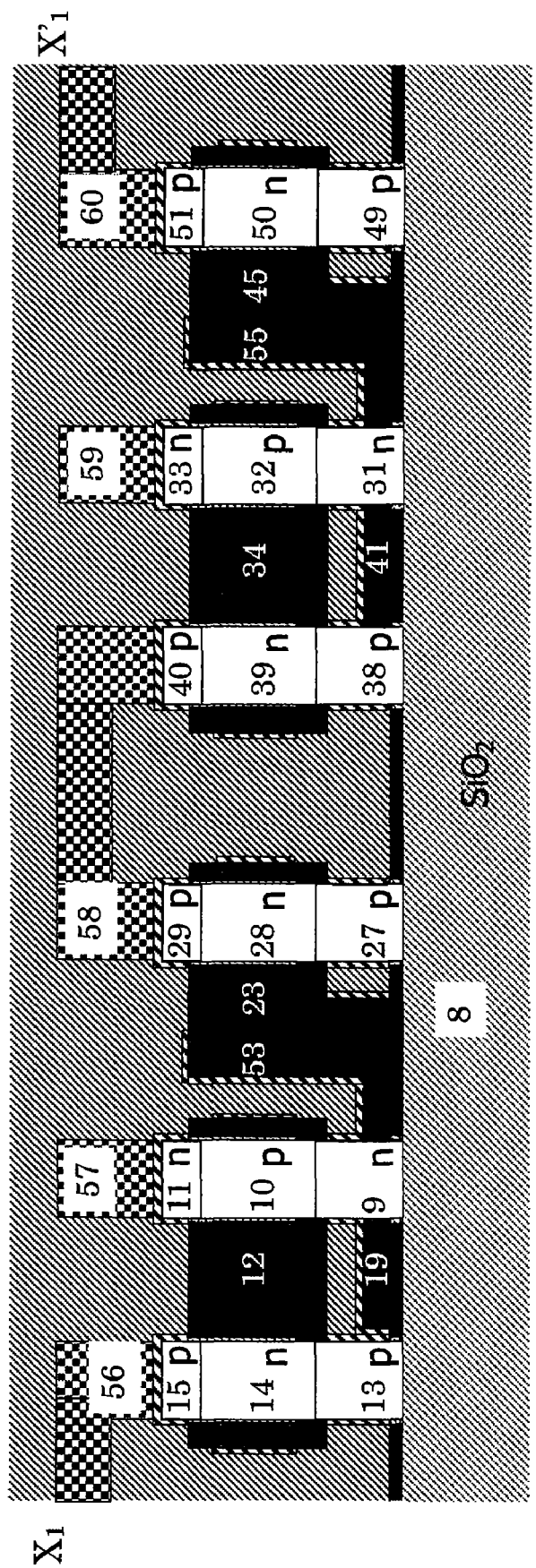
FIG. 4 is a sectional view of the semiconductor device according to the first embodiment, taken along the line $X_1$-$X'_1$ in FIG. 3.
Figure 5:
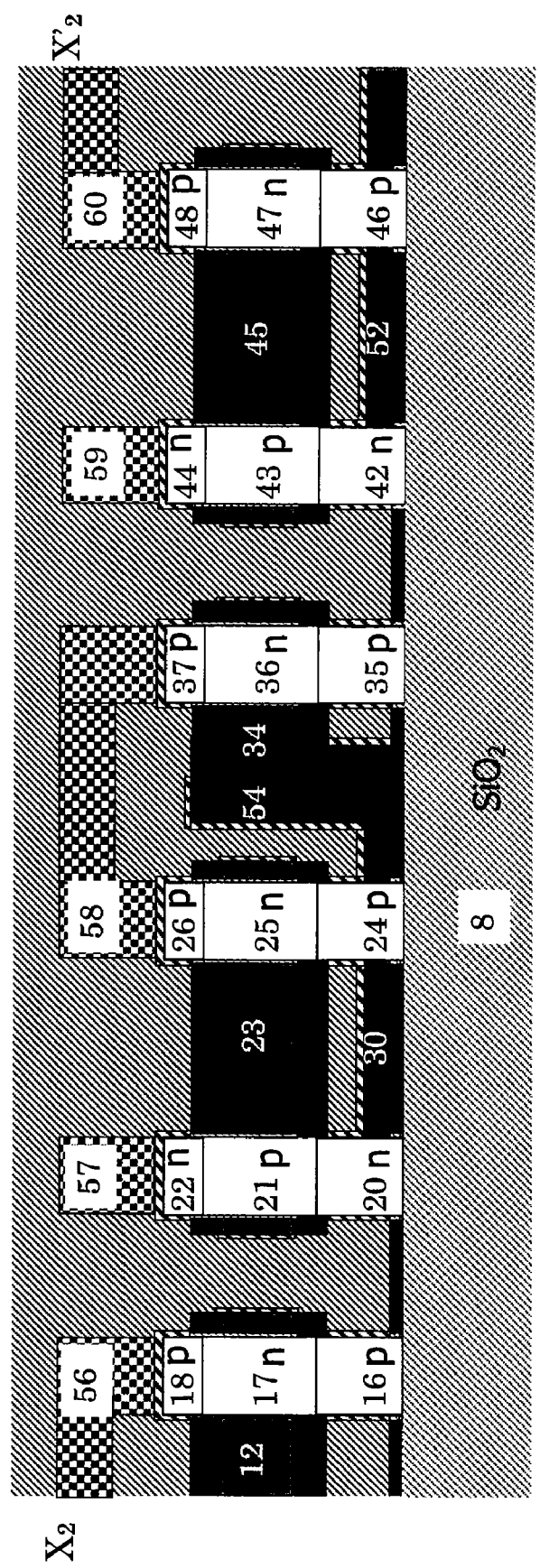
FIG. 5 is a sectional view of the semiconductor device according to the first embodiment, taken along the line $X_2$-$X'_2$ in FIG. 3.
Figure 6:
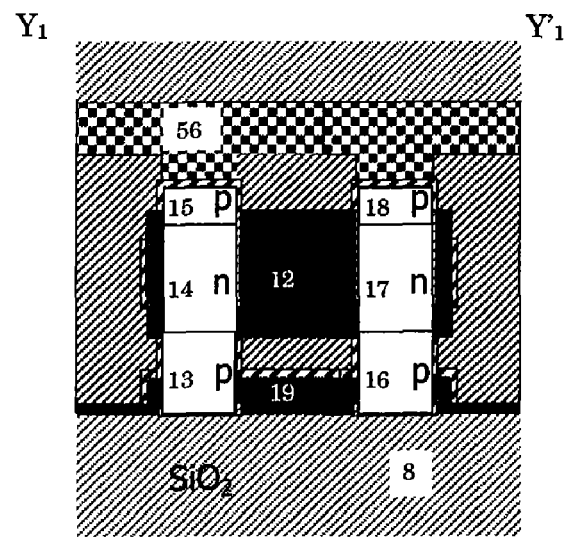
FIG. 6 is a sectional view of the semiconductor device according to the first embodiment, taken along the line $Y_1$-$Y'_1$ in FIG. 3.
Figure 7:
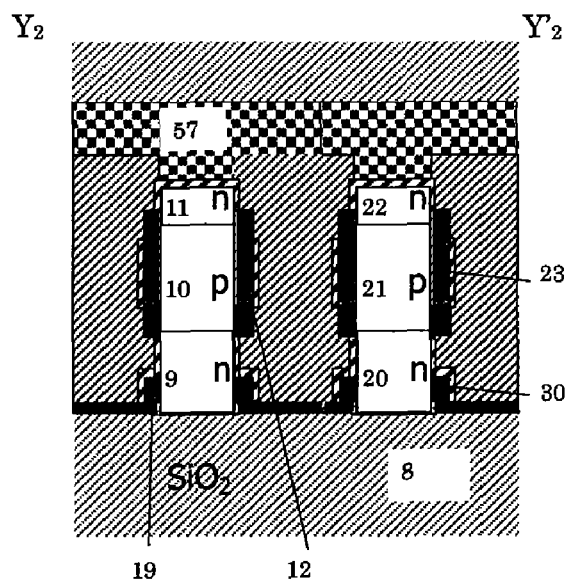
FIG. 7 is a sectional view of the semiconductor device according to the first embodiment, taken along the line $Y_2$-$Y'_2$ in FIG. 3.
Figure 8:
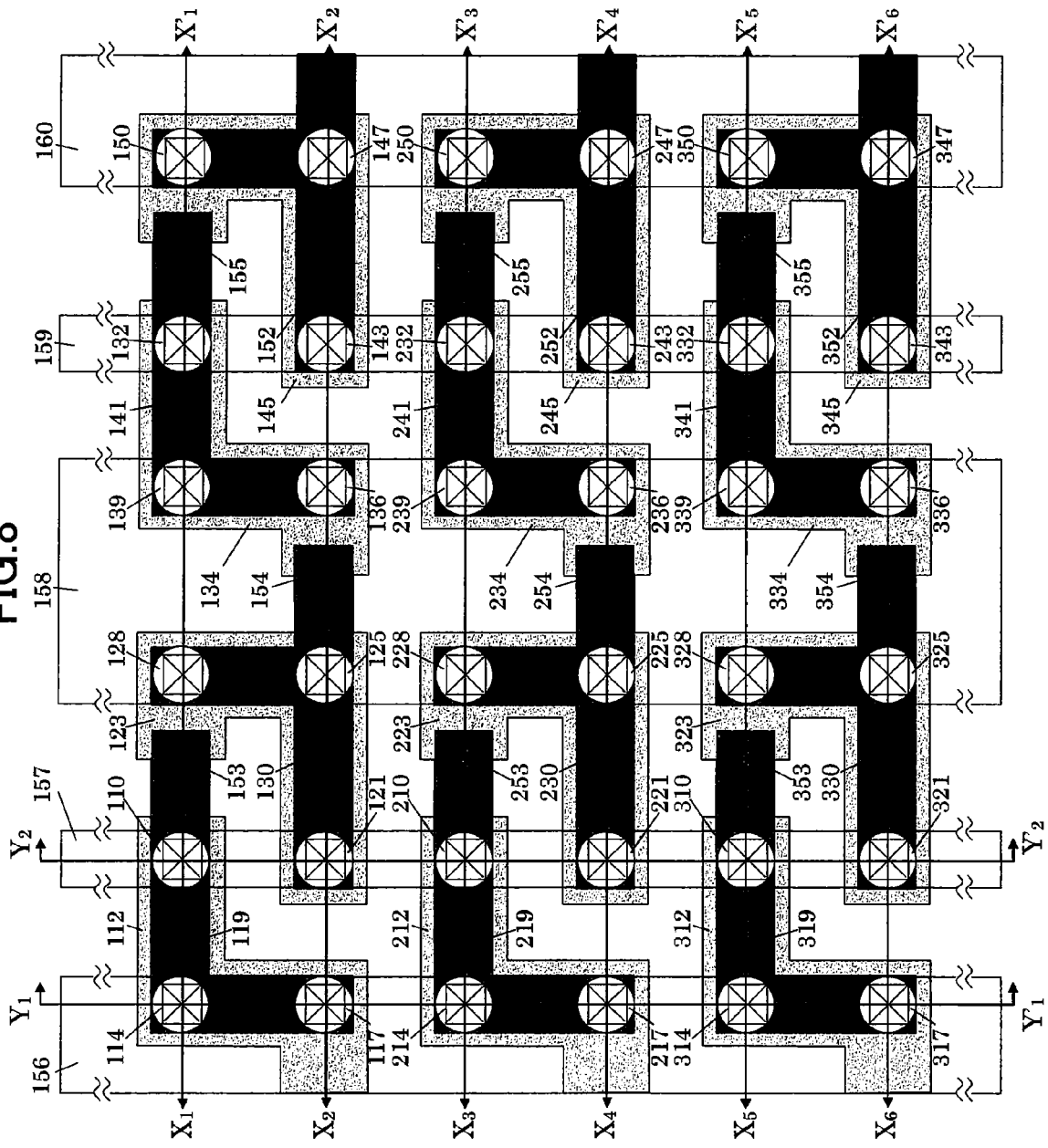
FIG. 8 is a layout diagram of a semiconductor device according to a second embodiment of the present invention.

Alternatively, the CMOS inverters may be arranged in a multi-row by multi-column array, as shown in FIG. 8.

FIG. 8 shows a CMOS inverter cascade circuit according to a second embodiment of the present invention, wherein the CMOS inverters are arranged in a three-row by four-column array.

Figure 9:
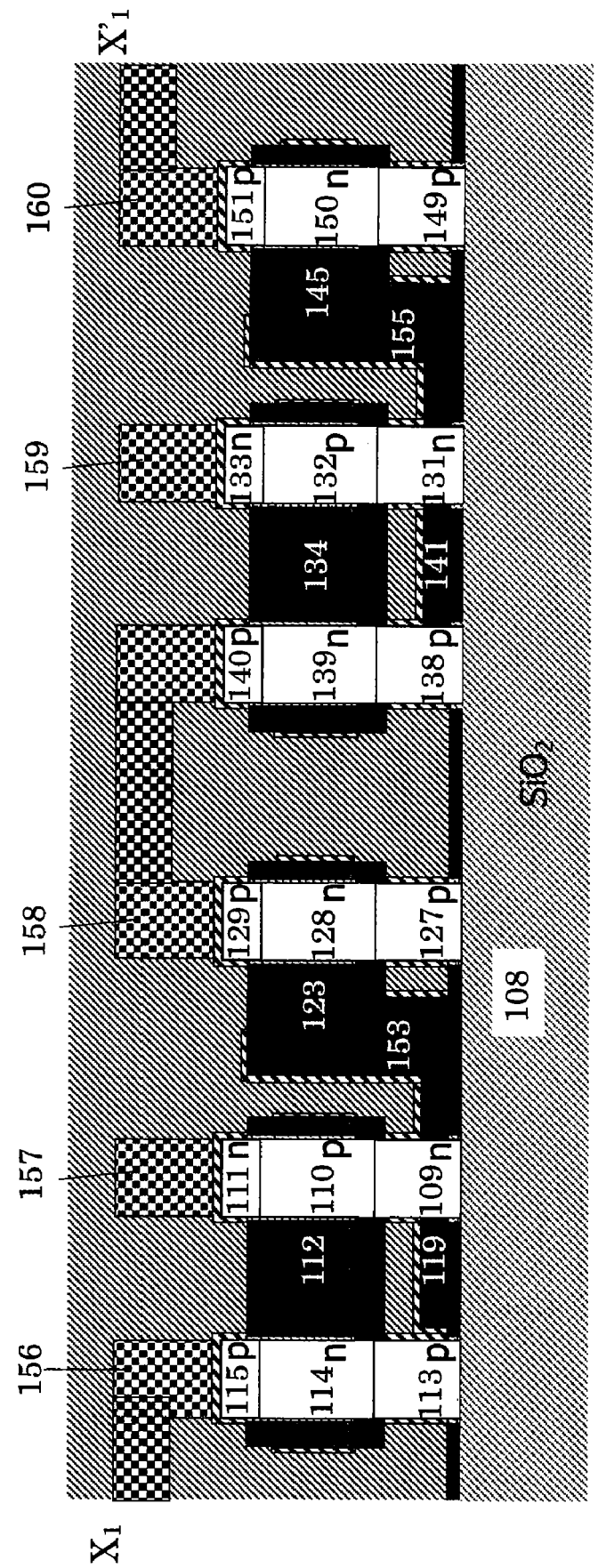
FIG. 9 is a sectional view of the semiconductor device according to the second embodiment, taken along the line $X_1$-$X'_1$ in FIG. 8.
Figure 10:
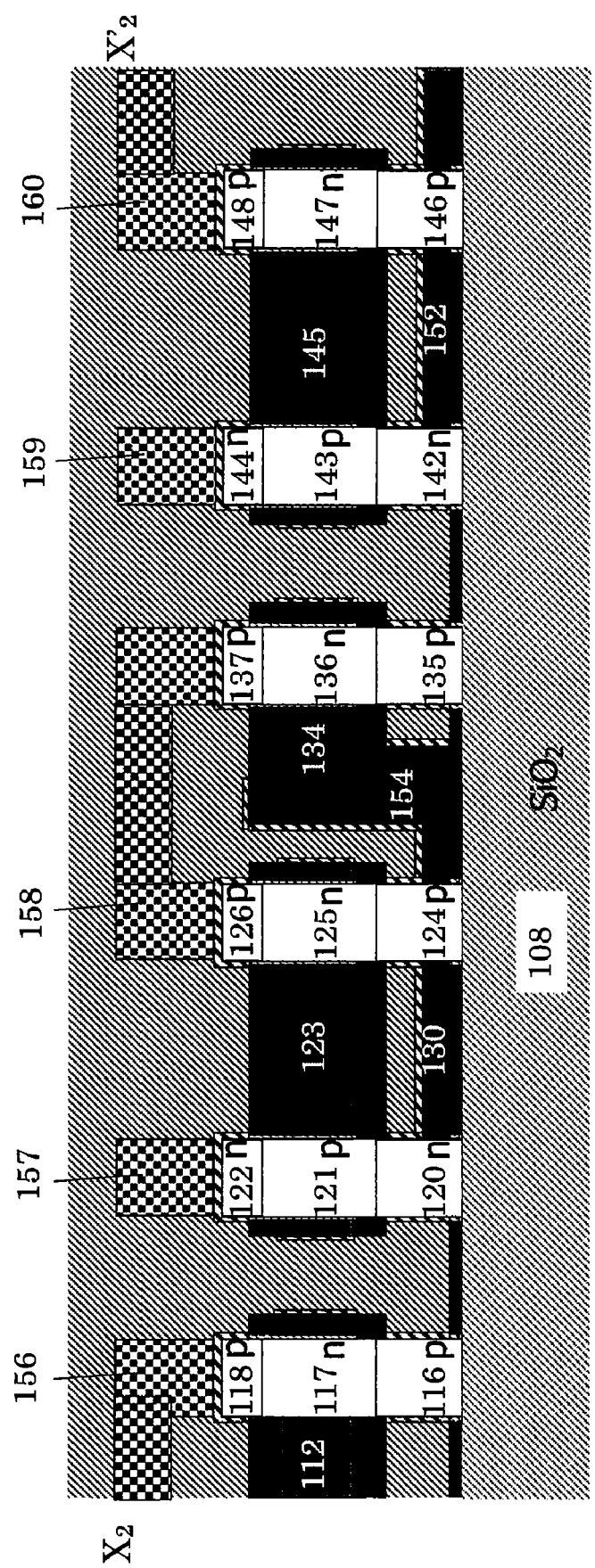
FIG. 10 is a sectional view of the semiconductor device according to the second embodiment, taken along the line $X_2$-$X'_2$ in FIG. 8.
Figure 11:
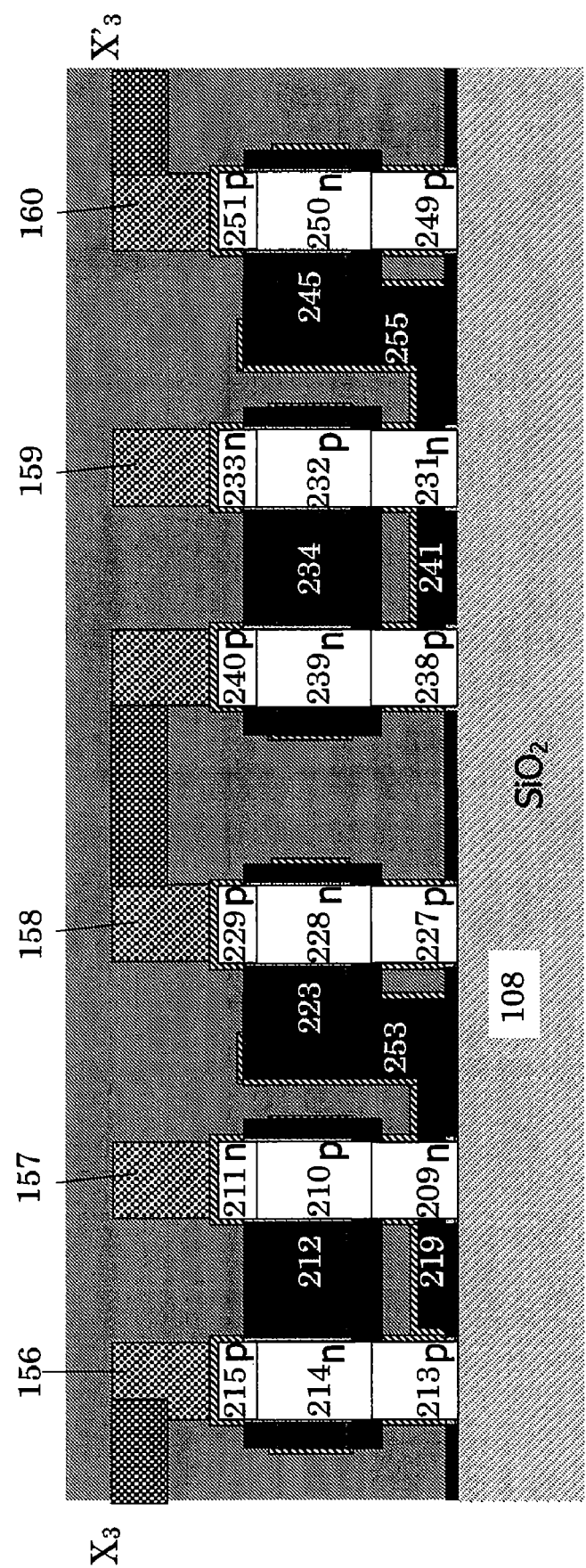
FIG. 11 is a sectional view of the semiconductor device according to the second embodiment, taken along the line $X_3$-$X'_3$ in FIG. 8.
Figure 12:
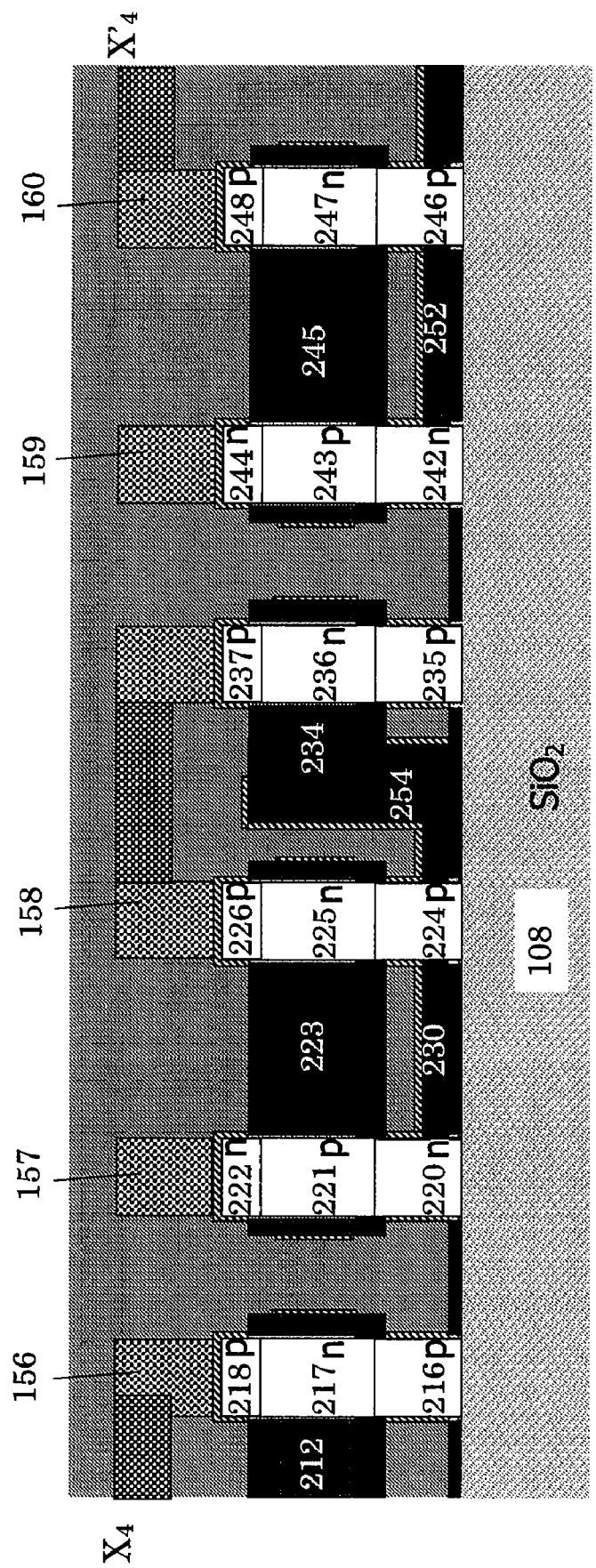
FIG. 12 is a sectional view of the semiconductor device according to the second embodiment, taken along the line $X_4$-$X'_4$ in FIG. 8.
Figure 13:
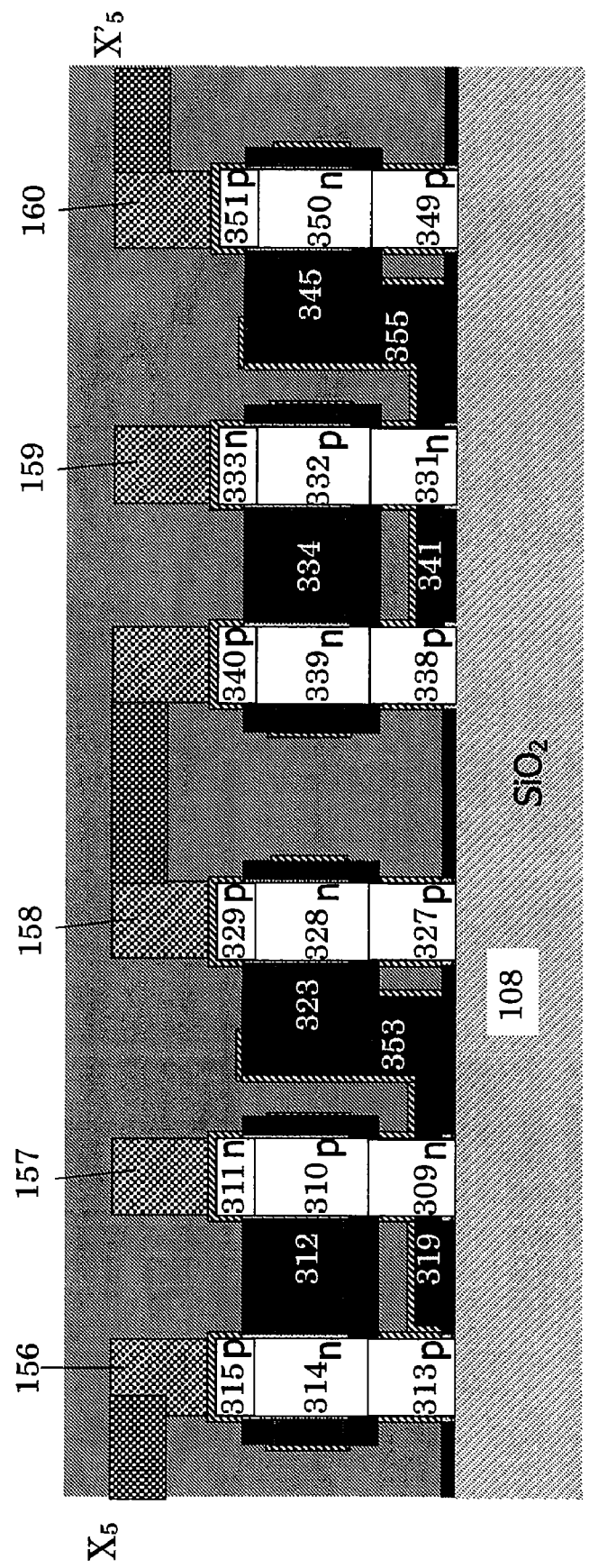
FIG. 13 is a sectional view of the semiconductor device according to the second embodiment, taken along the line $X_5$-$X'_5$ in FIG. 8.
Figure 14:
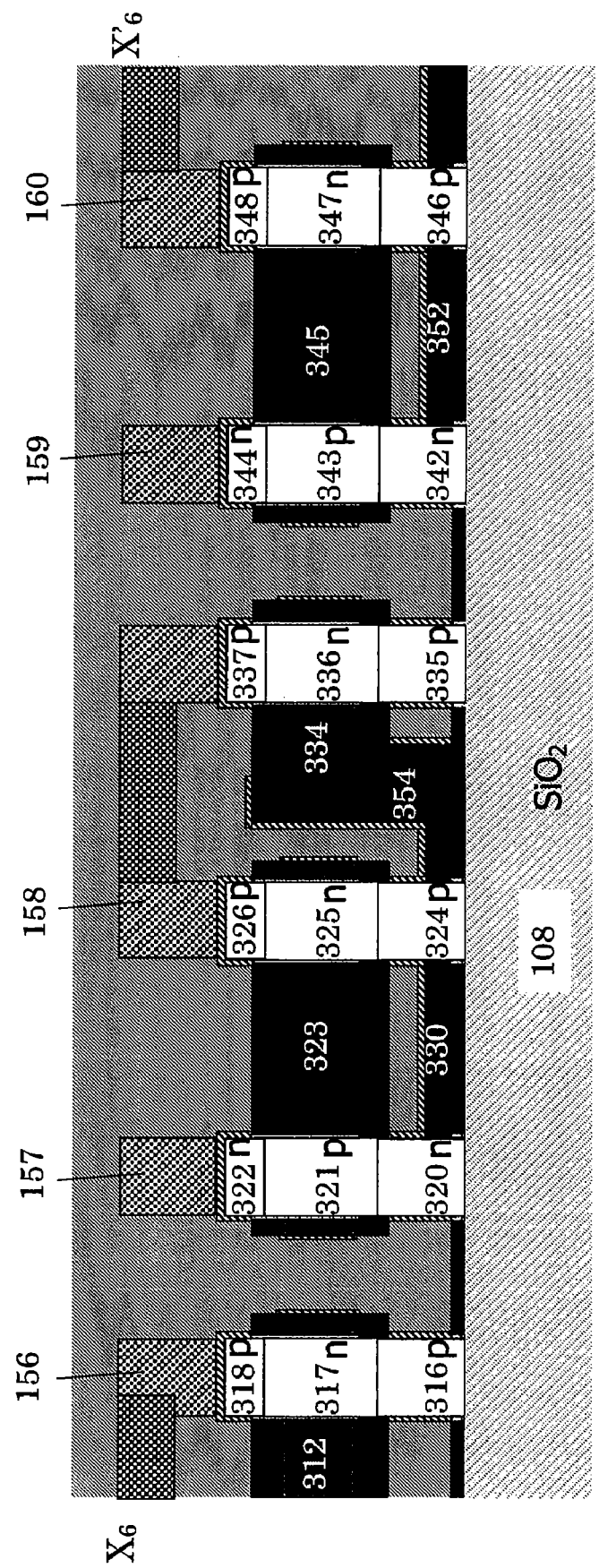
FIG. 14 is a sectional view of the semiconductor device according to the second embodiment, taken along the line $X_6$-$X'_6$ in FIG. 8.
Figure 15:
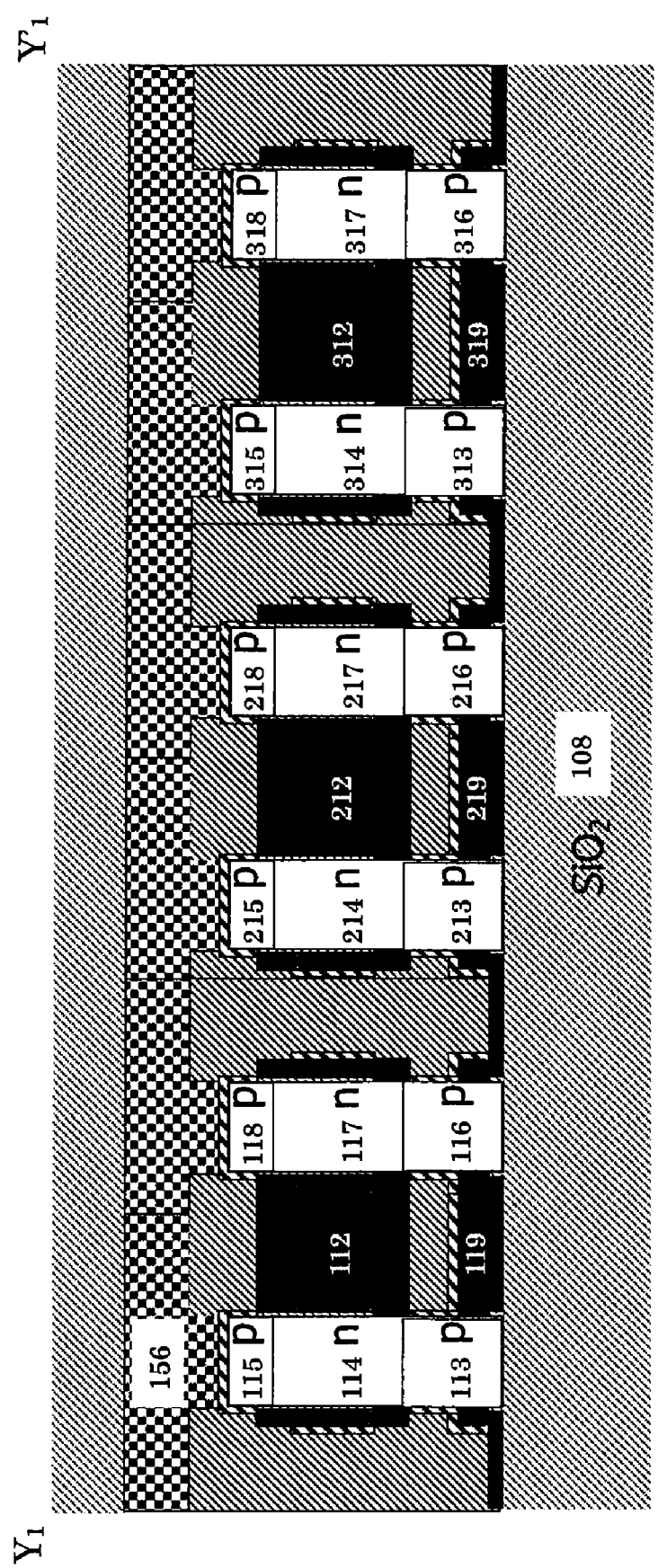
FIG. 15 is a sectional view of the semiconductor device according to the second embodiment, taken along the line $Y_1$-$Y'_1$ in FIG. 8.
Figure 16:
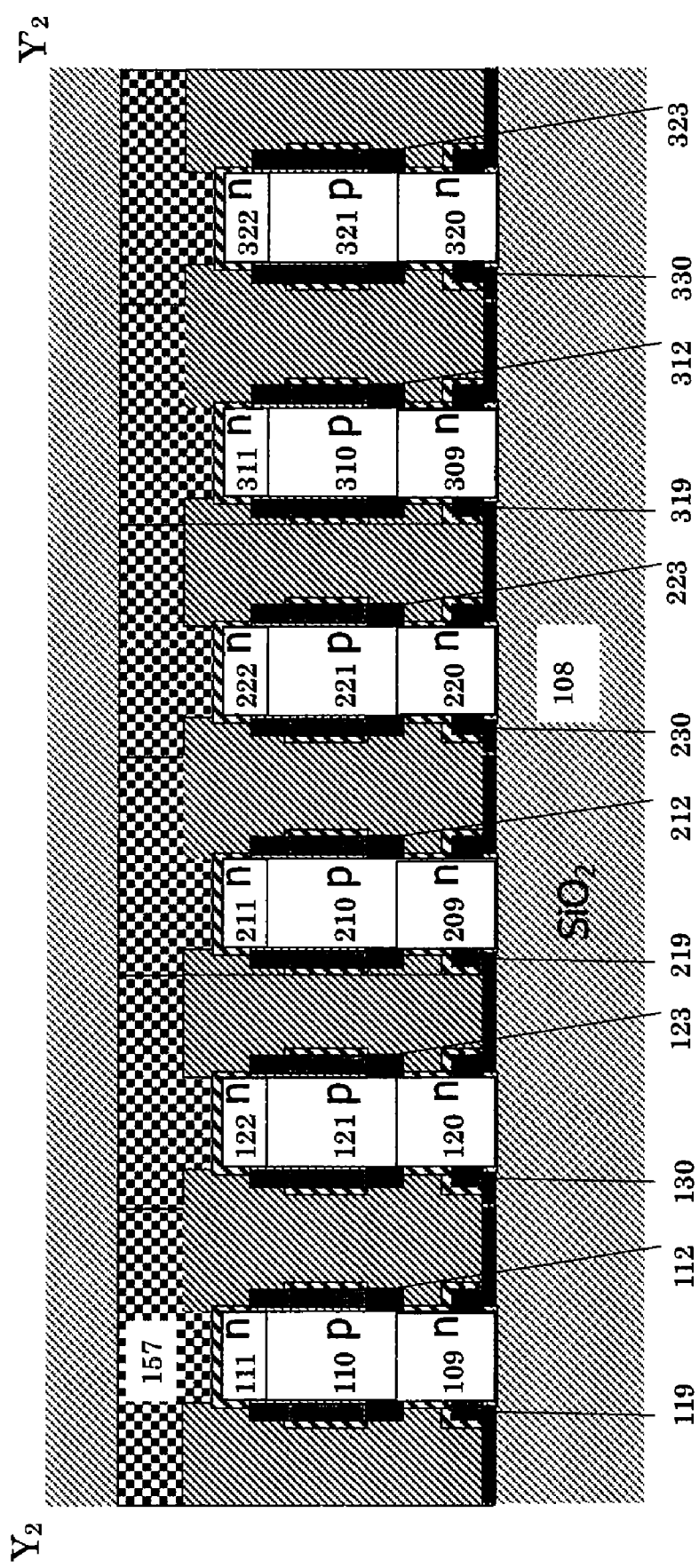
FIG. 16 is a sectional view of the semiconductor device according to the second embodiment, taken along the line $Y_2$-$Y'_2$ in FIG. 8.

FIG. 9 is a sectional view taken along the line $X_1$-$X'_1$ in FIG. 8, and FIG. 10 is a sectional view taken along the line $X_2$-$X'_2$ in FIG. 8. FIG. 11 is a sectional view taken along the line $X_3$-$X'_3$ in FIG. 11, and FIG. 12 is a sectional view taken along the line $X_4$-$X'_4$ in FIG. 8. FIG. 13 is a sectional view taken along the line $X_5$-$X'_5$ in FIG. 8, and FIG. 14 is a sectional view taken along the line $X_6$-$X'_6$ in FIG. 8. FIG. 15 is a sectional view taken along the line $Y_1$-$Y'_1$ in FIG. 8, and FIG. 16 is a sectional view taken along the line $Y_2$-$Y'_2$ in FIG. 8.

In the second embodiment, one n-channel semiconductor device is arranged at an intersection of the 1st row and the 2nd column, wherein the n-channel semiconductor device comprises: an output terminal line 119 based on an island-shaped semiconductor lower layer (island-shaped semiconductor lower layer-based line 119), and a drain diffusion layer 109, each formed on a silicon oxide film 108 of a substrate; an island-shaped semiconductor layer 110 formed on the drain diffusion layer 109; a source diffusion layer 111 formed on top of the island-shaped semiconductor layer 110; and a gate 112 formed on a channel region of a sidewall of the island-shaped semiconductor layer 110 sandwiched between the drain diffusion layer 109 and the source diffusion layer 111, through a gate dielectric film.

One of two p-channel semiconductor devices is arranged at an intersection of the 1st row and the 1st column, wherein the p-channel semiconductor device comprises: the island-shaped semiconductor lower layer-based line 119 and a drain diffusion layer 113 each formed on the silicon oxide film 108; an island-shaped semiconductor layer 114 formed on the drain diffusion layer 113; a source diffusion layer 115 formed on top of the island-shaped semiconductor layer 114; and the gate 112 formed on a channel region of a sidewall of the island-shaped semiconductor layer 114 sandwiched between the drain diffusion layer 113 and the source diffusion layer 115, through a gate dielectric film. The other p-channel semiconductor device is arranged at an intersection of the 2nd row and the 1st column, wherein the p-channel semiconductor device comprises: the island-shaped semiconductor lower layer-based line 119 and a drain diffusion layer 116 each formed on the silicon oxide film 108; an island-shaped semiconductor layer 117 formed on the drain diffusion layer 116; a source diffusion layer 118 formed on top of the island-shaped semiconductor layer 117; and the gate 112 formed on a channel region of a sidewall of the island-shaped semiconductor layer 117 sandwiched between the drain diffusion layer 116 and the source diffusion layer 118, through a gate dielectric film.

In this manner, the two p-channel semiconductor devices and the one re-channel semiconductor device make up an inverter at an intersection of the 1st row and the 1st column in the three-row by four-column array (1st-row/1st column inverter).

Further, one n-channel semiconductor device is arranged at an intersection of the 2nd row and the 2nd column, wherein the n-channel semiconductor device comprises: an output terminal line 130 based on an island-shaped semiconductor lower layer (island-shaped semiconductor lower layer-based line 130), and a drain diffusion layer 120, each formed on the silicon oxide film 108; an island-shaped semiconductor layer 121 formed on the drain diffusion layer 120; a source diffusion layer 122 formed on top of the island-shaped semiconductor layer 121; and a gate 123 formed on a channel region of a sidewall of the island-shaped semiconductor layer 121 sandwiched between the drain diffusion layer 120 and the source diffusion layer 122, through a gate dielectric film.

One of two p-channel semiconductor devices is arranged at an intersection of the 1st row and the 3rd column, wherein the p-channel semiconductor device comprises: the island-shaped semiconductor lower layer-based line 130 and a drain diffusion layer 127 each formed on the silicon oxide film 108; an island-shaped semiconductor layer 128 formed on the drain diffusion layer 127; a source diffusion layer 129 formed on top of the island-shaped semiconductor layer 128; and the gate 123 formed on to a channel region of a sidewall of the island-shaped semiconductor layer 128 sandwiched between the drain diffusion layer 127 and the source diffusion layer 129, through a gate dielectric film. The other p-channel semiconductor device is arranged at an intersection of the 2nd row and the 3rd column, wherein the p-channel semiconductor device comprises: the island-shaped semiconductor lower layer-based line 130 and a drain diffusion layer 124 each formed on the silicon oxide film 108; an island-shaped semiconductor layer 125 formed on the drain diffusion layer 124; a source diffusion layer 126 formed on top of the island-shaped semiconductor layer 125; and the gate 123 formed on a channel region of a sidewall of the island-shaped semiconductor layer 125 sandwiched between the drain diffusion layer 124 and the source diffusion layer 125, through a gate dielectric film.

In this manner, the two p-channel semiconductor devices and the one n-channel semiconductor device make up an inverter at an intersection of the 1st row and the 2nd column in the three-row by four-column array (1st-row/2nd-column inverter).

Further, one n-channel semiconductor device is arranged at an intersection of the 1st row and the 5th column, wherein the n-channel semiconductor device comprises: an output terminal line 141 based on an island-shaped semiconductor lower layer (island-shaped semiconductor lower layer-based line 141), and a drain diffusion layer 131, each formed on the silicon oxide film 108; an island-shaped semiconductor layer 132 formed on the drain diffusion layer 131; a source diffusion layer 133 formed on top of the island-shaped semiconductor layer 132; and a gate 134 formed on a channel region of a sidewall of the island-shaped semiconductor layer 132 sandwiched between the drain diffusion layer 131 and the source diffusion layer 133, through a gate dielectric film.

One of two p-channel semiconductor devices is arranged at an intersection of the 1st row and the 4th column, wherein the p-channel semiconductor device comprises: the island-shaped semiconductor lower layer-based line 141 and a drain diffusion layer 138, each formed on the silicon oxide film 108; an island-shaped semiconductor layer 139 formed on the drain diffusion layer 138; a source diffusion layer 140 formed on top of the island-shaped semiconductor layer 139; and the gate 134 formed on a channel region of a sidewall of the island-shaped semiconductor layer 139 sandwiched between the drain diffusion layer 138 and the source diffusion layer 140, through a gate dielectric film. The other p-channel semiconductor device is arranged at an intersection of the 2nd row and the 4th column, wherein p-channel semiconductor device comprises: the island-shaped semiconductor lower layer-based line 141 and a drain diffusion layer 135 each formed on the silicon oxide film 108; an island-shaped semiconductor layer 136 formed on the drain diffusion layer 135; a source diffusion layer 137 formed on top of the island-shaped semiconductor layer 136; and the gate 134 formed on a channel region of a sidewall of the island-shaped semiconductor layer 136 sandwiched between the drain diffusion layer 135 and the source diffusion layer 137, through a gate dielectric film.

In this manner, the two p-channel semiconductor devices and the one re-channel semiconductor device make up an inverter at an intersection of the 1st row and the 3rd column in the three-row by four-column array (1st-row/3rd-column inverter).

Further, one n-channel semiconductor device is arranged at an intersection of the 2nd row and the 5th column, wherein the n-channel semiconductor device comprises: an output terminal line 152 based on an island-shaped semiconductor lower layer (island-shaped semiconductor lower layer-based line 152), and a drain diffusion layer 142, each formed on the silicon oxide film 108; an island-shaped semiconductor layer 143 formed on the drain diffusion layer 142; a source diffusion layer 144 formed on top of the island-shaped semiconductor layer 143; and a gate 145 formed on a channel region of a sidewall of the island-shaped semiconductor layer 143 sandwiched between the drain diffusion layer 142 and the source diffusion layer 144, through a gate dielectric film.

One of two p-channel semiconductor device is arranged at an intersection of the 1st row and the 6th column, wherein the p-channel semiconductor device comprises: the island-shaped semiconductor lower layer-based line 152 and a drain diffusion layer 149 each formed on the silicon oxide film 108; an island-shaped semiconductor layer 150 formed on the drain diffusion layer 149; a source diffusion layer 151 formed on top of the island-shaped semiconductor layer 150; and the gate 145 formed on a channel region of a sidewall of the island-shaped semiconductor layer 150 sandwiched between the drain diffusion layer 149 and the source diffusion layer 151, through a gate dielectric film. The other p-channel semiconductor device is arranged at an intersection of the 2nd row and the 6th column, wherein the p-channel semiconductor device comprises: the island-shaped semiconductor lower layer-based line 152 and a drain diffusion layer 146 each formed on the silicon oxide film 108; an island-shaped semiconductor layer 147 formed on the drain diffusion layer 146; a source diffusion layer 148 formed on top of the island-shaped semiconductor layer 147; and the gate 145 formed on a channel region of a sidewall of the island-shaped semiconductor layer 147 sandwiched between the drain diffusion layer 146 and the source diffusion layer 148, through a gate dielectric film.

In this manner, the two p-channel semiconductor devices and the one re-channel semiconductor device make up an inverter at an intersection of the 1st row and the 4th column in the three-row by four-column array (1st-row/4th-column inverter).

A first power supply line Vssl 157 as a Vss line is formed on the source diffusion layers 111, 122 of the two n-channel semiconductor devices of the 1st-row/1st-column and 1st-row/2nd-column inverters, and a first power supply line Vssl 159 as a Vss line is formed on the source diffusion layers 133, 144 of the two n-channel semiconductor devices of the 1st-row/3rd-column and 1st-row/4th-column inverters. Further, a second power supply line Vccl 156 as a Vcc line is formed on the source diffusion layers 115, 118 of the two p-channel semiconductor devices of the 1st-row/1st-column inverter. A second power supply line Vccl 158 as a Vcc line is formed on the source diffusion layers 129, 126, 140, 137 of the four p-channel semiconductor devices of the 1st-row/2nd-column and 1st-row/3rd-column inverters, and a second power supply line Vccl 160 as a Vcc line is formed on the source diffusion layers 148, 151 of the two p-channel semiconductor devices of the 1st-row/4th-column inverter.

The gate 112 serves as an input terminal line of the 1st-row/1st-column inverter.

The gate 123 serves as an input terminal line of the 1st-row/2nd-column inverter.

The gate 134 serves as an input terminal line of the 1st-row/3rd-column inverter.

The gate 145 serves as an input terminal line of the 1st-row/4th-column inverter.

A contact 153 is formed to connect the gate 123 and the island-shaped semiconductor lower layer-based output terminal line 119 of the 1st-row/1st-column inverter.

A contact 154 is formed to connect the gate 134 and the island-shaped semiconductor lower layer-based output terminal line 130 of the 1st-row/2nd-column inverter.

A contact 155 is formed to connect the gate 145 and the island-shaped semiconductor lower layer-based output terminal line 141 of the 1st-row/3rd-column inverter.

Further, one n-channel semiconductor device is arranged at an intersection of the 3rd row and the 2nd column, wherein the n-channel semiconductor device comprises: an output terminal line 219 based on an island-shaped semiconductor lower layer (island-shaped semiconductor lower layer-based line 219), and a drain diffusion layer 209, each formed on the silicon oxide film 108; an island-shaped semiconductor layer 210 formed on the drain diffusion layer 209; a source diffusion layer 211 formed on top of the island-shaped semiconductor layer 210; and a gate 212 formed on a channel region of a sidewall of the island-shaped semiconductor layer 210 sandwiched between the drain diffusion layer 209 and the source diffusion layer 211, through a gate dielectric film.

One on two p-channel semiconductor devices is at an intersection of the 3rd row and the 1st column, wherein the p-channel semiconductor device comprises: the island-shaped semiconductor lower layer-based line 219 and a drain diffusion layer 213 each formed on the silicon oxide film 108; an island-shaped semiconductor layer 214 formed on the drain diffusion layer 213; a source diffusion layer 215 formed on top of the island-shaped semiconductor layer 214; and the gate 212 formed on a channel region of a sidewall of the island-shaped semiconductor layer 214 sandwiched between the drain diffusion layer 213 and the source diffusion layer 215, through a gate dielectric film. The other p-channel semiconductor device is arranged at an intersection of the fourth row and the 1st column, wherein the p-channel semiconductor device comprises: the island-shaped semiconductor lower layer-based line 219 and a drain diffusion layer 216 each formed on the silicon oxide film 108; an island-shaped semiconductor layer 217 formed on the drain diffusion layer 216; a source diffusion layer 218 formed on top of the island-shaped semiconductor layer 217; and the gate 212 formed on a channel region of a sidewall of the island-shaped semiconductor layer 217 sandwiched between the drain diffusion layer 216 and the source diffusion layer 218, through a gate dielectric film.

In this manner, the two p-channel semiconductor devices and the one n-channel semiconductor device make up an inverter at an intersection of the 2nd row and the 1st column in the three-row by four-column array (2nd-row/1st-column inverter).

Further, one n-channel semiconductor device is arranged at an intersection of the 4th row and the 2nd column, wherein the n-channel semiconductor device comprises: an output terminal line 230 based on an island-shaped semiconductor lower layer (island-shaped semiconductor lower layer-based line 230), and a drain diffusion layer 220, each formed on the silicon oxide film 108; an island-shaped semiconductor layer 221 formed on the drain diffusion layer 220; a source diffusion layer 222 formed on top of the island-shaped semiconductor layer 221; and a gate 223 formed on a channel region of a sidewall of the island-shaped semiconductor layer 221 sandwiched between the drain diffusion layer 220 and the source diffusion layer 222, through a gate dielectric film.

One of two p-channel semiconductor devices is at an intersection of the 3rd row and the 3rd column, wherein the p-channel semiconductor device comprises: the island-shaped semiconductor lower layer-based line 230 and a drain diffusion layer 227 each formed on the silicon oxide film 108; an island-shaped semiconductor layer 228 formed on the drain diffusion layer 227; a source diffusion layer 229 formed on top of the island-shaped semiconductor layer 228; and the gate 223 formed on to a channel region of a sidewall of the island-shaped semiconductor layer 228 sandwiched between the drain diffusion layer 227 and the source diffusion layer 229, through a gate dielectric film. The other p-channel semiconductor device is arranged at an intersection of the 4th row and the 3rd column, wherein the p-channel semiconductor device comprises: the island-shaped semiconductor lower layer-based line 230 and a drain diffusion layer 224 each formed on the silicon oxide film 108; an island-shaped semiconductor layer 225 formed on the drain diffusion layer 224; a source diffusion layer 226 formed on top of the island-shaped semiconductor layer 225; and the gate 223 formed on a channel region of a sidewall of the island-shaped semiconductor layer 225 sandwiched between the drain diffusion layer 224 and the source diffusion layer 225, through a gate dielectric film.

In this manner, the two p-channel semiconductor devices and the one re-channel semiconductor device make up an inverter at an intersection of the 2nd row and the 2nd column in the three-row by four-column array (2nd-row/2nd-column inverter).

Further, one n-channel semiconductor device is arranged at an intersection of the 3rd row and the 5th column, wherein the n-channel semiconductor device comprises: an output terminal line 241 based on an island-shaped semiconductor lower layer (island-shaped semiconductor lower layer-based line 241), and a drain diffusion layer 231, each formed on the silicon oxide film 108; an island-shaped semiconductor layer 232 formed on the drain diffusion layer 231; a source diffusion layer 233 formed on top of the island-shaped semiconductor layer 232; and a gate 234 formed on a channel region of a sidewall of the island-shaped semiconductor layer 232 sandwiched between the drain diffusion layer 231 and the source diffusion layer 233, through a gate dielectric film.

One of two p-channel semiconductor devices is arranged at an intersection of the 3rd row and the 4th column, wherein the p-channel semiconductor device comprises: the island-shaped semiconductor lower layer-based line 241 and a drain diffusion layer 238 each formed on the silicon oxide film 108; an island-shaped semiconductor layer 239 formed on the drain diffusion layer 238; a source diffusion layer 240 formed on top of the island-shaped semiconductor layer 239; and the gate 234 formed on a channel region of a sidewall of the island-shaped semiconductor layer 239 sandwiched between the drain diffusion layer 238 and the source diffusion layer 240, through a gate dielectric film. The other p-channel semiconductor device is arranged at an intersection of the 4th row and the 4th column, wherein the p-channel semiconductor device comprises: the island-shaped semiconductor lower layer-based line 241 and a drain diffusion layer 235 each formed on the silicon oxide film 108; an island-shaped semiconductor layer 236 formed on the drain diffusion layer 235; a source diffusion layer 237 formed on top of the island-shaped semiconductor layer 236; and the gate 234 formed on a channel region of a sidewall of the island-shaped semiconductor layer 236 sandwiched between the drain diffusion layer 235 and the source diffusion layer 237, through a gate dielectric film.

In this manner, the two p-channel semiconductor devices and the one re-channel semiconductor device make up an inverter at an intersection of the 2nd row and the 3rd column in the three-row by four-column array (2nd-row/3rd-column inverter).

Further, one n-channel semiconductor device is arranged at an intersection of the 4th row and the 5th column, wherein the n-channel semiconductor device comprises: an output terminal line 252 based on an island-shaped semiconductor lower layer (island-shaped semiconductor lower layer-based line 252), and a drain diffusion layer 242, each formed on the silicon oxide film 108; an island-shaped semiconductor layer 243 formed on the drain diffusion layer 242; a source diffusion layer 244 formed on top of the island-shaped semiconductor layer 243; and a gate 245 formed on a channel region of a sidewall of the island-shaped semiconductor layer 243 sandwiched between the drain diffusion layer 242 and the source diffusion layer 244, through a gate dielectric film.

One of two p-channel semiconductor devices is arranged at an intersection of the 3rd row and the 6th column, wherein the p-channel semiconductor device comprises: the island-shaped semiconductor lower layer-based line 252 and a drain diffusion layer 249 each formed on the silicon oxide film 108; an island-shaped semiconductor layer 250 formed on the drain diffusion layer 249; a source diffusion layer 251 formed on top of the island-shaped semiconductor layer 250; and the gate 245 formed on a channel region of a sidewall of the island-shaped semiconductor layer 250 sandwiched between the drain diffusion layer 249 and the source diffusion layer 251, through a gate dielectric film. The other p-channel semiconductor device is arranged at an intersection of the 4th row and the 6th column, wherein the p-channel semiconductor device comprises: the island-shaped semiconductor lower layer-based line 252 and a drain diffusion layer 246 each formed on the silicon oxide film 108; an island-shaped semiconductor layer 247 formed on the drain diffusion layer 246; a source diffusion layer 248 formed on top of the island-shaped semiconductor layer 247; and the gate 245 formed on a channel region of a sidewall of the island-shaped semiconductor layer 247 sandwiched between the drain diffusion layer 246 and the source diffusion layer 248, through a gate dielectric film.

In this manner, the two p-channel semiconductor devices and the one n-channel semiconductor device make up an inverter at an intersection of the 2nd row and the 4th column in the three-row by four-column array (2nd-row/4th-column inverter).

The first power supply line Vssl 157 is formed on the source diffusion layers 211, 222 of the two n-channel semiconductor devices of the 2nd-row/1st-column and 2nd-row/

2nd-column inverters, and the first power supply line Vssl 159 is formed on the source diffusion layers 233, 244 of the two n-channel semiconductor devices of the 2nd-row/3rd-column and 2nd-row/4th-column inverters. Further, the second power supply line Vccl 156 is formed on the source diffusion layers 215, 218 of the two p-channel semiconductor devices of the 2nd-row/1st-column inverter. The second power supply line Vccl 158 is formed on the source diffusion layers 229, 226, 240, 237 of the four p-channel semiconductor devices of the 2nd-row/2nd-column and 2nd-row/3rd-column inverters, and the second power supply line Vccl 160 is formed on the source diffusion layers 248, 251 of the two p-channel semiconductor devices of the 2nd-row/4th-column inverter.

The gate 212 serves as an input terminal line of the 2nd-row/1st-column inverter.

The gate 223 serves as an input terminal line of the 2nd-row/2nd-column inverter.

The gate 234 serves as an input terminal line of the 2nd-row/3rd-column inverter.

The gate 245 serves as an input terminal line of the 2nd-row/4th-column inverter.

A contact 253 is formed to connect the gate 223 and the island-shaped semiconductor lower layer-based output terminal line 219 of the 2nd-row/1st-column inverter.

A contact 254 is formed to connect the gate 234 and the island-shaped semiconductor lower layer-based output terminal line 230 of the 2nd-row/2nd-column inverter.

A contact 255 is formed to connect the gate 245 and the island-shaped semiconductor lower layer-based output terminal line 241 of the 2nd-row/3rd-column inverter.

Further, one n-channel semiconductor device is arranged at an intersection of the 5th row and the 2nd column, wherein the n-channel semiconductor device comprises: an output terminal line 319 based on an island-shaped semiconductor lower layer (island-shaped semiconductor lower layer-based line 319), and a drain diffusion layer 309, each formed on the silicon oxide film 108; an island-shaped semiconductor layer 310 formed on the drain diffusion layer 309; a source diffusion layer 311 formed on top of the island-shaped semiconductor layer 310; and a gate 312 formed on a channel region of a sidewall of the island-shaped semiconductor layer 310 sandwiched between the drain diffusion layer 309 and the source diffusion layer 311, through a gate dielectric film.

One of two p-channel semiconductor devices is arranged at an intersection of the 5th row and the 1st column, wherein the p-channel semiconductor device comprises: the island-shaped semiconductor lower layer-based line 319 and a drain diffusion layer 313 each formed on the silicon oxide film 108; an island-shaped semiconductor layer 314 formed on the drain diffusion layer 313; a source diffusion layer 315 formed on top of the island-shaped semiconductor layer 314; and the gate 312 formed on a channel region of a sidewall of the island-shaped semiconductor layer 314 sandwiched between the drain diffusion layer 313 and the source diffusion layer 315, through a gate dielectric film. The other p-channel semiconductor device is arranged at an intersection of the 6th row and the 1st column, wherein the p-channel semiconductor device comprises: the island-shaped semiconductor lower layer-based line 319 and a drain diffusion layer 316 each formed on the silicon oxide film 108; an island-shaped semiconductor layer 317 formed on the drain diffusion layer 316; a source diffusion layer 318 formed on top of the island-shaped semiconductor layer 317; and the gate 312 formed on a channel region of a sidewall of the island-shaped semiconductor layer 317 sandwiched between the drain diffusion layer 316 and the source diffusion layer 318, through a gate dielectric film.

In this manner, the two p-channel semiconductor devices and the one n-channel semiconductor device make up an inverter at an intersection of the 3rd row and the 1st column in the three-row by four-column array (3rd-row/1st-column inverter).

Further, one n-channel semiconductor device is arranged at an intersection of the 6th row and the 2nd column, wherein the n-channel semiconductor device comprises: an output terminal line 330 based on an island-shaped semiconductor lower layer (island-shaped semiconductor lower layer-based line 330), and a drain diffusion layer 320, each formed on the silicon oxide film 108; an island-shaped semiconductor layer 321 formed on the drain diffusion layer 320; a source diffusion layer 322 formed on top of the island-shaped semiconductor layer 321; and a gate 323 formed on a channel region of a sidewall of the island-shaped semiconductor layer 321 sandwiched between the drain diffusion layer 320 and the source diffusion layer 322, through a gate dielectric film.

One of two p-channel semiconductor devices is arranged at an intersection of the 5th row and the 3rd column, wherein the p-channel semiconductor device comprises: the island-shaped semiconductor lower layer-based line 330 and a drain diffusion layer 327 each formed on the silicon oxide film 108; an island-shaped semiconductor layer 328 formed on the drain diffusion layer 327; a source diffusion layer 329 formed on top of the island-shaped semiconductor layer 328; and the gate 323 formed on to a channel region of a sidewall of the island-shaped semiconductor layer 328 sandwiched between the drain diffusion layer 327 and the source diffusion layer 329, through a gate dielectric film. The other p-channel semiconductor device is arranged at an intersection of the 6th row and the 3rd column, wherein the p-channel semiconductor device comprises: the island-shaped semiconductor lower layer-based line 330 and a drain diffusion layer 324 each formed on the silicon oxide film 108; an island-shaped semiconductor layer 325 formed on the drain diffusion layer 324; a source diffusion layer 326 formed on top of the island-shaped semiconductor layer 325; and the gate 323 formed on a channel region of a sidewall of the island-shaped semiconductor layer 325 sandwiched between the drain diffusion layer 324 and the source diffusion layer 325, through a gate dielectric film.

In this manner, the two p-channel semiconductor devices and the one n-channel semiconductor device make up an inverter at an intersection of the 3rd row and the 2nd column in the three-row by four-column array (3rd-row/2nd-column inverter).

Further, one n-channel semiconductor device is arranged at an intersection of the 5th row and the 5th column, wherein the n-channel semiconductor device comprises: an output terminal line 341 based on an island-shaped semiconductor lower layer (island-shaped semiconductor lower layer-based line 341), and a drain diffusion layer 331, each formed on the silicon oxide film 108; an island-shaped semiconductor layer 332 formed on the drain diffusion layer 331; a source diffusion layer 333 formed on top of the island-shaped semiconductor layer 332; and a gate 334 formed on a channel region of a sidewall of the island-shaped semiconductor layer 332 sandwiched between the drain diffusion layer 331 and the source diffusion layer 333, through a gate dielectric film.

One of two p-channel semiconductor devices is arranged at an intersection of the 5th row and the 4th column, wherein the p-channel semiconductor device comprises: the island-shaped semiconductor lower layer-based line 341 and a drain diffusion layer 338 each formed on the silicon oxide film 108; an island-shaped semiconductor layer 339 formed on the drain diffusion layer 338; a source diffusion layer 340 formed on top of the island-shaped semiconductor layer 339; and the gate 334 formed on to a channel region of a sidewall of the island-shaped semiconductor layer 339 sandwiched between the drain diffusion layer 338 and the source diffusion layer 340, through a gate dielectric film. The other p-channel semiconductor device is arranged at an intersection of the 6th row and the 4th column, wherein the p-channel semiconductor device comprises: the island-shaped semiconductor lower layer-based line 341 and a drain diffusion layer 335 each formed on the silicon oxide film 108; an island-shaped semiconductor layer 336 formed on the drain diffusion layer 335; a source diffusion layer 337 formed on top of the island-shaped semiconductor layer 336; and the gate 334 formed on a channel region of a sidewall of the island-shaped semiconductor layer 336 sandwiched between the drain diffusion layer 335 and the source diffusion layer 337, through a gate dielectric film.

In this manner, the two p-channel semiconductor devices and the one n-channel semiconductor device make up an inverter at an intersection of the 3rd row and the 3rd column in the three-row by four-column array (3rd-row/3rd-column inverter).

Further, one n-channel semiconductor device is arranged at an intersection of the 6th row and the 5th column, wherein the n-channel semiconductor device comprises: an output terminal line 352 based on an island-shaped semiconductor lower layer (island-shaped semiconductor lower layer-based line 352), and a drain diffusion layer 342, each formed on the silicon oxide film 108; an island-shaped semiconductor layer 343 formed on the drain diffusion layer 342; a source diffusion layer 344 formed on top of the island-shaped semiconductor layer 343; and a gate 345 formed on a channel region of a sidewall of the island-shaped semiconductor layer 343 sandwiched between the drain diffusion layer 342 and the source diffusion layer 344, through a gate dielectric film.

One of two p-channel semiconductor devices is arranged at an intersection of the 5th row and the 6th column, wherein the p-channel semiconductor device comprises: the island-shaped semiconductor lower layer-based line 352 and a drain diffusion layer 349 each formed on the silicon oxide film 108; an island-shaped semiconductor layer 350 formed on the drain diffusion layer 349; a source diffusion layer 351 formed on top of the island-shaped semiconductor layer 350; and the gate 345 formed on a channel region of a sidewall of the island-shaped semiconductor layer 350 sandwiched between the drain diffusion layer 349 and the source diffusion layer 351, through a gate dielectric film. The other p-channel semiconductor device is arranged at an intersection of the 6th row and the 6th column, wherein the p-channel semiconductor device comprises: the island-shaped semiconductor lower layer-based line 352 and a drain diffusion layer 346 each formed on the silicon oxide film 108; an island-shaped semiconductor layer 347 formed on the drain diffusion layer 346; a source diffusion layer 348 formed on top of the island-shaped semiconductor layer 347; and the gate 345 formed on a channel region of a sidewall of the island-shaped semiconductor layer 347 sandwiched between the drain diffusion layer 346 and the source diffusion layer 348, through a gate dielectric film.

In this manner, the two p-channel semiconductor devices and the one n-channel semiconductor device make up an inverter at an intersection of the 3rd row and the 4th column in the three-row by four-column array (3rd-row/4th-column inverter).

The first power supply line Vssl 157 is formed on the source diffusion layers 311, 322 of the two n-channel semiconductor devices of the 3rd-row/1st-column and 3rd-row/ 2nd-column inverters, and the first power supply line Vssl 159 is formed on the source diffusion layers 333, 344 of the two n-channel semiconductor devices of the 3rd-row/3rd-column and 3rd-row/4th-column inverters. Further, the second power supply line Vccl 156 is formed on the source diffusion layers 315, 318 of the two p-channel semiconductor devices of the 3rd-row/1st-column inverter. The second power supply line Vccl 158 is formed on the source diffusion layers 329, 326, 340, 337 of the four p-channel semiconductor devices of the 3rd-row/2nd-column and 3rd-row/3rd-column inverters, and the second power supply line Vccl 160 is formed on the source diffusion layers 348, 351 of the two p-channel semiconductor devices of the 3rd-row/4th-column inverter.

The gate 312 serves as an input terminal line of the 3rd-row/1st-column inverter.

The gate 323 serves as an input terminal line of the 3rd-row/2nd-column inverter.

The gate 334 serves as an input terminal line of the 3rd-row/3rd-column inverter.

The gate 345 serves as an input terminal line of the 3rd-row/4th-column inverter.

A contact 353 is formed to connect the gate 323 and the island-shaped semiconductor lower layer-based output terminal line 319 of the 3rd-row/1st-column inverter.

A contact 354 is formed to connect the gate 334 and the island-shaped semiconductor lower layer-based output terminal line 330 of the 3rd-row/2nd-column inverter.

A contact 355 is formed to connect the gate 345 and the island-shaped semiconductor lower layer-based output terminal line 341 of the 3rd-row/3rd-column inverter.

Figure 17:
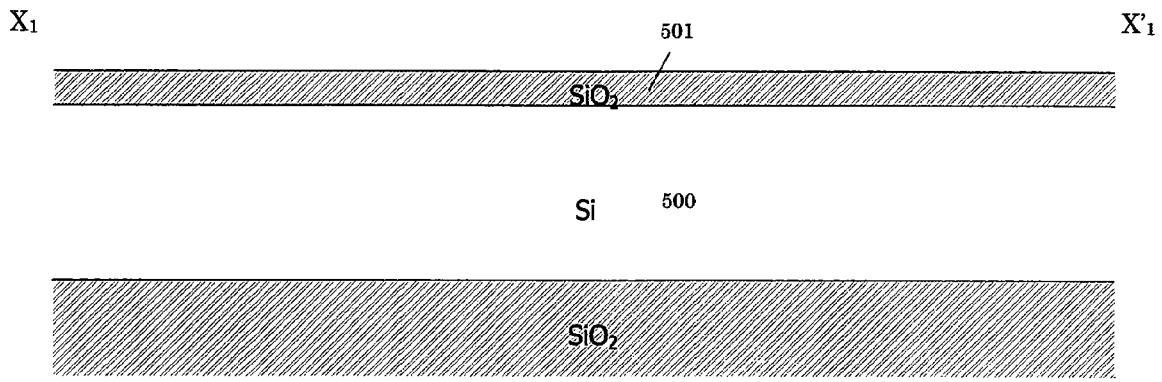
FIG. 17 is a sectional view ($X_1$-$X'_1$ section) showing a step in one example of a production method for the semiconductor device according to the first embodiment.
Figure 18:
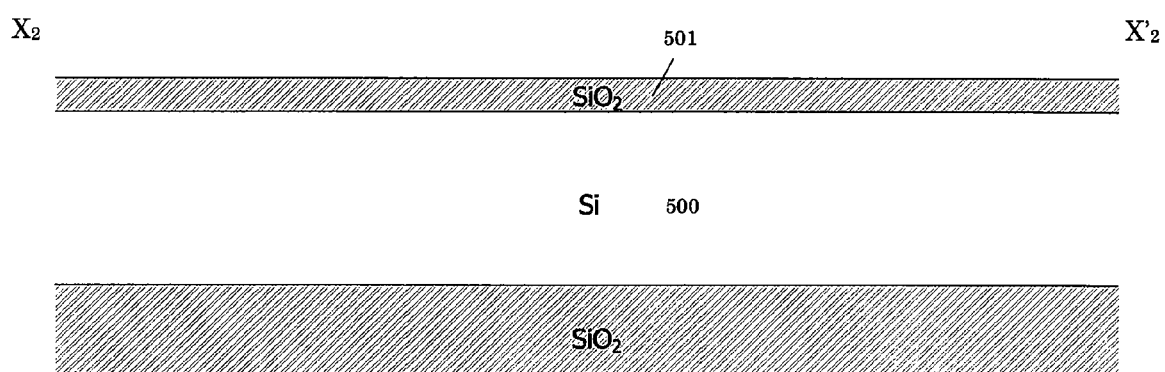
FIG. 18 is a sectional view ($X_2$-$X'_2$ section) showing the step in the example of the production method for the semiconductor device according to the first embodiment.
Figure 19:
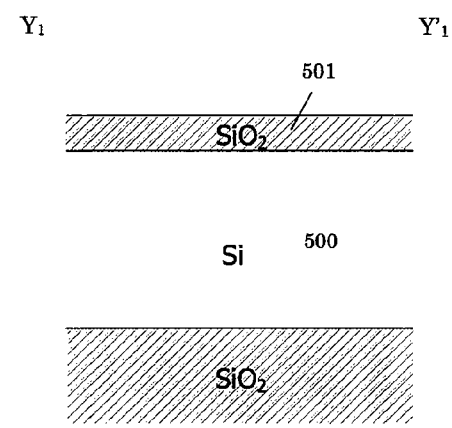
FIG. 19 is a sectional view ($Y_1$-$Y'_1$ section) showing the step in the example of the production method for the semiconductor device according to the first embodiment.
Figure 20:
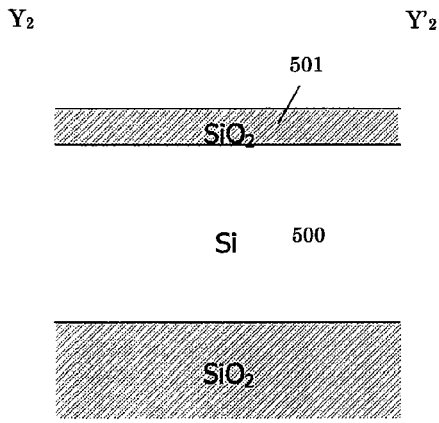
FIG. 20 is a sectional view ($Y_2$-$Y'_2$ section) showing the step in the example of the production method for the semiconductor device according to the first embodiment.

With reference to FIGS. 17 to 212, one example of a production process for forming the structure of the semiconductor device according to the first embodiment will be described below. FIG. 17 is a diagram showing a silicon-on-insulator (SOI) substrate, in $X_1$-$X'_1$ section, wherein a silicon layer 500 is formed on a silicon oxide film, and a silicon oxide film 501 is formed by oxidizing a surface of the silicon layer 500. FIG. 18, FIG. 19 and FIG. 20 illustrate the SOI substrate in $X_2$-$X'_2$ section, $Y_1$-$Y'_1$ section and $Y_2$-$Y'_2$, respectively. In FIGS. 17 to 20, the $X_1$-$X'_1$ section, the $X_2$-$X'_2$ section, the $Y_1$-$Y'_1$ section, and the $Y_2$-$Y'_2$ section, correspond to FIG. 4, FIG. 5, FIG. 6, and FIG. 7, respectively.

Figure 21:
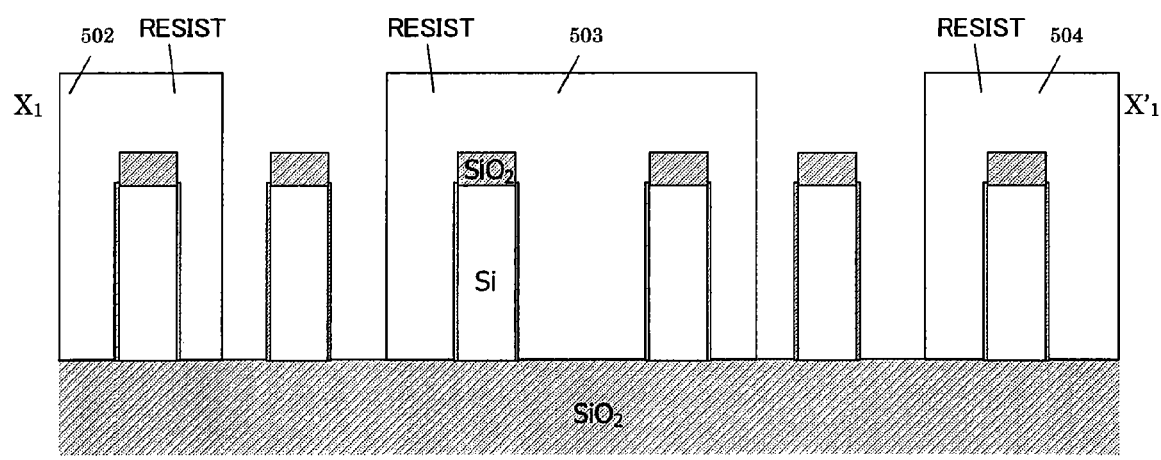
FIG. 21 is a sectional view ($X_1$-$X'_1$ section) showing a step in the example of the production method for the semiconductor device according to the first embodiment.
Figure 22:
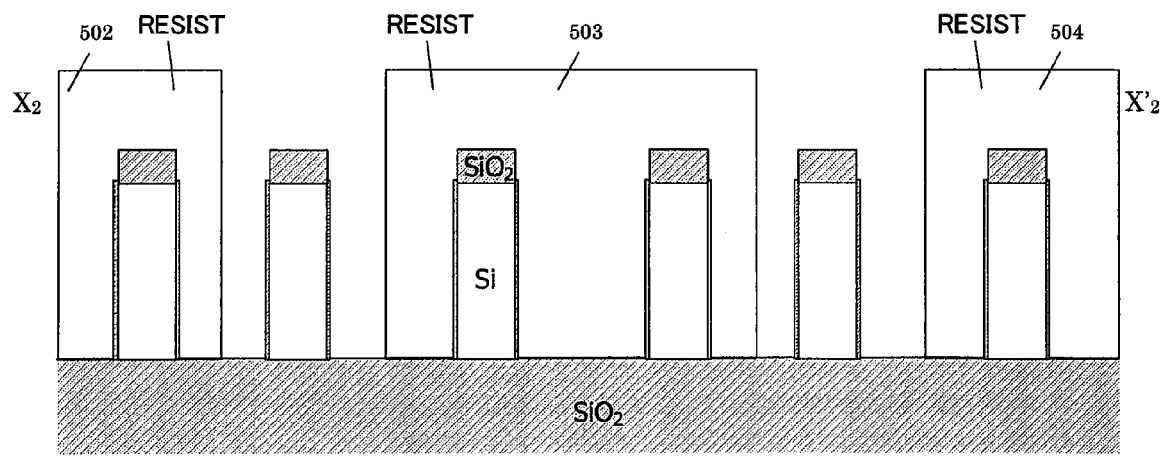
FIG. 22 is a sectional view ($X_2$-$X'_2$ section) showing the step in the example of the production method for the semiconductor device according to the first embodiment.
Figure 23:
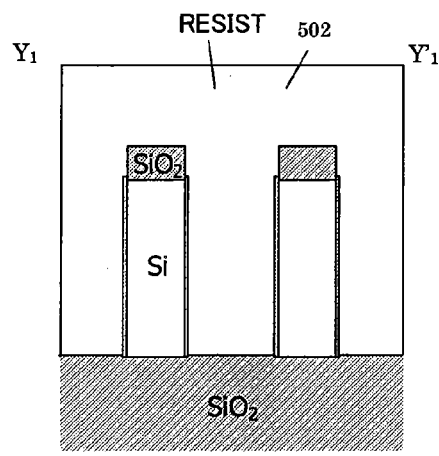
FIG. 23 is a sectional view ($Y_1$-$Y'_1$ section) showing the step in the example of the production method for the semiconductor device according to the first embodiment.
Figure 24:
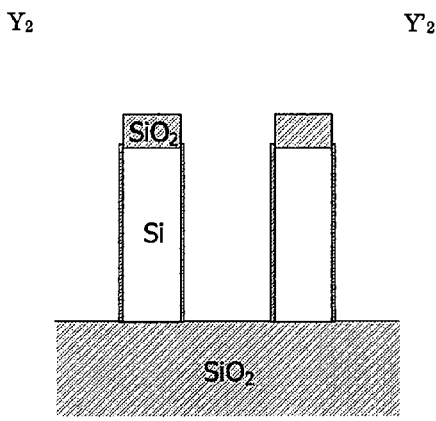
FIG. 24 is a sectional view ($Y_2$-$Y'_2$ section) showing the step in the example of the production method for the semiconductor device according to the first embodiment.

The silicon layer 500 is etched by reactive ion etching using a resist as a mask to form a required number of silicon pillars. Subsequently, surfaces of the silicon pillars are oxidized, and then resists 502, 503, 504 are formed to allow a part of the silicon pillars to be formed as p-type silicon pillars (FIG. 21 ($X_1$-$X'_1$), FIG. 22 ($X_2$-$X'_2$), FIG. 23 ($Y_1$-$Y'_1$) and FIG. 24 ($Y_2$-$Y'_2$)).

Figure 25:
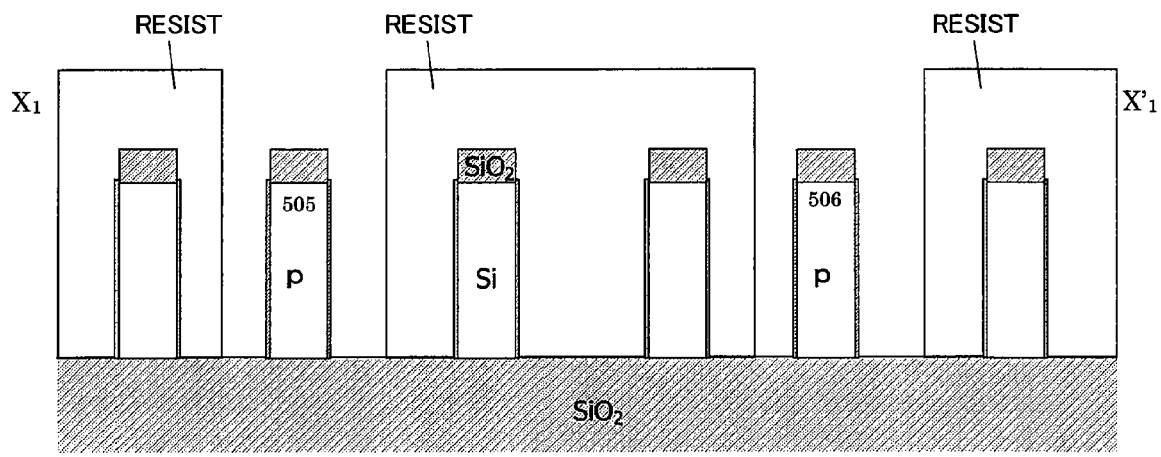
FIG. 25 is a sectional view ($X_1$-$X'_1$ section) showing a step in the example of the production method for the semiconductor device according to the first embodiment.
Figure 26:
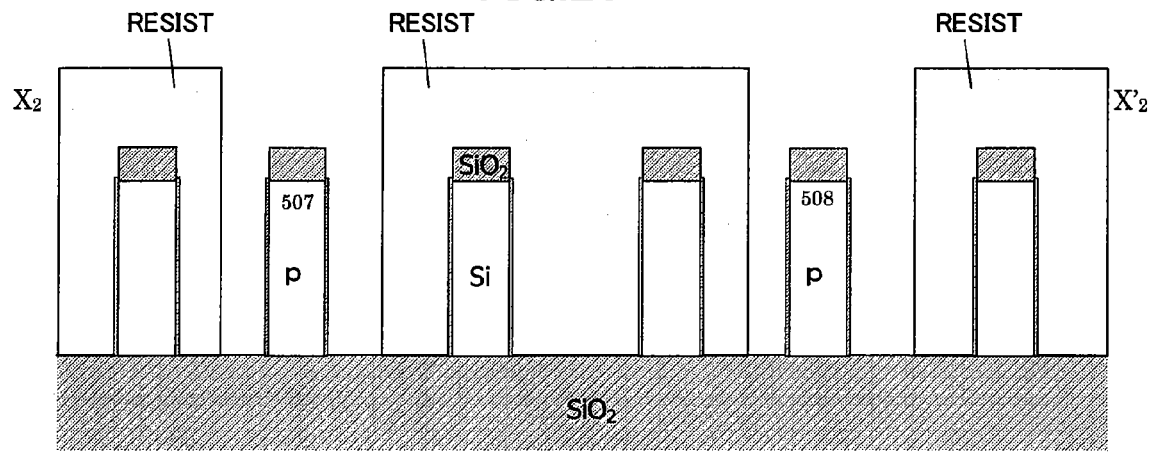
FIG. 26 is a sectional view ($X_2$-$X'_2$ section) showing the step in the example of the production method for the semiconductor device according to the first embodiment.
Figure 27:
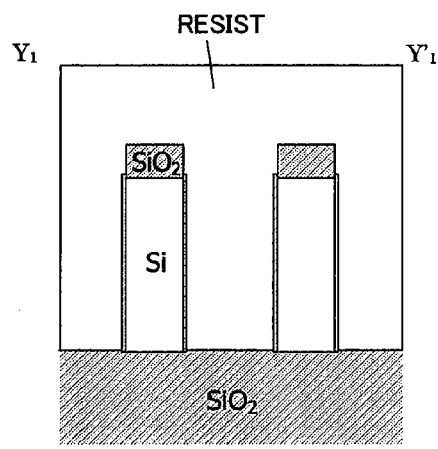
FIG. 27 is a sectional view ($Y_1$-$Y'_1$ section) showing the step in the example of the production method for the semiconductor device according to the first embodiment.
Figure 28:
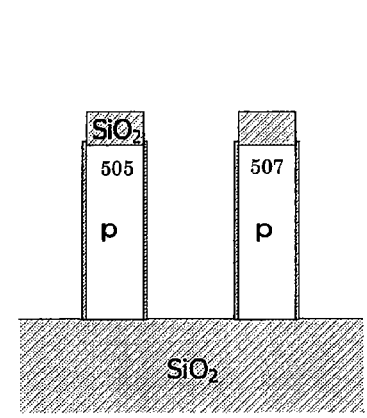
FIG. 28 is a sectional view ($Y_2$-$Y'_2$ section) showing the step in the example of the production method for the semiconductor device according to the first embodiment.

Boron (B) is implanted into the unmasked silicon pillars by an ion-implantation process or the like, to form p-type silicon pillars 505, 506, 507, 508 (FIG. 25 ($X_1$-$X'_1$), FIG. 26 ($X_2$-$X'_2$), FIG. 27 ($Y_1$-$Y'_1$) and FIG. 28 ($Y_2$-$Y'_2$)).

Figure 29:
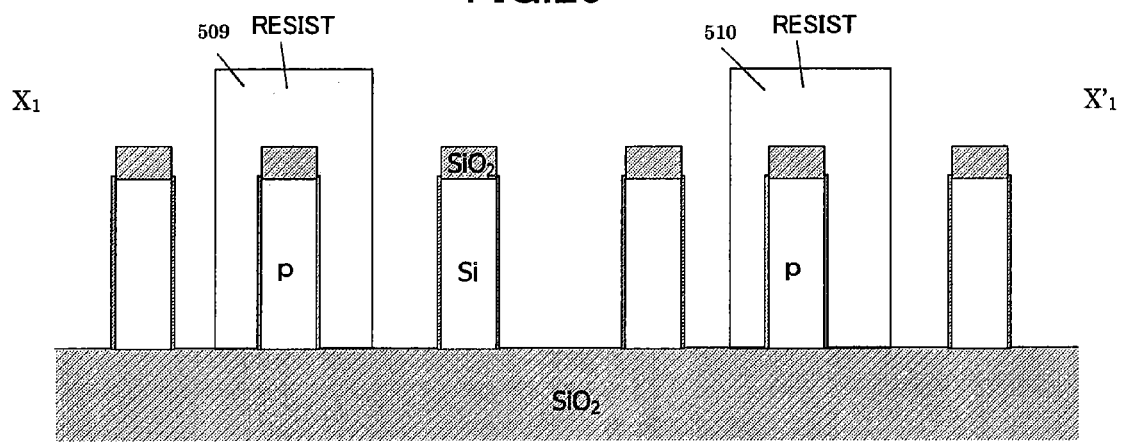
FIG. 29 is a sectional view ($X_1$-$X'_1$ section) showing a step in the example of the production method for the semiconductor device according to the first embodiment.
Figure 30:
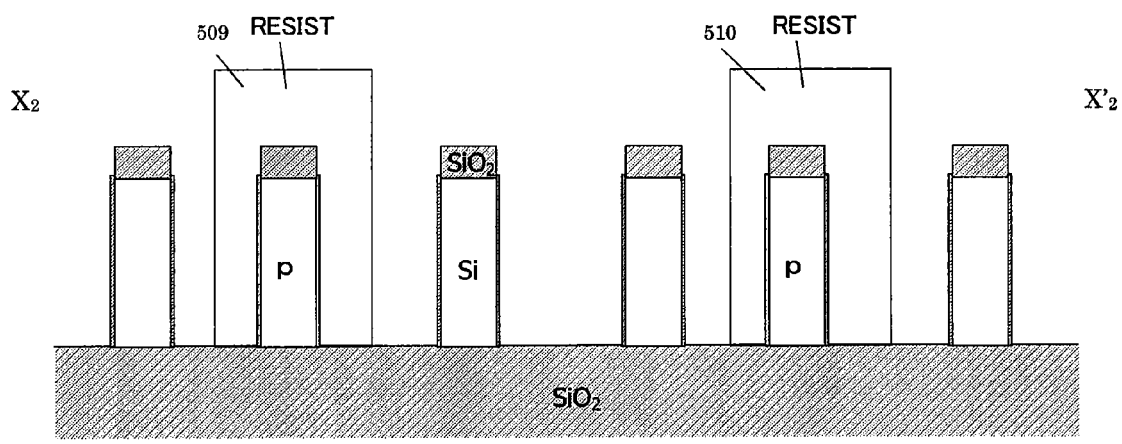
FIG. 30 is a sectional view ($X_2$-$X'_2$ section) showing the step in the example of the production method for the semiconductor device according to the first embodiment.
Figure 31:
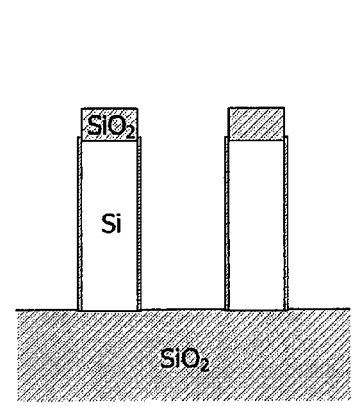
FIG. 31 is a sectional view ($Y_1$-$Y'_1$ section) showing the step in the example of the production method for the semiconductor device according to the first embodiment.
Figure 32:
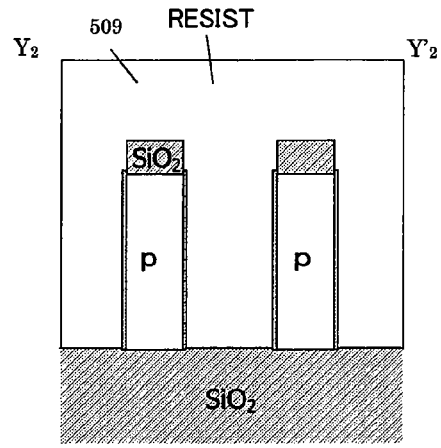
FIG. 32 is a sectional view ($Y_2$-$Y'_2$ section) showing the step in the example of the production method for the semiconductor device according to the first embodiment.

After removing the resists 502, 503, 504, resists 509, 510 are formed to allow the remaining silicon pillars to be formed as n-type silicon pillars (FIG. 29 ($X_1$-$X'_1$), FIG. 30 ($X_2$-$X'_2$), FIG. 31 ($Y_1$-$Y'_1$) and FIG. 32 ($Y_2$-$Y'_2$)).

Figure 33:
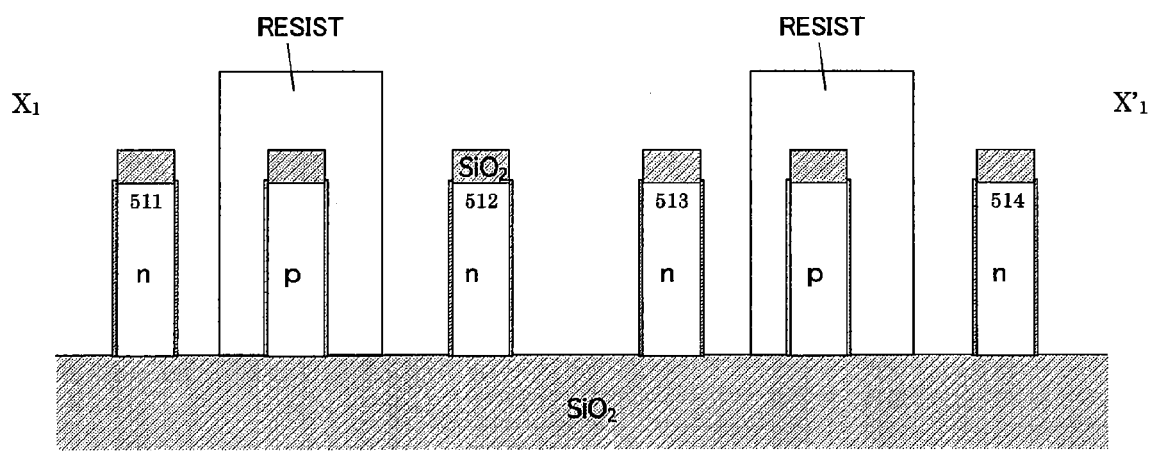
FIG. 33 is a sectional view ($X_1$-$X'_1$ section) showing a step in the example of the production method for the semiconductor device according to the first embodiment.
Figure 34:
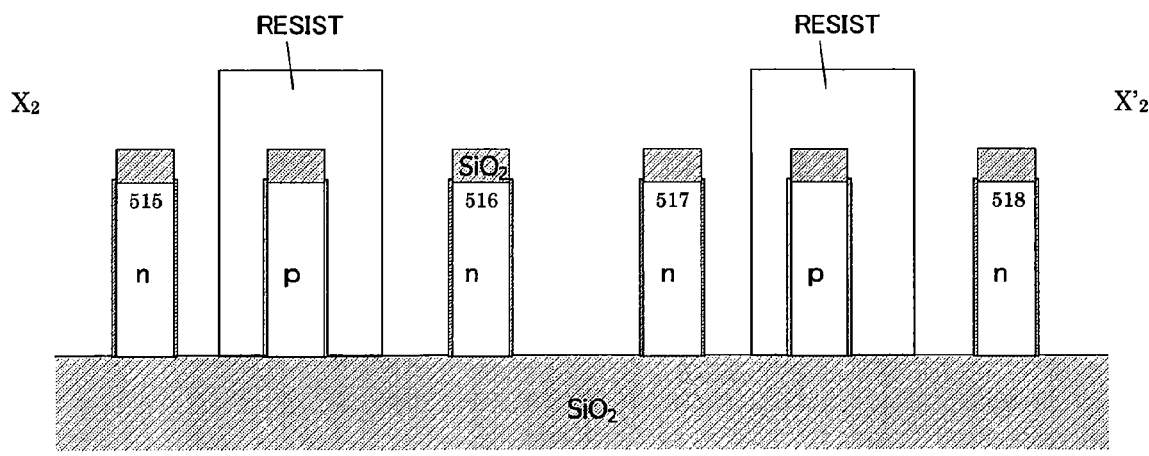
FIG. 34 is a sectional view ($X_2$-$X'_2$ section) showing the step in the example of the production method for the semiconductor device according to the first embodiment.
Figure 35:
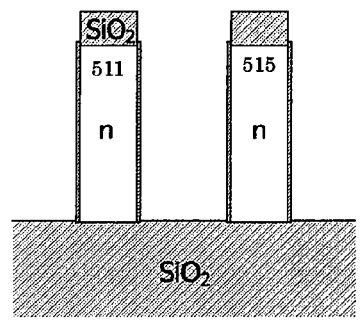
FIG. 35 is a sectional view ($Y_1$-$Y'_1$ section) showing the step in the example of the production method for the semiconductor device according to the first embodiment.
Figure 36:
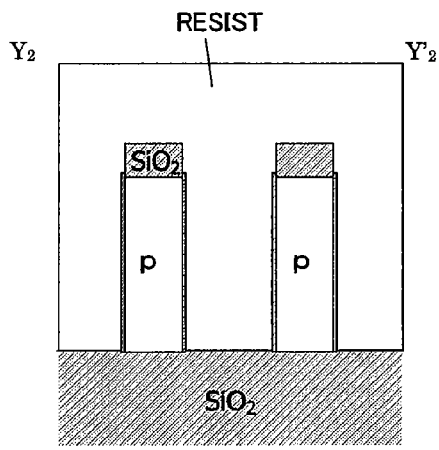
FIG. 36 is a sectional view ($Y_2$-$Y'_2$ section) showing the step in the example of the production method for the semiconductor device according to the first embodiment.

Phosphorus (P) is implanted into the unmasked silicon pillars by an ion-implantation process or the like, to form n-type silicon pillars 511, 512, 513, 514, 515, 516, 517, 518 (FIG. 33 ($X_1$-$X'_1$), FIG. 34 ($X_2$-$X'_2$), FIG. 35 ($Y_1$-$Y'_1$) and FIG. 36 ($Y_2$-$Y'_2$)).

Figure 37:
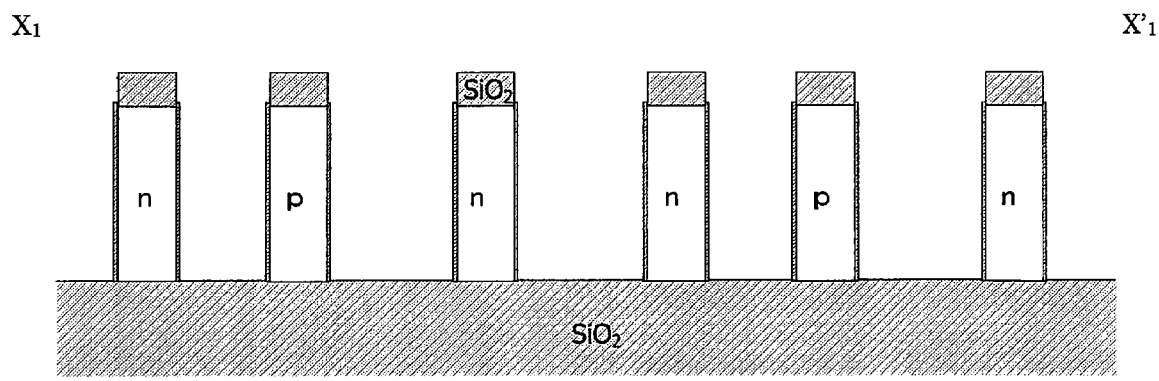
FIG. 37 is a sectional view ($X_1$-$X'_1$ section) showing a step in the example of the production method for the semiconductor device according to the first embodiment.
Figure 38:
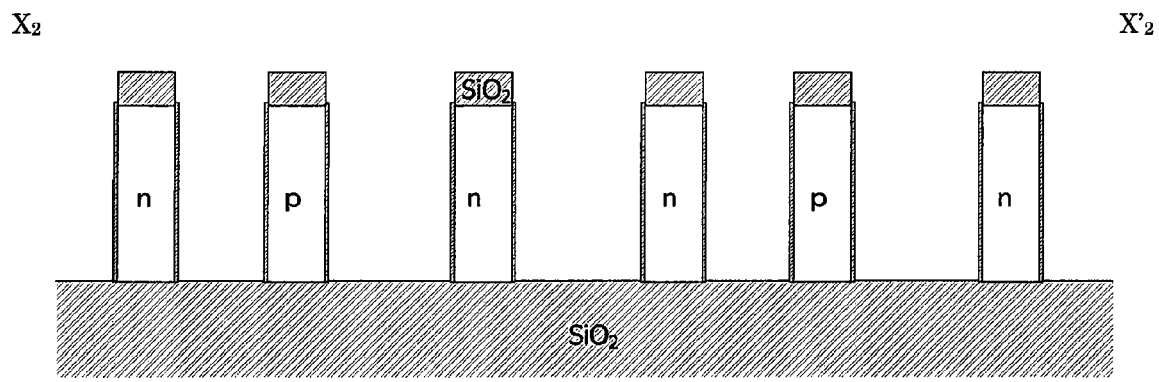
FIG. 38 is a sectional view ($X_2$-$X'_2$ section) showing the step in the example of the production method for the semiconductor device according to the first embodiment.
Figure 39:
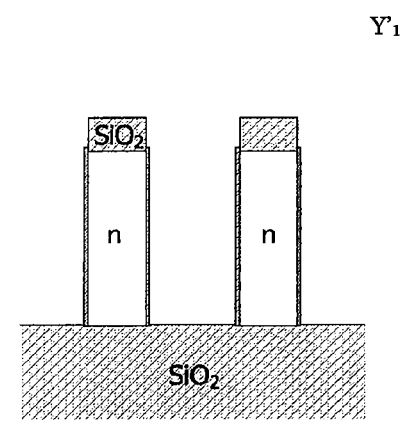
FIG. 39 is a sectional view ($Y_1$-$Y'_1$ section) showing the step in the example of the production method for the semiconductor device according to the first embodiment.
Figure 40:
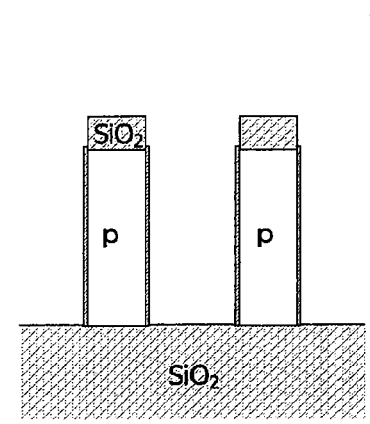
FIG. 40 is a sectional view ($Y_2$-$Y'_2$ section) showing the step in the example of the production method for the semiconductor device according to the first embodiment.

After removing the resists, the silicon pillars are subjected to a thermal process to ionize the impurity (FIG. 37 ($X_1$-$X'_1$), FIG. 38 ($X_2$-$X'_2$), FIG. 39 ($Y_1$-$Y'_1$) and FIG. 40 ($Y_2$-$Y'_2$)).

Figure 41:
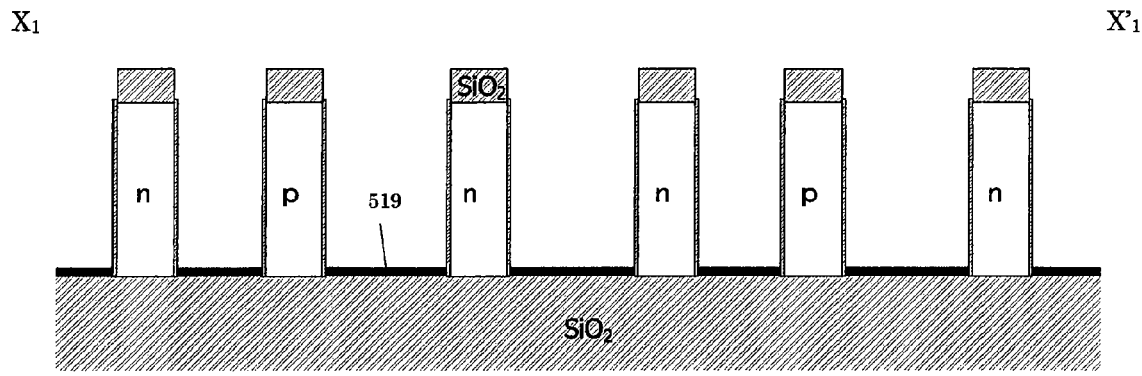
FIG. 41 is a sectional view ($X_1$-$X'_1$ section) showing a step in the example of the production method for the semiconductor device according to the first embodiment.
Figure 42:
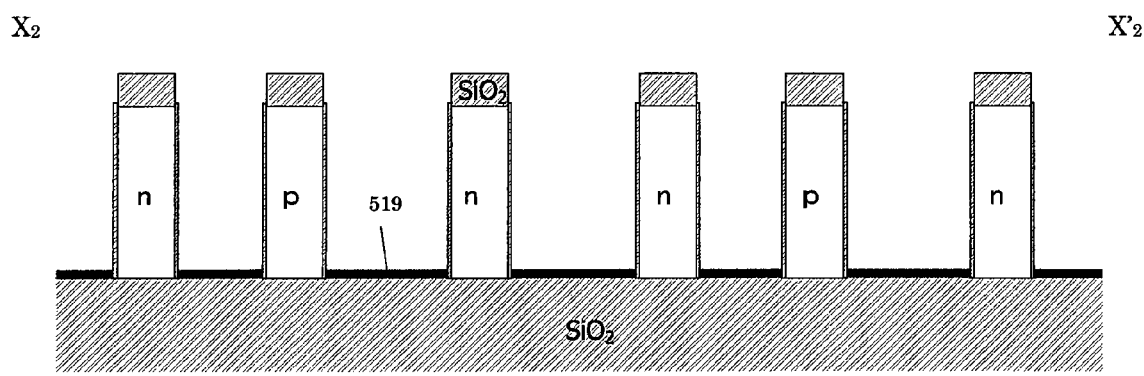
FIG. 42 is a sectional view ($X_2$-$X'_2$ section) showing the step in the example of the production method for the semiconductor device according to the first embodiment.
Figure 43:
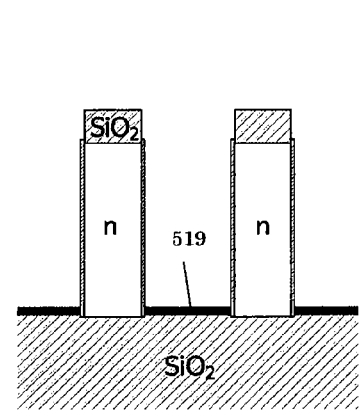
FIG. 43 is a sectional view ($Y_1$-$Y'_1$ section) showing the step in the example of the production method for the semiconductor device according to the first embodiment.
Figure 44:
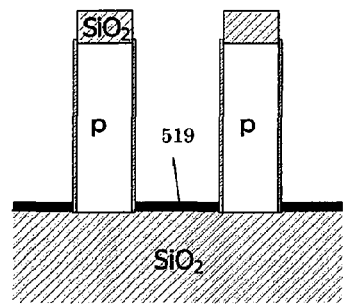
FIG. 44 is a sectional view ($Y_2$-$Y'_2$ section) showing the step in the example of the production method for the semiconductor device according to the first embodiment.

A nitride film 519 is deposited, and flattened by chemical mechanical polishing (CMP). Then, the nitride film 519 is etched back (FIG. 41 ($X_1$-$X'_1$), FIG. 42 ($X_2$-$X'_2$), FIG. 43 ($Y_1$-$Y'_1$) and FIG. 44 ($Y_2$-$Y'_2$)).

Figure 45:
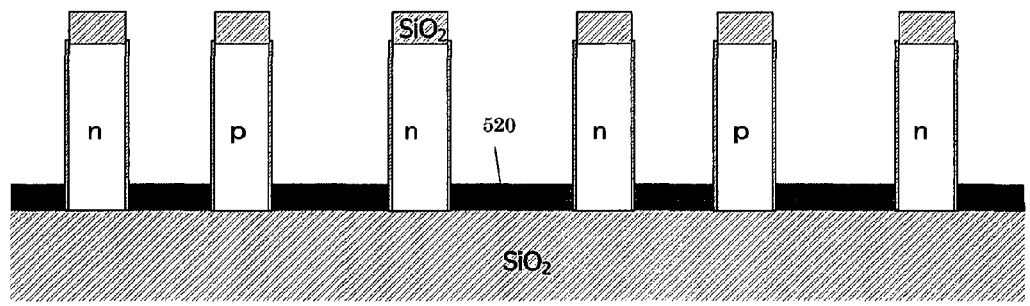
FIG. 45 is a sectional view ($X_1$-$X'_1$ section) showing a step in the example of the production method for the semiconductor device according to the first embodiment.
Figure 46:
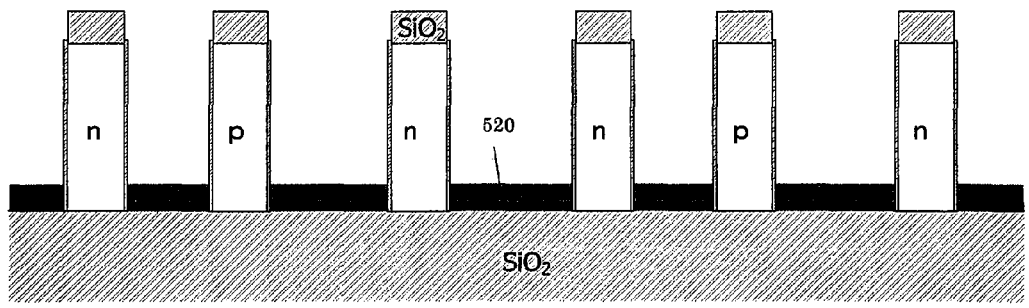
FIG. 46 is a sectional view ($X_2$-$X'_2$ section) showing the step in the example of the production method for the semiconductor device according to the first embodiment.
Figure 47:
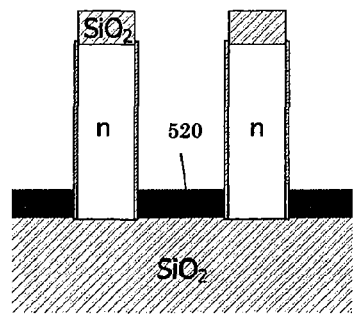
FIG. 47 is a sectional view ($Y_1$-$Y'_1$ section) showing the step in the example of the production method for the semiconductor device according to the first embodiment.
Figure 48:
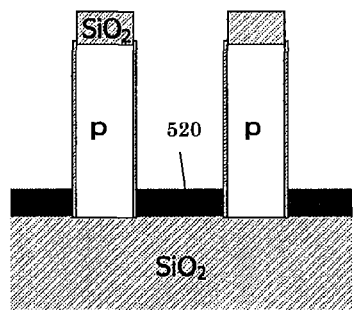
FIG. 48 is a sectional view ($Y_2$-$Y'_2$ section) showing the step in the example of the production method for the semiconductor device according to the first embodiment.

A polysilicon film 520 is deposited, and flattened by CMP. Then, the polysilicon film 520 is etched back (FIG. 45 ($X_1$-$X'_1$), FIG. 46 ($X_2$-$X'_2$), FIG. 47 ($Y_1$-$Y'_1$) and FIG. 48 ($Y_2$-$Y'_2$)).

Figure 49:
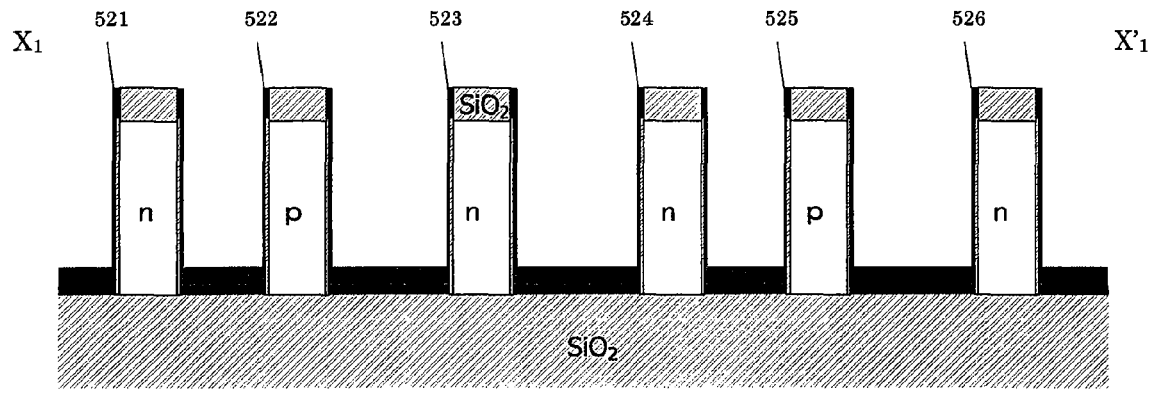
FIG. 49 is a sectional view ($X_1$-$X'_1$ section) showing a step in the example of the production method for the semiconductor device according to the first embodiment.
Figure 50:
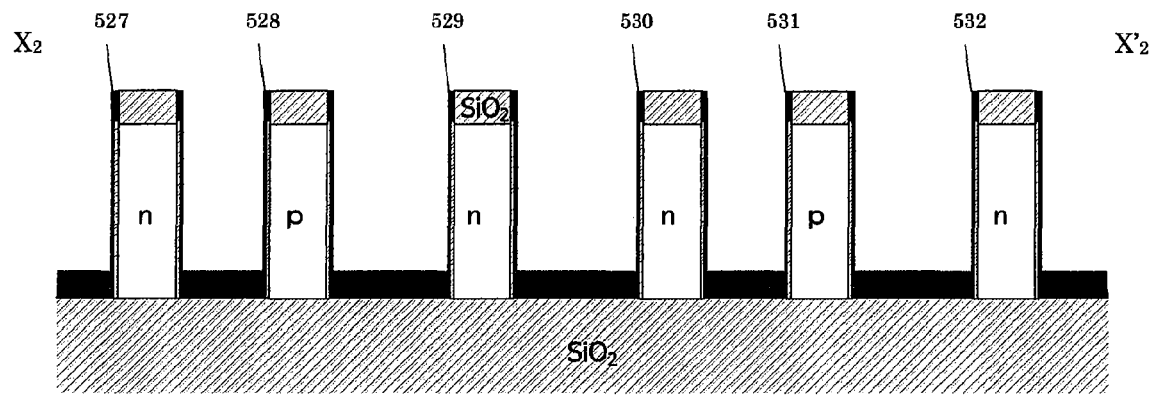
FIG. 50 is a sectional view ($X_2$-$X'_2$ section) showing the step in the example of the production method for the semiconductor device according to the first embodiment.
Figure 51:
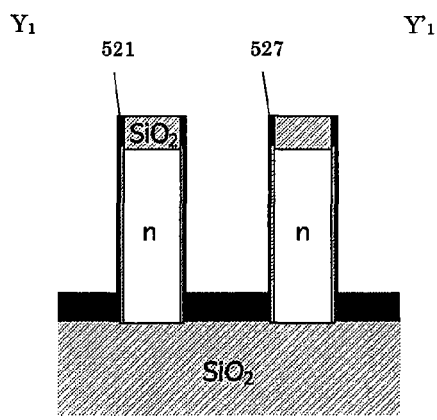
FIG. 51 is a sectional view ($Y_1$-$Y'_1$ section) showing the step in the example of the production method for the semiconductor device according to the first embodiment.
Figure 52:
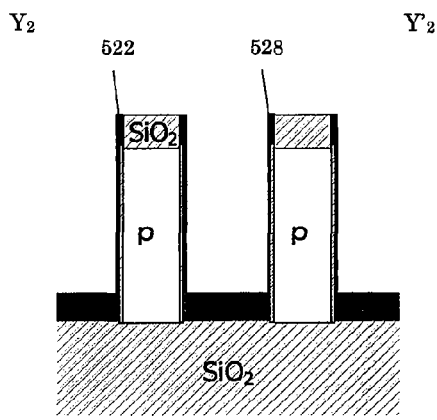
FIG. 52 is a sectional view ($Y_2$-$Y'_2$ section) showing the step in the example of the production method for the semiconductor device according to the first embodiment.

A nitride film is deposited in such a manner that it remains on a sidewall of each of the island-shaped semiconductor sections, in the form of a sidewall spacer (FIG. 49 ($X_1$-$X'_1$), FIG. 50 ($X_2$-$X'_2$), FIG. 51 ($Y_1$-$Y'_1$) and FIG. 52 ($Y_2$-$Y'_2$)).

Figure 53:
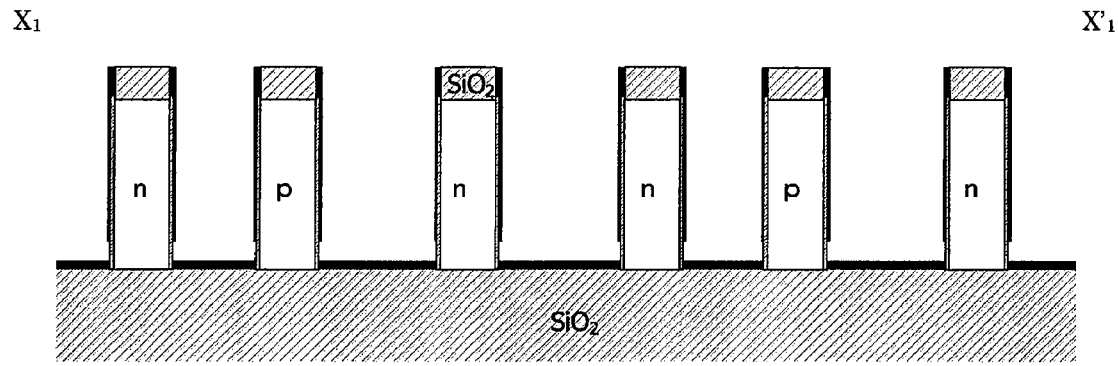
FIG. 53 is a sectional view ($X_1$-$X'_1$ section) showing a step in the example of the production method for the semiconductor device according to the first embodiment.
Figure 54:
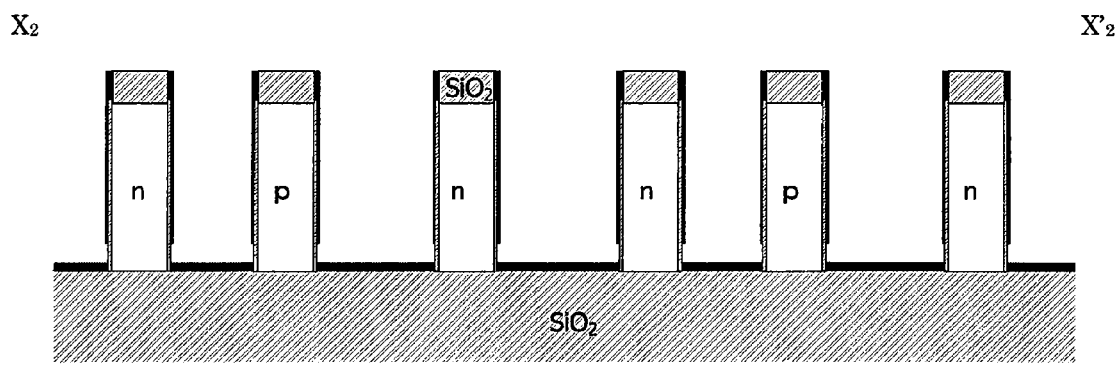
FIG. 54 is a sectional view ($X_2$-$X'_2$ section) showing the step in the example of the production method for the semiconductor device according to the first embodiment.
Figure 55:
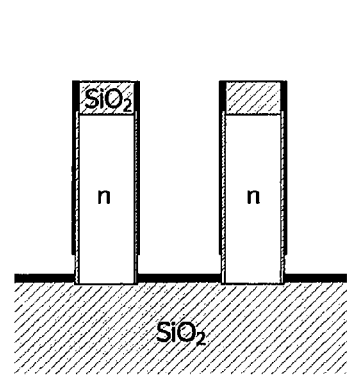
FIG. 55 is a sectional view ($Y_1$-$Y'_1$ section) showing the step in the example of the production method for the semiconductor device according to the first embodiment.
Figure 56:
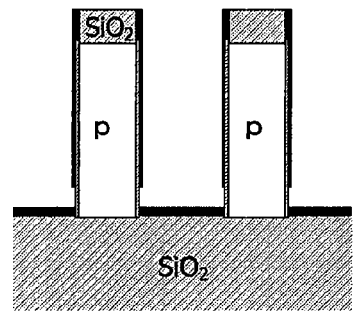
FIG. 56 is a sectional view ($Y_2$-$Y'_2$ section) showing the step in the example of the production method for the semiconductor device according to the first embodiment.

The polysilicon film is etched away (FIG. 53 ($X_1$-$X'_1$), FIG. 54 ($X_2$-$X'_2$), FIG. 55 ($Y_1$-$Y'_1$) and FIG. 56 ($Y_2$-$Y'_2$)).

Figure 57:
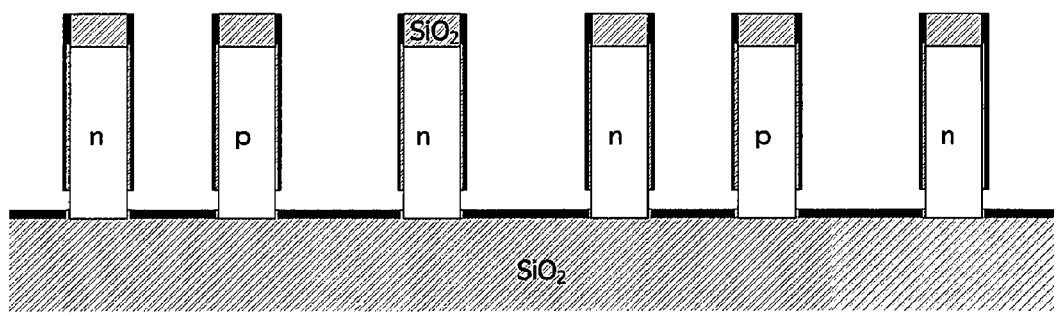
FIG. 57 is a sectional view ($X_1$-$X'_1$ section) showing a step in the example of the production method for the semiconductor device according to the first embodiment.
Figure 58:
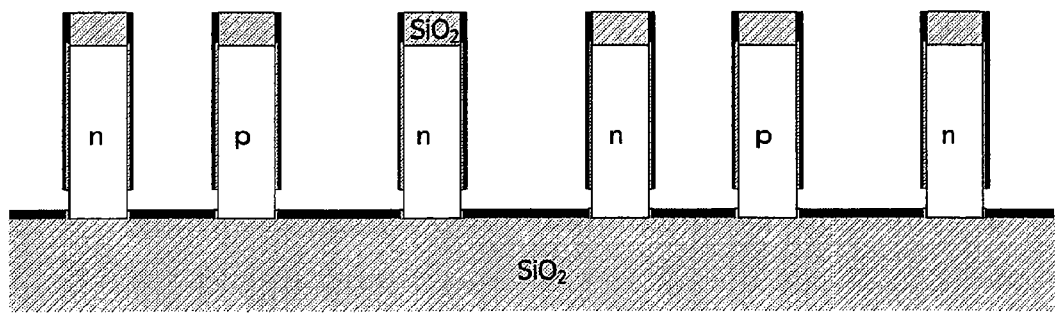
FIG. 58 is a sectional view ($X_2$-$X'_2$ section) showing the step in the example of the production method for the semiconductor device according to the first embodiment.
Figure 59:
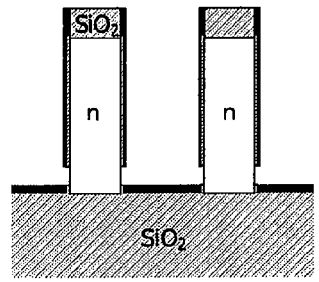
FIG. 59 is a sectional view ($Y_1$-$Y'_1$ section) showing the step in the example of the production method for the semiconductor device according to the first embodiment.
Figure 60:
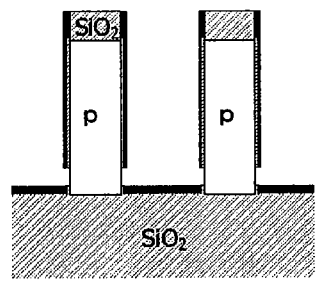
FIG. 60 is a sectional view ($Y_2$-$Y'_2$ section) showing the step in the example of the production method for the semiconductor device according to the first embodiment.

The exposed oxide film on each of the island-shaped semiconductor sections is etched away (FIG. 57 ($X_1$-$X'_1$), FIG. 58 ($X_2$-$X'_2$), FIG. 59 ($Y_1$-$Y'_1$) and FIG. 60 ($Y_2$-$Y'_2$)).

Figure 61:
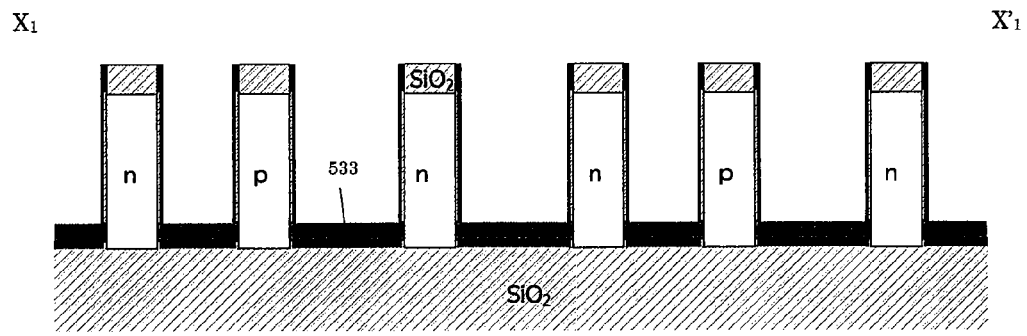
FIG. 61 is a sectional view ($X_1$-$X'_1$ section) showing a step in the example of the production method for the semiconductor device according to the first embodiment.
Figure 62:
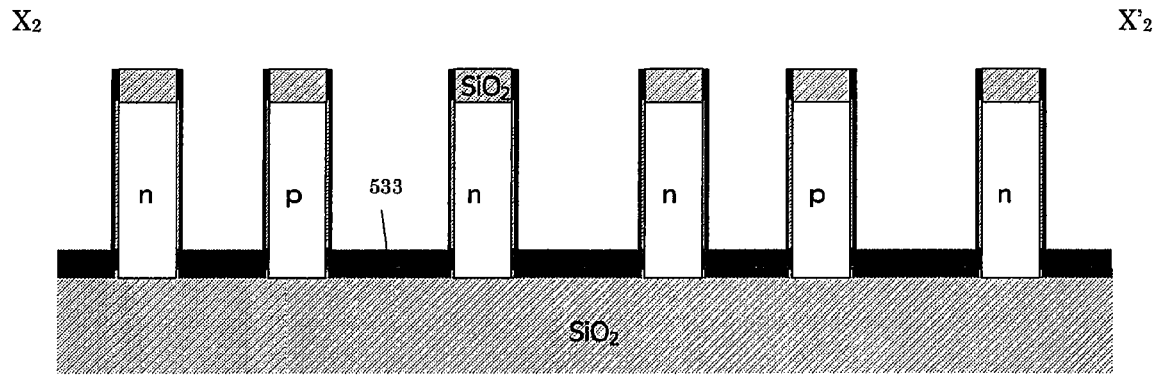
FIG. 62 is a sectional view ($X_2$-$X'_2$ section) showing the step in the example of the production method for the semiconductor device according to the first embodiment.
Figure 63:
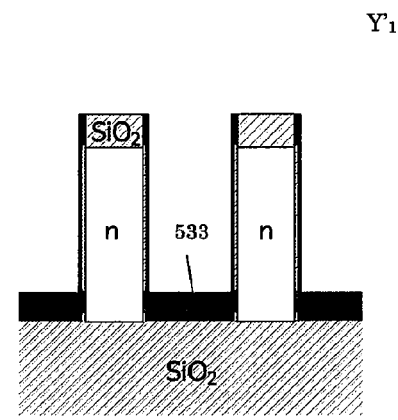
FIG. 63 is a sectional view ($Y_1$-$Y'_1$ section) showing the step in the example of the production method for the semiconductor device according to the first embodiment.
Figure 64:
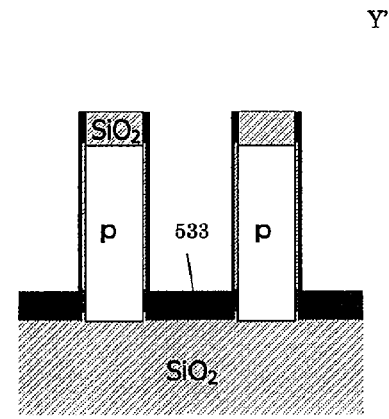
FIG. 64 is a sectional view ($Y_2$-$Y'_2$ section) showing the step in the example of the production method for the semiconductor device according to the first embodiment.

A polysilicon film 533 is deposited, and flattened by CMP. Then, the polysilicon film 533 is etched back (FIG. 61 ($X_1$-$X'_1$), FIG. 62 ($X_2$-$X'_2$), FIG. 63 ($Y_1$-$Y'_1$) and FIG. 64 ($Y_2$-$Y'_2$)).

Figure 65:
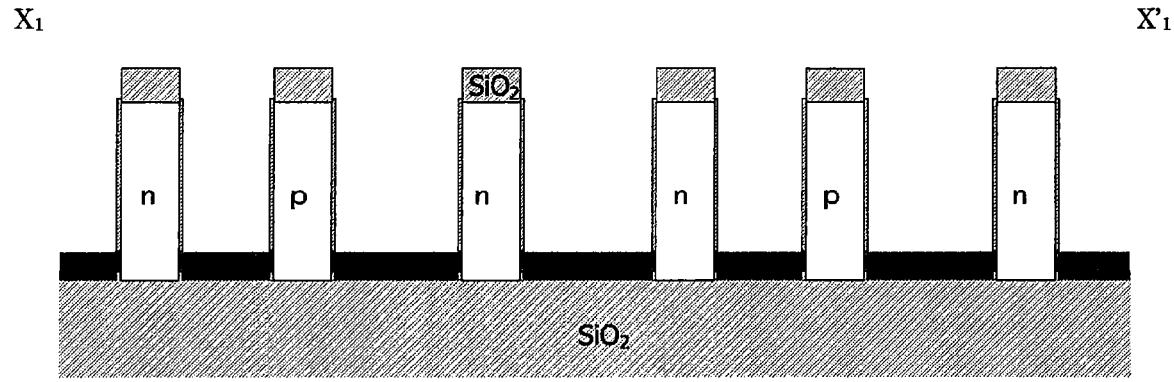
FIG. 65 is a sectional view ($X_1$-$X'_1$ section) showing a step in the example of the production method for the semiconductor device according to the first embodiment.
Figure 66:
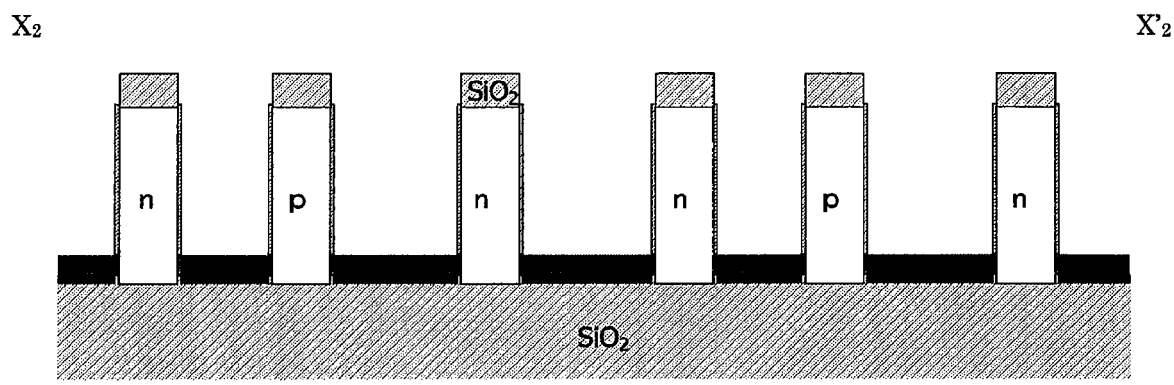
FIG. 66 is a sectional view ($X_2$-$X'_2$ section) showing the step in the example of the production method for the semiconductor device according to the first embodiment.
Figure 67:
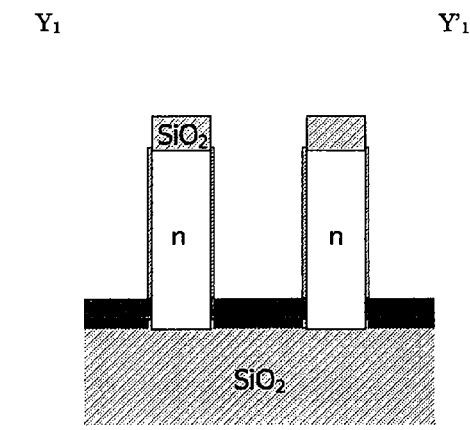
FIG. 67 is a sectional view ($Y_1$-$Y'_1$ section) showing the step in the example of the production method for the semiconductor device according to the first embodiment.
Figure 68:
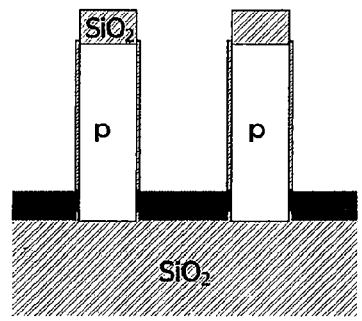
FIG. 68 is a sectional view ($Y_2$-$Y'_2$ section) showing the step in the example of the production method for the semiconductor device according to the first embodiment.

The nitride film is etched away (FIG. 65 ($X_1$-$X'_1$), FIG. 66 ($X_2$-$X'_2$), FIG. 67 ($Y_1$-$Y'_1$) and FIG. 68 ($Y_2$-$Y'_2$)).

Figure 69:
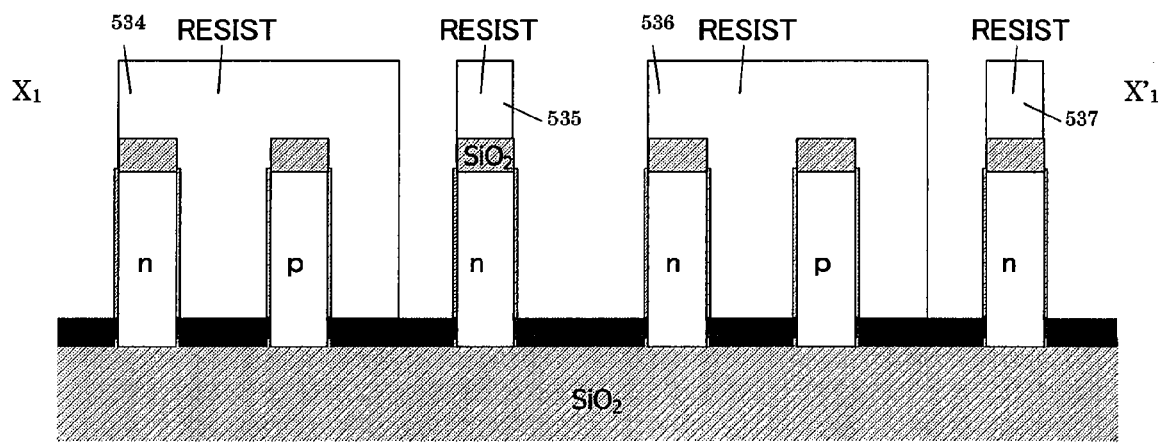
FIG. 69 is a sectional view ($X_1$-$X'_1$ section) showing a step in the example of the production method for the semiconductor device according to the first embodiment.
Figure 70:
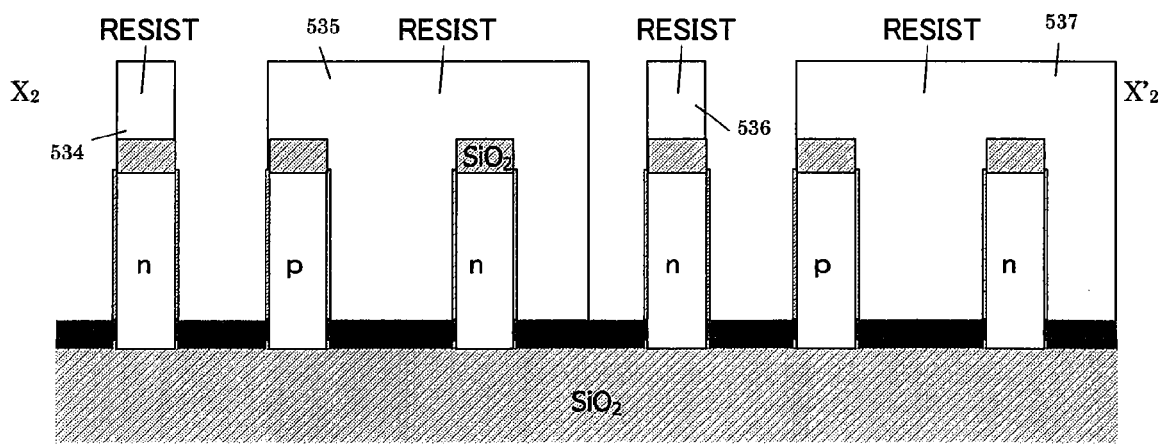
FIG. 70 is a sectional view ($X_2$-$X'_2$ section) showing the step in the example of the production method for the semiconductor device according to the first embodiment.
Figure 71:
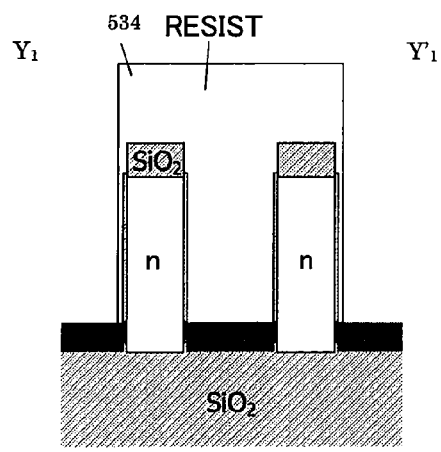
FIG. 71 is a sectional view ($Y_1$-$Y'_1$ section) showing the step in the example of the production method for the semiconductor device according to the first embodiment.
Figure 72:
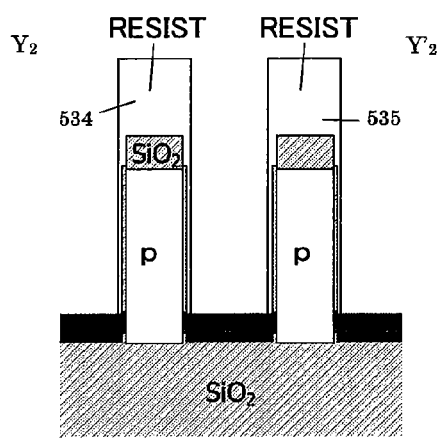
FIG. 72 is a sectional view ($Y_2$-$Y'_2$ section) showing the step in the example of the production method for the semiconductor device according to the first embodiment.

Resists 534, 535, 536, 537 are formed to allow an island-shaped semiconductor lower layer-based output terminal line to be formed (FIG. 69 ($X_1$-$X'_1$), FIG. 70 ($X_2$-$X'_2$), FIG. 71 ($Y_1$-$Y'_1$) and FIG. 72 ($Y_2$-$Y'_2$)).

Figure 73:
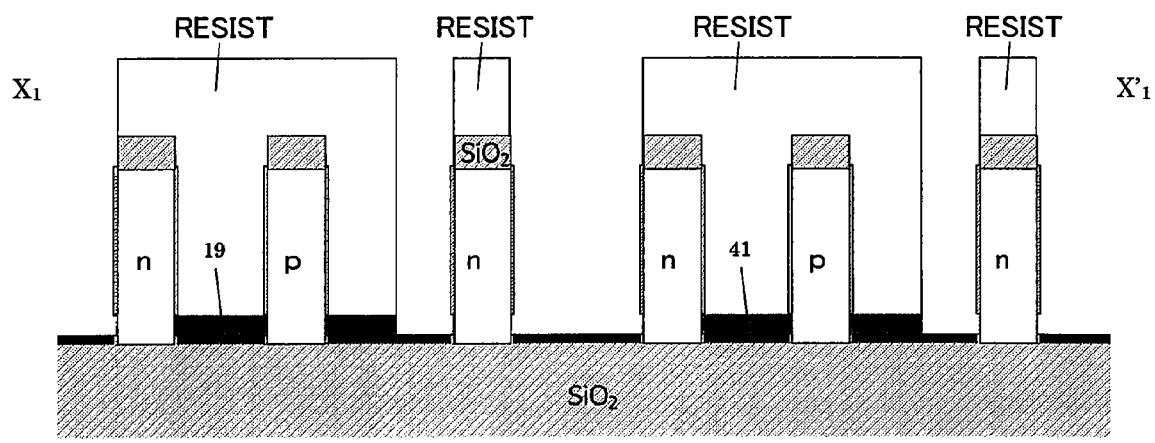
FIG. 73 is a sectional view ($X_1$-$X'_1$ section) showing a step in the example of the production method for the semiconductor device according to the first embodiment.
Figure 74:
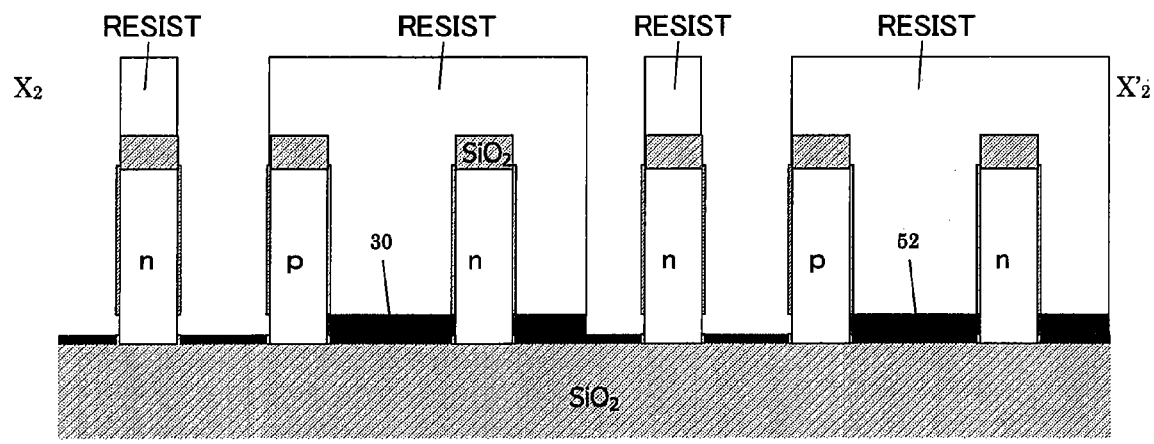
FIG. 74 is a sectional view ($X_2$-$X'_2$ section) showing the step in the example of the production method for the semiconductor device according to the first embodiment.
Figure 75:
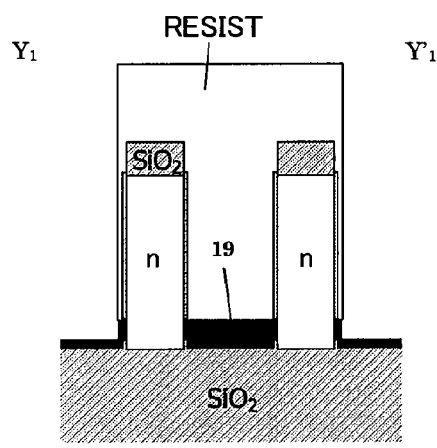
FIG. 75 is a sectional view ($Y_1$-$Y'_1$ section) showing the step in the example of the production method for the semiconductor device according to the first embodiment.
Figure 76:
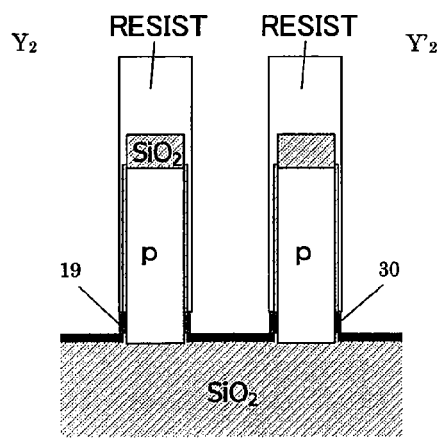
FIG. 76 is a sectional view ($Y_2$-$Y'_2$ section) showing the step in the example of the production method for the semiconductor device according to the first embodiment.

The polysilicon film is etched to form island-shaped semiconductor lower layer-based output terminal lines 19, 30, 41, 52 (FIG. 73 ($X_1$-$X'_1$), FIG. 74 ($X_2$-$X'_2$), FIG. 75 ($Y_1$-$Y'_1$) and FIG. 76 ($Y_2$-$Y'_2$)).

Figure 77:
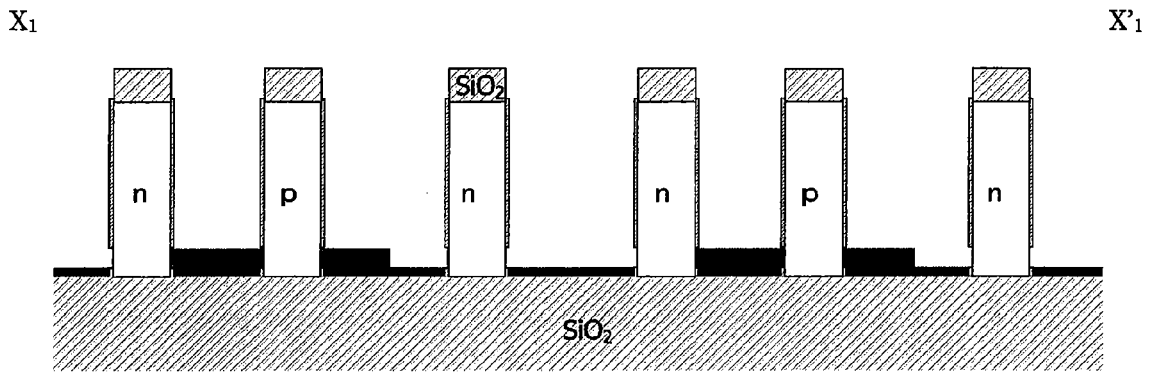
FIG. 77 is a sectional view ($X_1$-$X'_1$ section) showing a step in the example of the production method for the semiconductor device according to the first embodiment.
Figure 78:
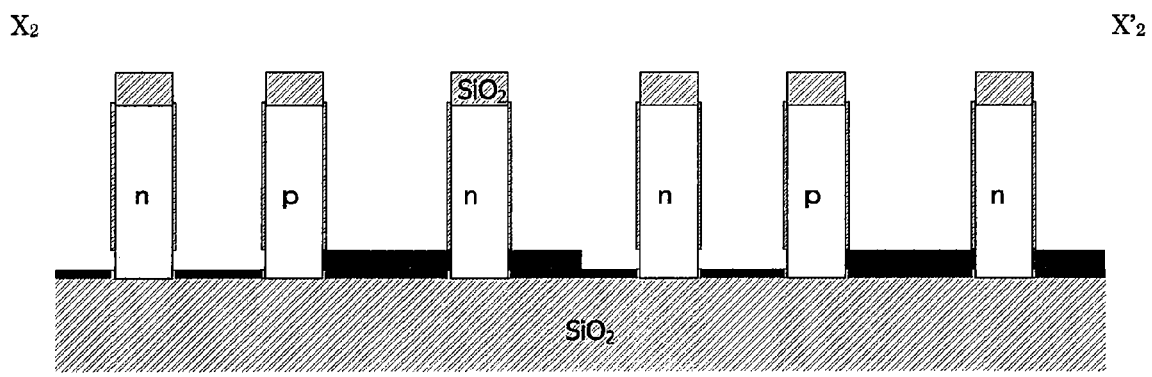
FIG. 78 is a sectional view ($X_2$-$X'_2$ section) showing the step in the example of the production method for the semiconductor device according to the first embodiment.
Figure 79:
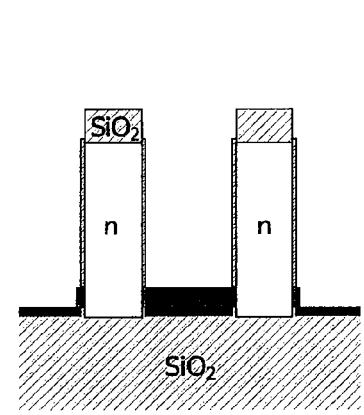
FIG. 79 is a sectional view ($Y_1$-$Y'_1$ section) showing the step in the example of the production method for the semiconductor device according to the first embodiment.
Figure 80:
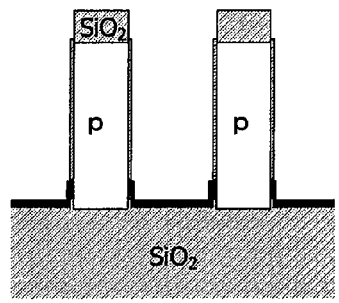
FIG. 80 is a sectional view ($Y_2$-$Y'_2$ section) showing the step in the example of the production method for the semiconductor device according to the first embodiment.

The resists are removed (FIG. 77 ($X_1$-$X'_1$), FIG. 78 ($X_2$-$X'_2$), FIG. 79 ($Y_1$-$Y'_1$) and FIG. 80 ($Y_2$-$Y'_2$)).

Figure 81:
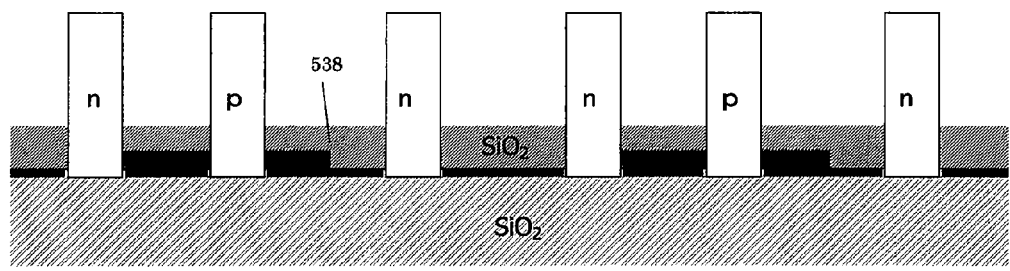
FIG. 81 is a sectional view ($X_1$-$X'_1$ section) showing a step in the example of the production method for the semiconductor device according to the first embodiment.
Figure 82:
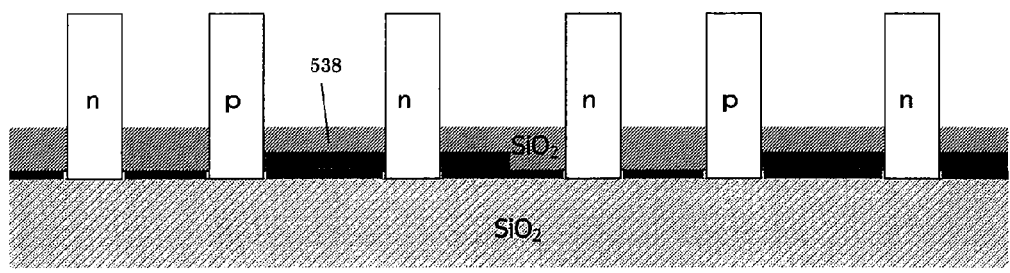
FIG. 82 is a sectional view ($X_2$-$X'_2$ section) showing the step in the example of the production method for the semiconductor device according to the first embodiment.
Figure 83:
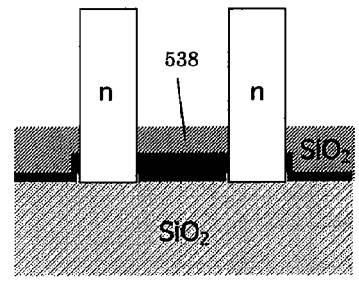
FIG. 83 is a sectional view ($Y_1$-$Y'_1$ section) showing the step in the example of the production method for the semiconductor device according to the first embodiment.
Figure 84:
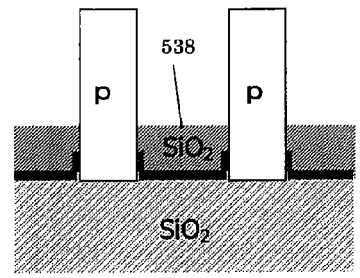
FIG. 84 is a sectional view ($Y_2$-$Y'_2$ section) showing the step in the example of the production method for the semiconductor device according to the first embodiment.

An oxide film 538 is deposited, and flattened by CMP. Then, the oxide film 538 is etched back (FIG. 81 ($X_1$-$X'_1$), FIG. 82 ($X_2$-$X'_2$), FIG. 83 ($Y_1$-$Y'_1$) and FIG. 84 ($Y_2$-$Y'_2$)).

Figure 85:
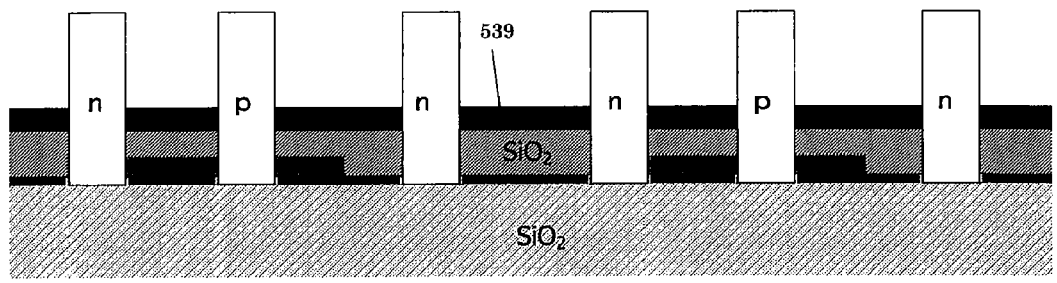
FIG. 85 is a sectional view ($X_1$-$X'_1$ section) showing a step in the example of the production method for the semiconductor device according to the first embodiment.
Figure 86:
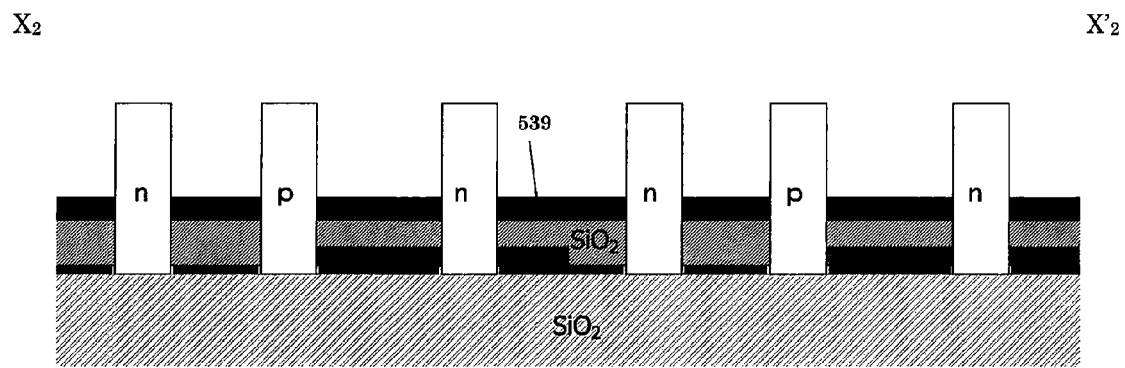
FIG. 86 is a sectional view ($X_2$-$X'_2$ section) showing the step in the example of the production method for the semiconductor device according to the first embodiment.
Figure 87:
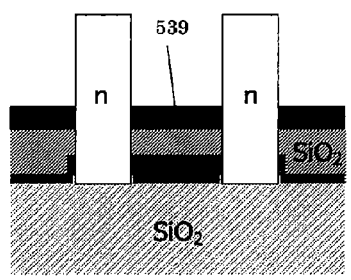
FIG. 87 is a sectional view ($Y_1$-$Y'_1$ section) showing the step in the example of the production method for the semiconductor device according to the first embodiment.
Figure 88:
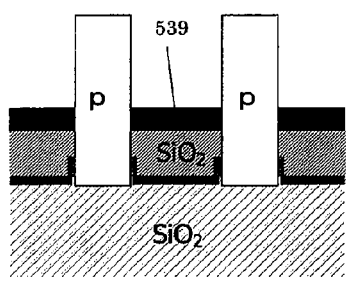
FIG. 88 is a sectional view ($Y_2$-$Y'_2$ section) showing the step in the example of the production method for the semiconductor device according to the first embodiment.

A nitride film $_{53}$9 is deposited, and flattened by CMP. Then, the nitride film 539 is etched back (FIG. 85 ($X_1$-$X'_1$), FIG. 86 ($X_2$-$X'_2$), FIG. 87 ($Y_1$-$Y'_1$) and FIG. 88 ($Y_2$-$Y'_2$)).

Figure 89:
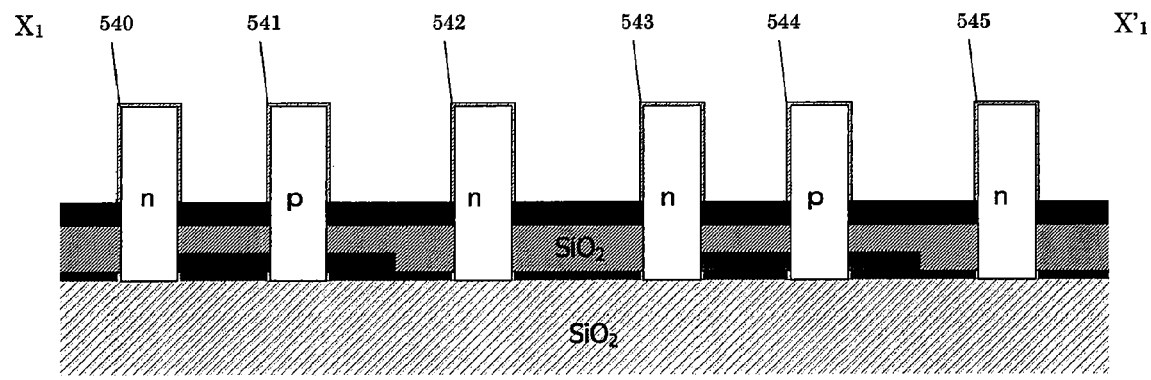
FIG. 89 is a sectional view ($X_1$-$X'_1$ section) showing a step in the example of the production method for the semiconductor device according to the first embodiment.
Figure 90:
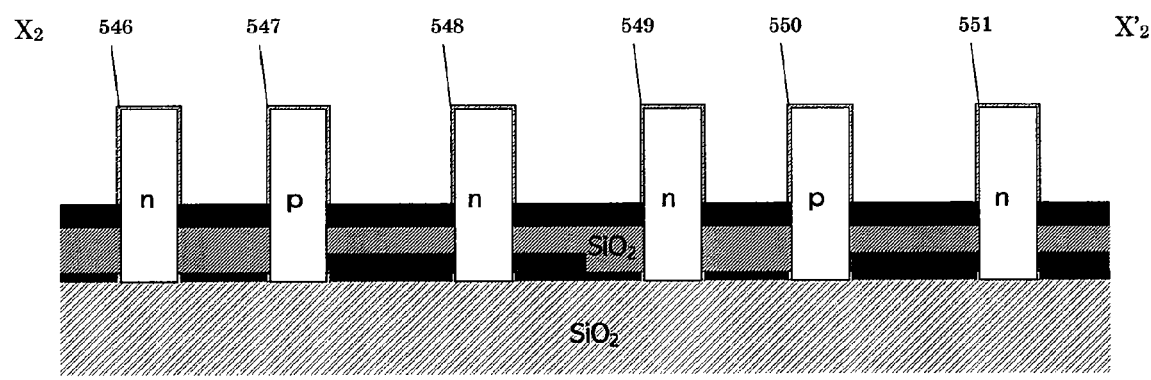
FIG. 90 is a sectional view ($X_2$-$X'_2$ section) showing the step in the example of the production method for the semiconductor device according to the first embodiment.
Figure 91:
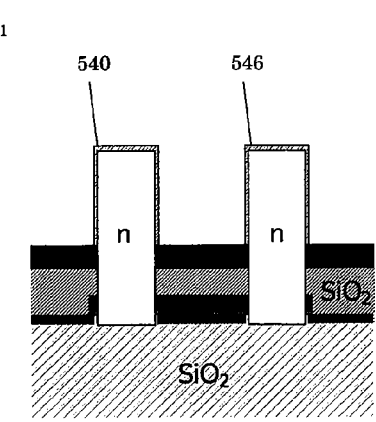
FIG. 91 is a sectional view ($Y_1$-$Y'_1$ section) showing the step in the example of the production method for the semiconductor device according to the first embodiment.
Figure 92:
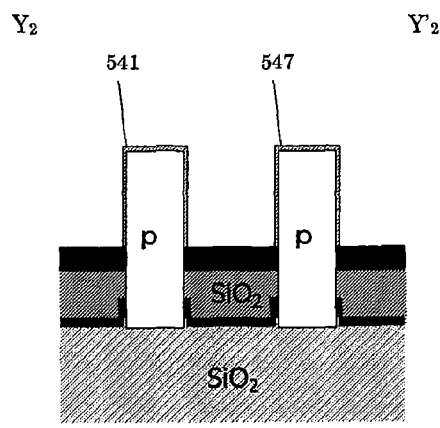
FIG. 92 is a sectional view ($Y_2$-$Y'_2$ section) showing the step in the example of the production method for the semiconductor device according to the first embodiment.

The island-shaped semiconductor layers are surface-oxidized to form gate dielectric films 540, 541, 542, 543, 544, 545, 546, 547, 548, 549, 550, 551 thereon (FIG. 89 ($X_1$-$X'_1$), FIG. 90 ($X_2$-$X'_2$), FIG. 91 ($Y_1$-$Y'_1$) and FIG. 92 ($Y_2$-$Y'_2$)).

Figure 93:
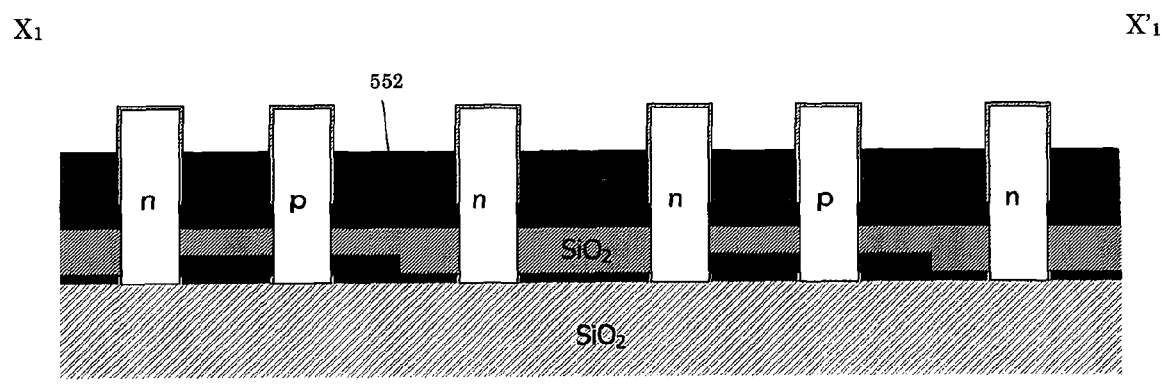
FIG. 93 is a sectional view ($X_1$-$X'_1$ section) showing a step in the example of the production method for the semiconductor device according to the first embodiment.
Figure 94:
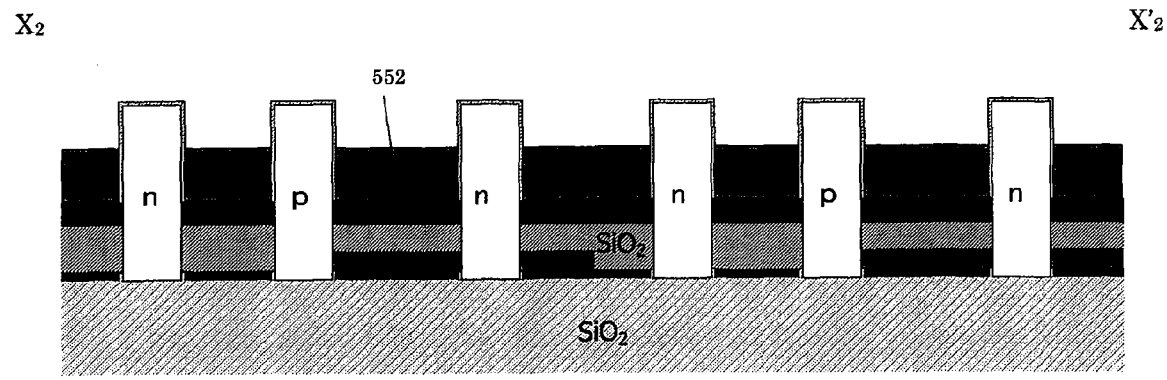
FIG. 94 is a sectional view ($X_2$-$X'_2$ section) showing the step in the example of the production method for the semiconductor device according to the first embodiment.
Figure 95:
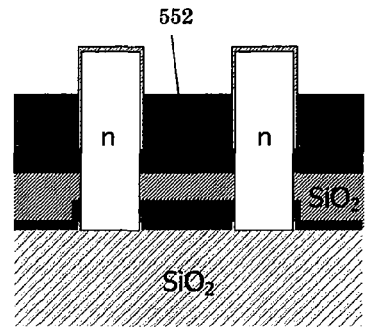
FIG. 95 is a sectional view ($Y_1$-$Y'_1$ section) showing the step in the example of the production method for the semiconductor device according to the first embodiment.
Figure 96:
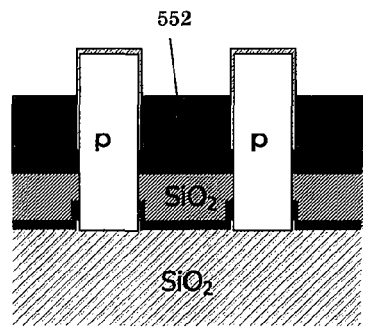
FIG. 96 is a sectional view ($Y_2$-$Y'_2$ section) showing the step in the example of the production method for the semiconductor device according to the first embodiment.

A polysilicon film 552 is deposited, and flattened by CMP. Then, the polysilicon film 552 is etched back (FIG. 93 ($X_1$-$X'_1$), FIG. 94 ($X_2$-$X'_2$), FIG. 95 ($Y_1$-$Y'_1$) and FIG. 96 ($Y_2$-$Y'_2$)).

Figure 97:
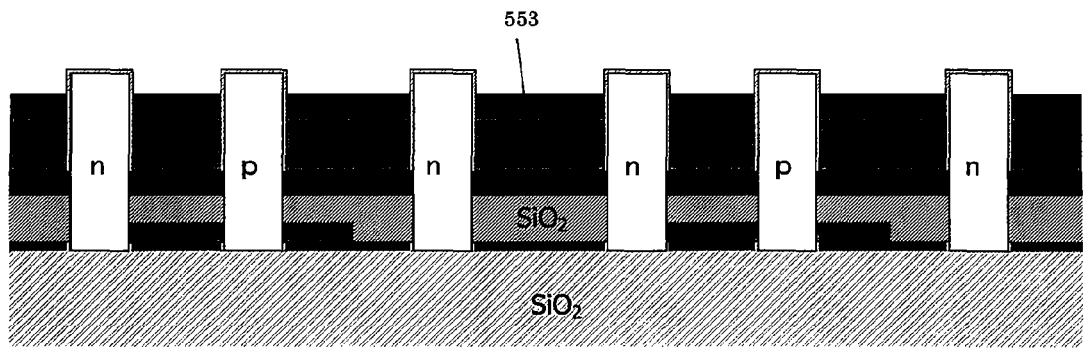
FIG. 97 is a sectional view ($X_1$-$X'_1$ section) showing a step in the example of the production method for the semiconductor device according to the first embodiment.
Figure 98:
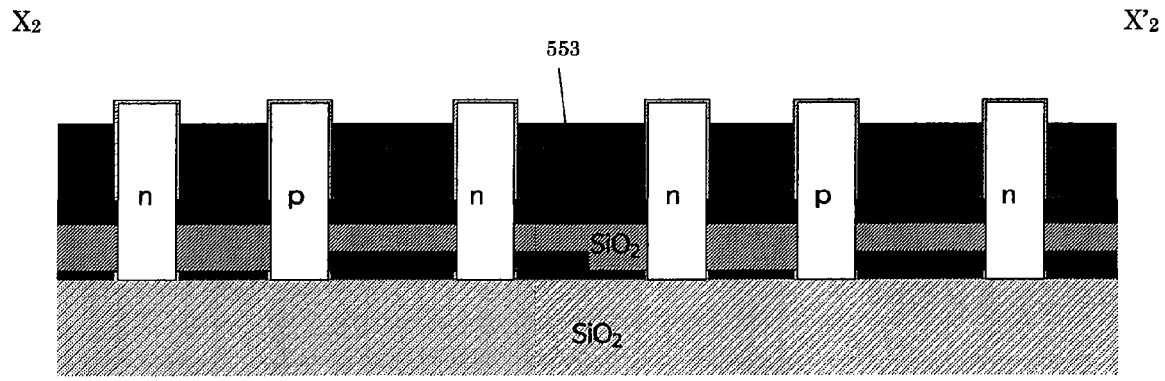
FIG. 98 is a sectional view ($X_2$-$X'_2$ section) showing the step in the example of the production method for the semiconductor device according to the first embodiment.
Figure 99:
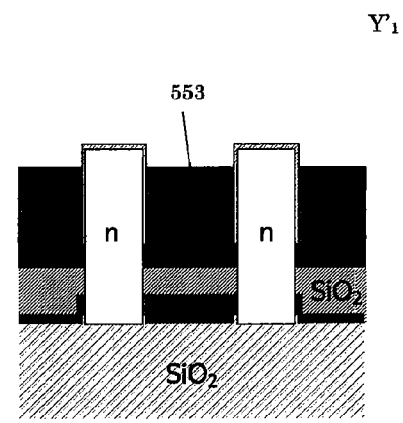
FIG. 99 is a sectional view ($Y_1$-$Y'_1$ section) showing the step in the example of the production method for the semiconductor device according to the first embodiment.
Figure 100:
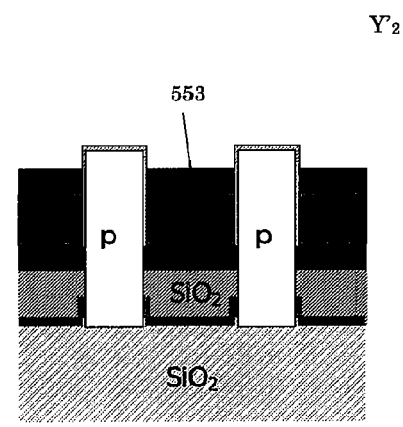
FIG. 100 is a sectional view ($Y_2$-$Y'_2$ section) showing the step in the example of the production method for the semiconductor device according to the first embodiment.

A nitride film 553 is deposited, and flattened by CMP. Then, the nitride film 553 is etched back (FIG. 97 ($X_1$-$X'_1$), FIG. 98 ($X_2$-$X'_2$), FIG. 99 ($Y_1$-$Y'_1$) and FIG. 100 ($Y_2$-$Y'_2$)).

Figure 101:
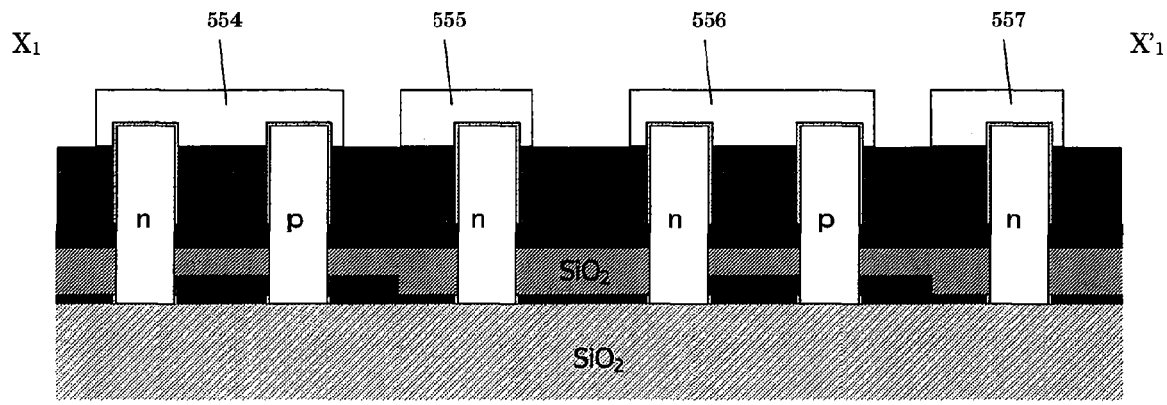
FIG. 101 is a sectional view ($X_1$-$X'_1$ section) showing a step in the example of the production method for the semiconductor device according to the first embodiment.
Figure 102:
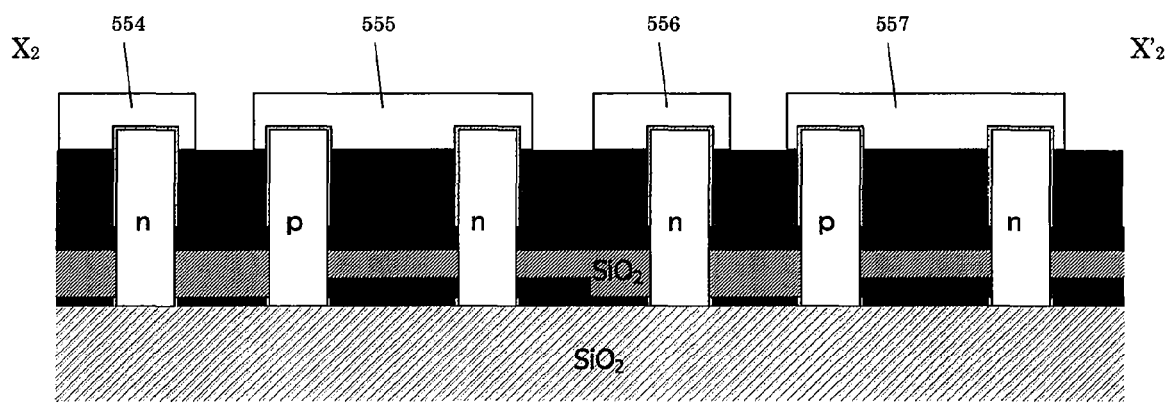
FIG. 102 is a sectional view ($X_2$-$X'_2$ section) showing the step in the example of the production method for the semiconductor device according to the first embodiment.
Figure 103:
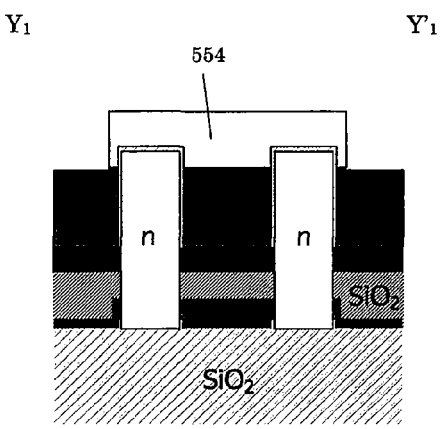
FIG. 103 is a sectional view ($Y_1$-$Y'_1$ section) showing the step in the example of the production method for the semiconductor device according to the first embodiment.
Figure 104:
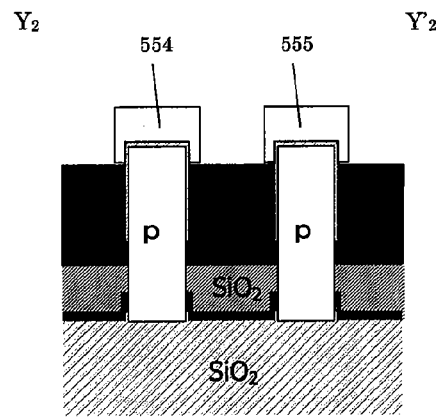
FIG. 104 is a sectional view ($Y_2$-$Y'_2$ section) showing the step in the example of the production method for the semiconductor device according to the first embodiment.

Resists 554, 555, 556, 557 are formed to allow an input terminal line to be formed (FIG. 101 ($X_1$-$X'_1$), FIG. 102 ($X_2$-$X'_2$), FIG. 103 ($Y_1$-$Y'_1$) and FIG. 104 ($Y_2$-$Y'_2$)).

Figure 105:
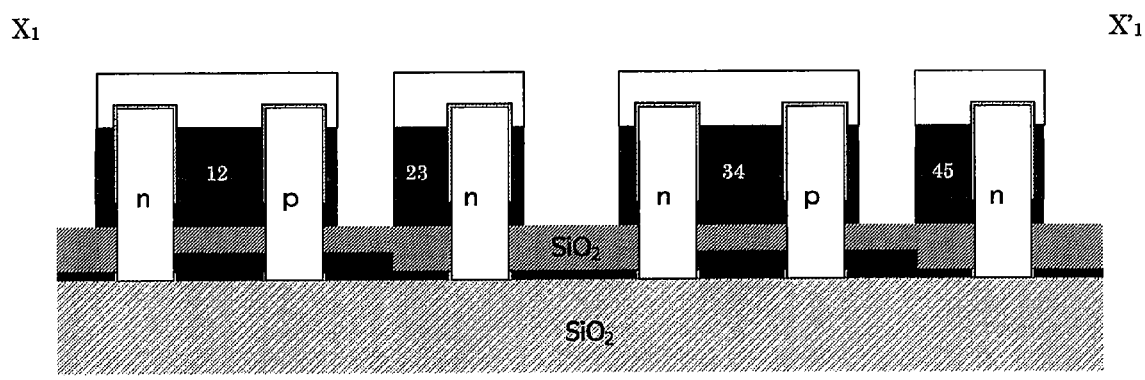
FIG. 105 is a sectional view ($X_1$-$X'_1$ section) showing a step in the example of the production method for the semiconductor device according to the first embodiment.
Figure 106:
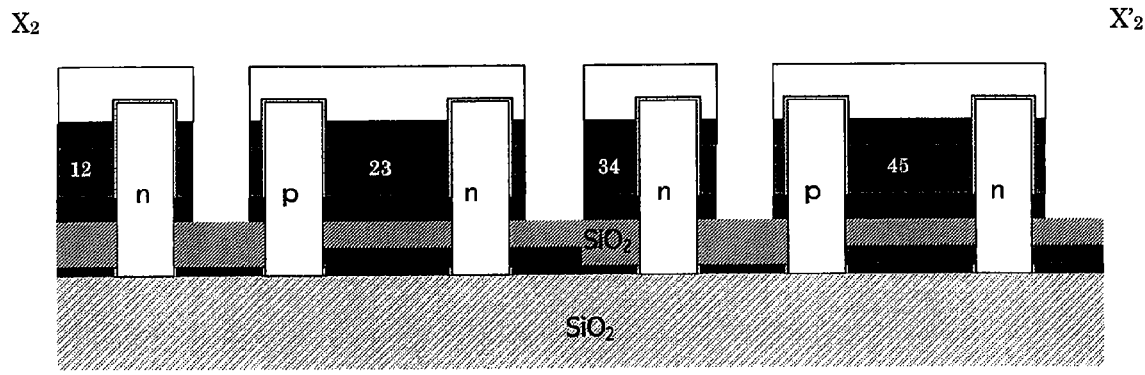
FIG. 106 is a sectional view ($X_2$-$X'_2$ section) showing the step in the example of the production method for the semiconductor device according to the first embodiment.
Figure 107:
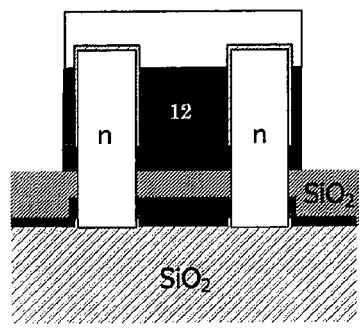
FIG. 107 is a sectional view ($Y_1$-$Y'_1$ section) showing the step in the example of the production method for the semiconductor device according to the first embodiment.
Figure 108:
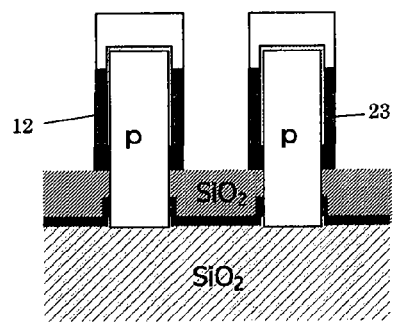
FIG. 108 is a sectional view ($Y_2$-$Y'_2$ section) showing the step in the example of the production method for the semiconductor device according to the first embodiment.

The nitride film 553, the polysilicon film 552 and nitride film 539 are etched to form input terminal lines or gates 12, 23, 34, 45 (FIG. 105 ($X_1$-$X'_1$), FIG. 106 ($X_2$-$X'_2$), FIG. 107 ($Y_1$-$Y'_1$) and FIG. 108 ($Y_2$-$Y'_2$)).

Figure 109:
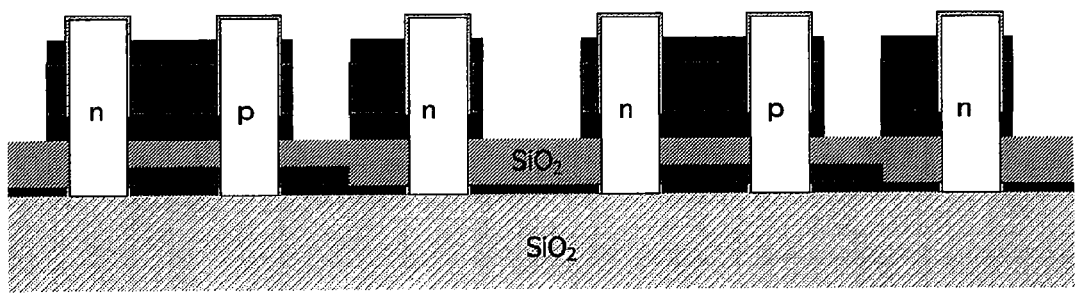
FIG. 109 is a sectional view ($X_1$-$X'_1$ section) showing a step in the example of the production method for the semiconductor device according to the first embodiment.
Figure 110:
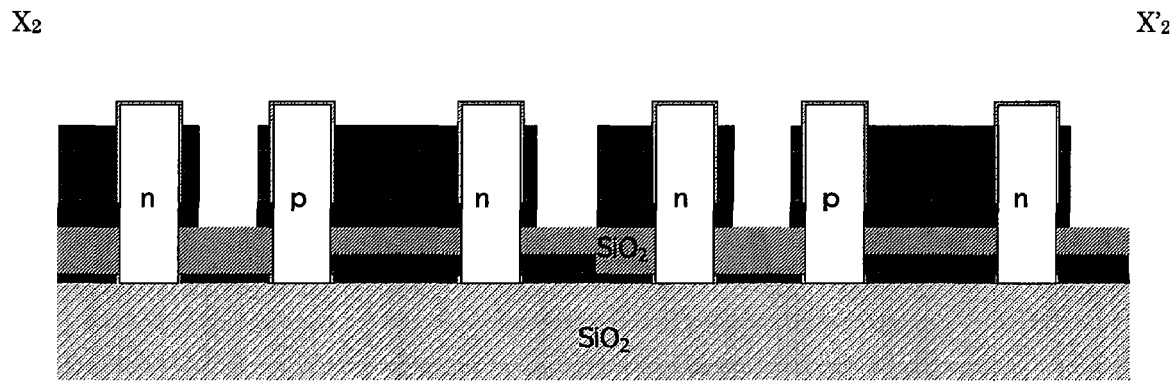
FIG. 110 is a sectional view ($X_2$-$X'_2$ section) showing the step in the example of the production method for the semiconductor device according to the first embodiment.
Figure 111:
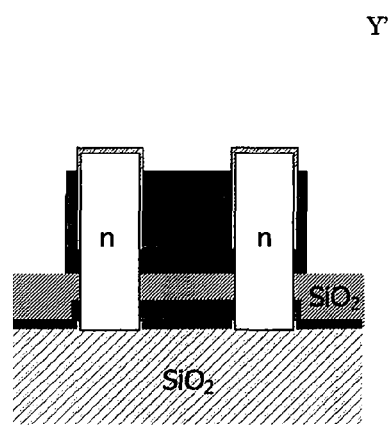
FIG. 111 is a sectional view ($Y_1$-$Y'_1$ section) showing the step in the example of the production method for the semiconductor device according to the first embodiment.
Figure 112:
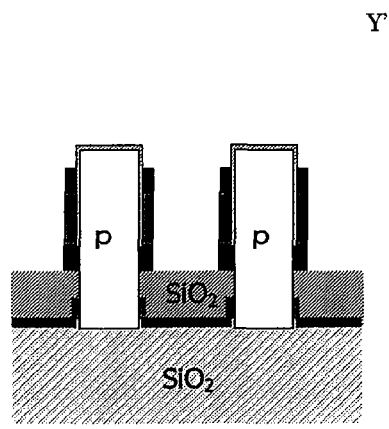
FIG. 112 is a sectional view ($Y_2$-$Y'_2$ section) showing the step in the example of the production method for the semiconductor device according to the first embodiment.

The resists are removed (FIG. 109 ($X_1$-$X'_1$), FIG. 110 ($X_2$-$X'_2$), FIG. 111 ($Y_1$-$Y'_1$) and FIG. 112 ($Y_2$-$Y'_2$)).

Figure 113:
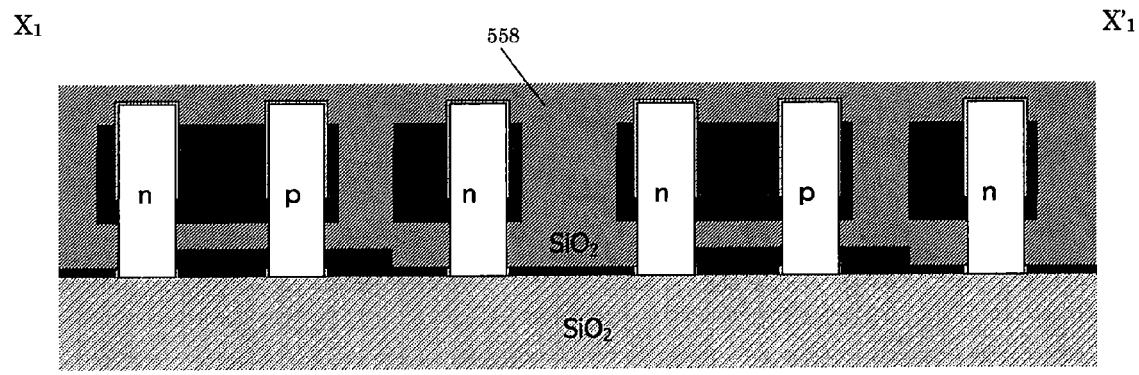
FIG. 113 is a sectional view ($X_1$-$X'_1$ section) showing a step in the example of the production method for the semiconductor device according to the first embodiment.
Figure 114:
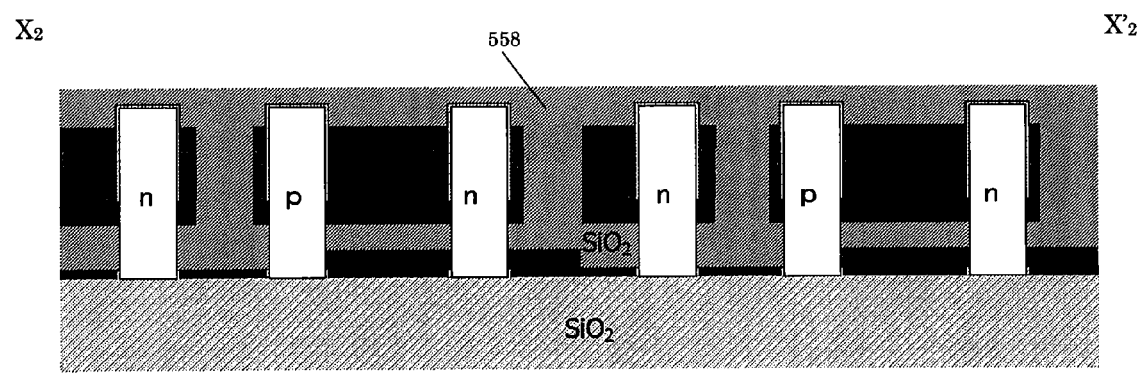
FIG. 114 is a sectional view ($X_2$-$X'_2$ section) showing the step in the example of the production method for the semiconductor device according to the first embodiment.
Figure 115:
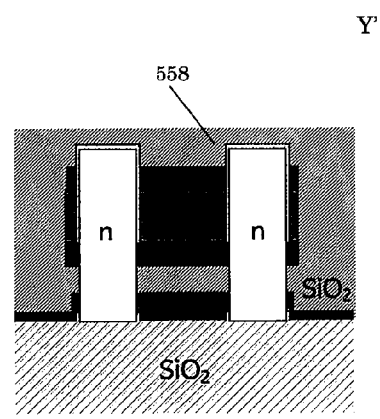
FIG. 115 is a sectional view ($Y_1$-$Y'_1$ section) showing the step in the example of the production method for the semiconductor device according to the first embodiment.
Figure 116:
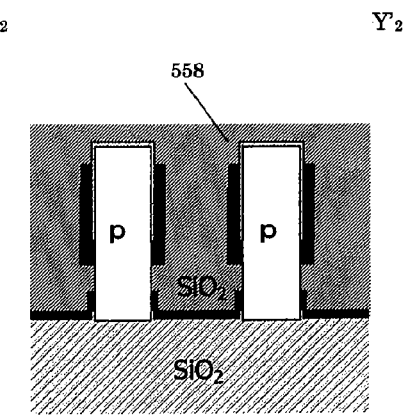
FIG. 116 is a sectional view ($Y_2$-$Y'_2$ section) showing the step in the example of the production method for the semiconductor device according to the first embodiment.

An oxide film 558 is deposited, and flattened by CMP. Then, the oxide film 558 is etched back (FIG. 113 ($X_1$-$X'_1$), FIG. 114 ($X_2$-$X'_2$), FIG. 115 ($Y_1$-$Y'_1$) and FIG. 116 ($Y_2$-$Y'_2$)).

Figure 117:
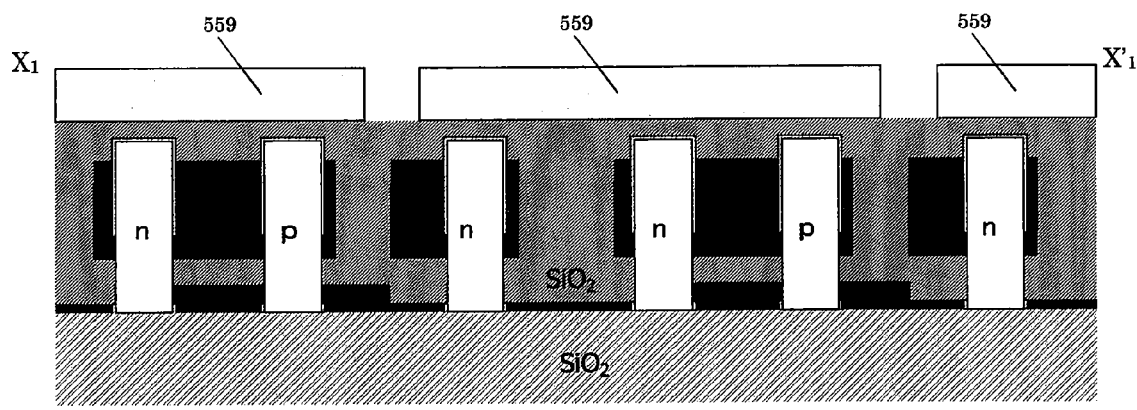
FIG. 117 is a sectional view ($X_1$-$X'_1$ section) showing a step in the example of the production method for the semiconductor device according to the first embodiment.
Figure 118:
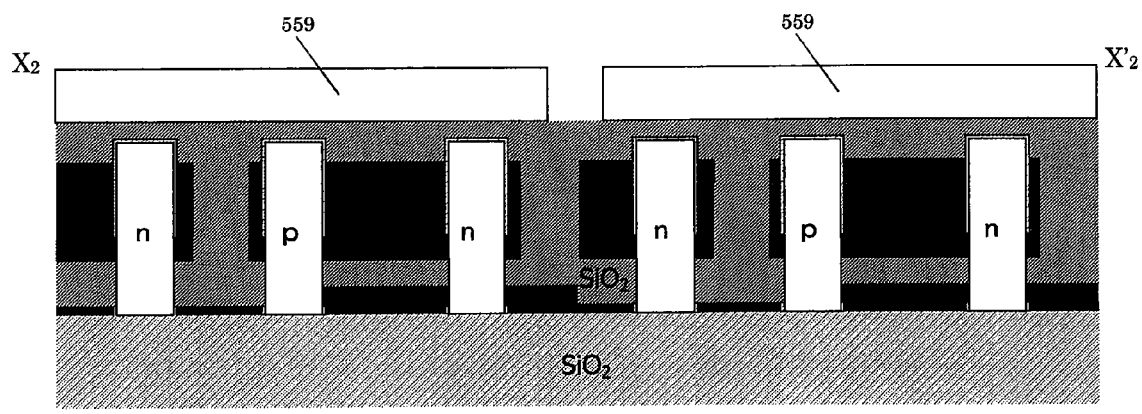
FIG. 118 is a sectional view ($X_2$-$X'_2$ section) showing the step in the example of the production method for the semiconductor device according to the first embodiment.
Figure 119:
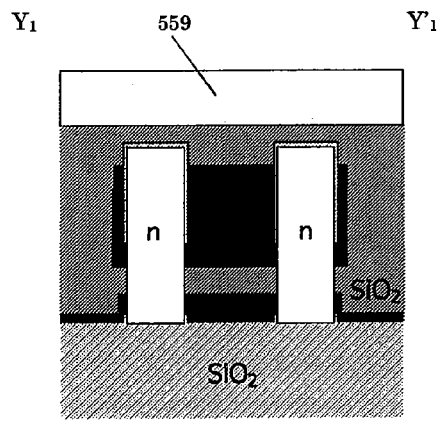
FIG. 119 is a sectional view ($Y_1$-$Y'_1$ section) showing the step in the example of the production method for the semiconductor device according to the first embodiment.
Figure 120:
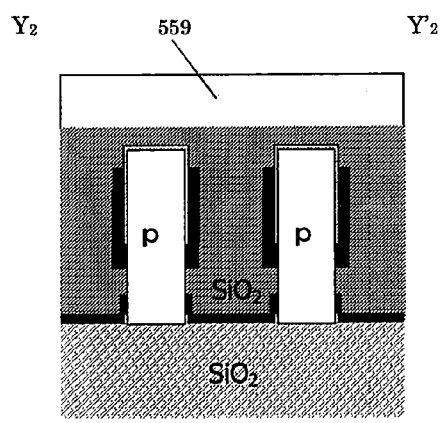

A resist 559 is formed to allow contacts between respective ones of the gates and the island-shaped semiconductor lower layers (FIG. 117 ($X_1$-$X'_1$), FIG. 118 ($X_2$-$X'_2$), FIG. 119 ($Y_1$-$Y'_1$) and FIG. 120 ($Y_2$-$Y'_2$)).

Figure 121:
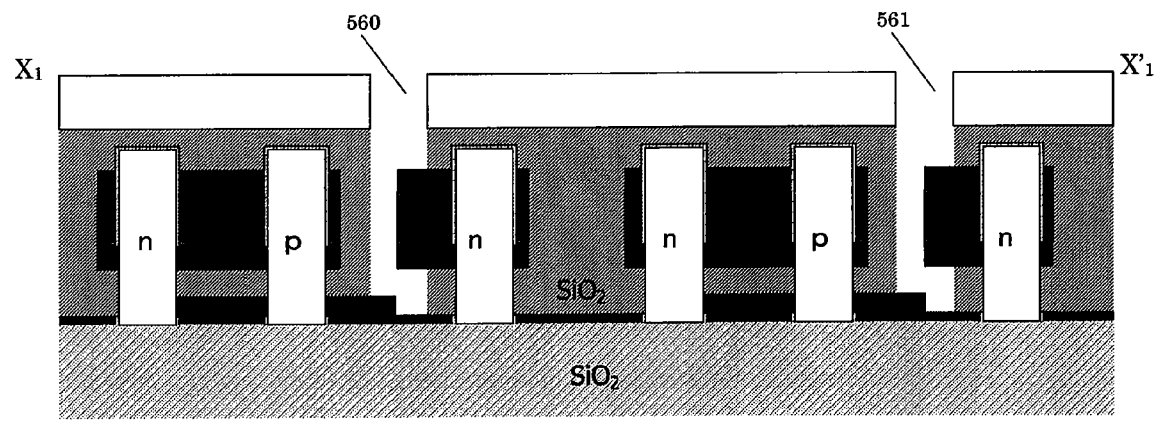
Figure 122:
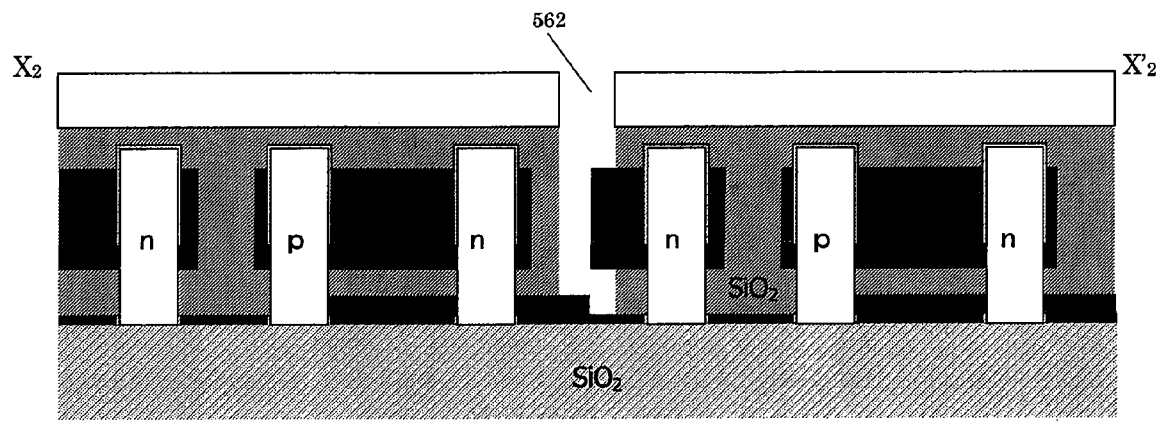
Figure 123:
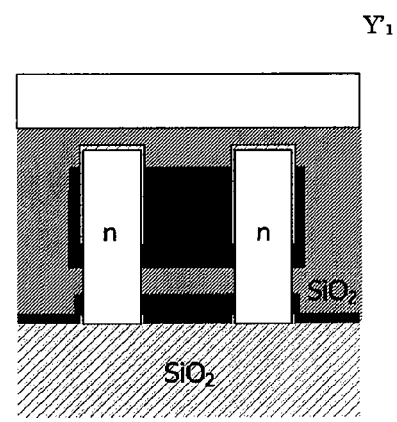
Figure 124:
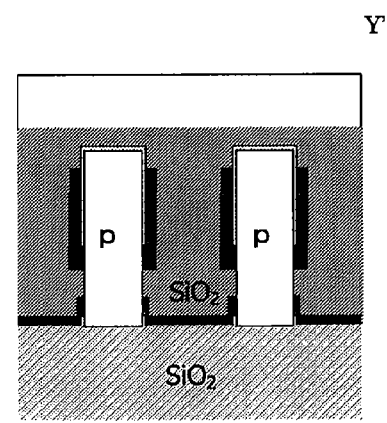

The oxide film is etched to form contact holes 560, 561, 562 between respective ones of the gates and the island-shaped semiconductor lower layers (FIG. 121 ($X_1$-$X'_1$), FIG. 122 ($X_2$-$X'_2$), FIG. 123 ($Y_1$-$Y'_1$) and FIG. 124 ($Y_2$-$Y'_2$)).

Figure 125:
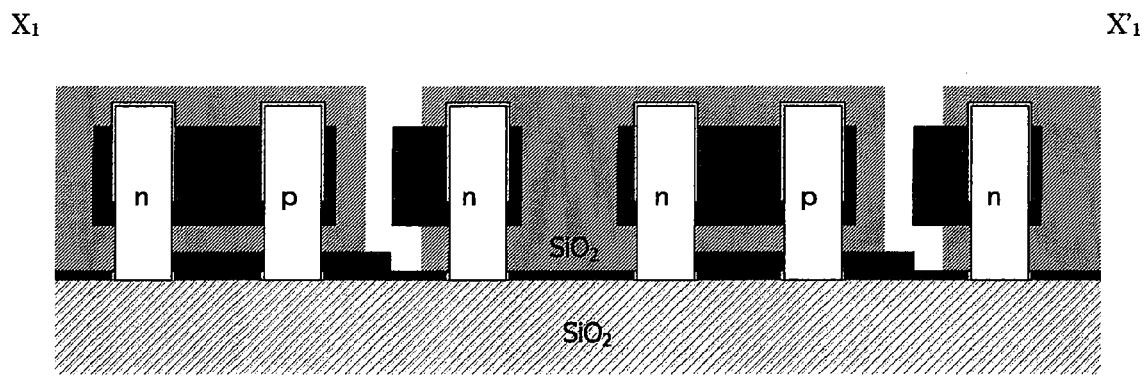
Figure 126:
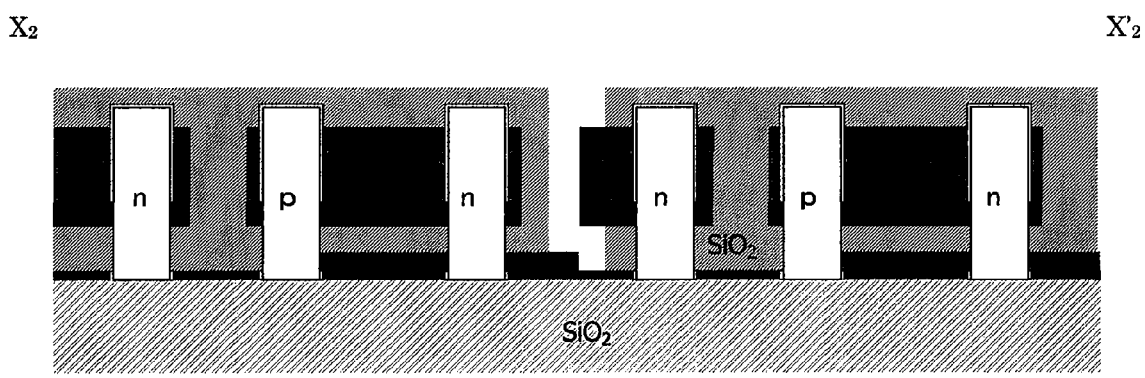
Figure 127:
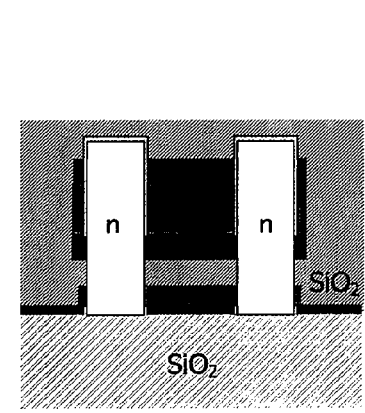
Figure 128:
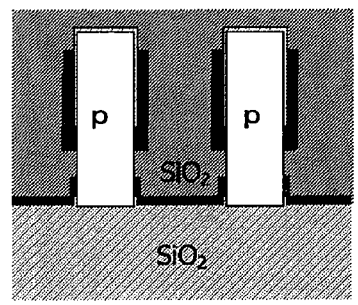

The resist is removed (FIG. 125 ($X_1$-$X'_1$), FIG. 126 ($X_2$-$X'_2$), FIG. 127 ($Y_1$-$Y'_1$) and FIG. 128 ($Y_2$-$Y'_2$)).

Figure 129:
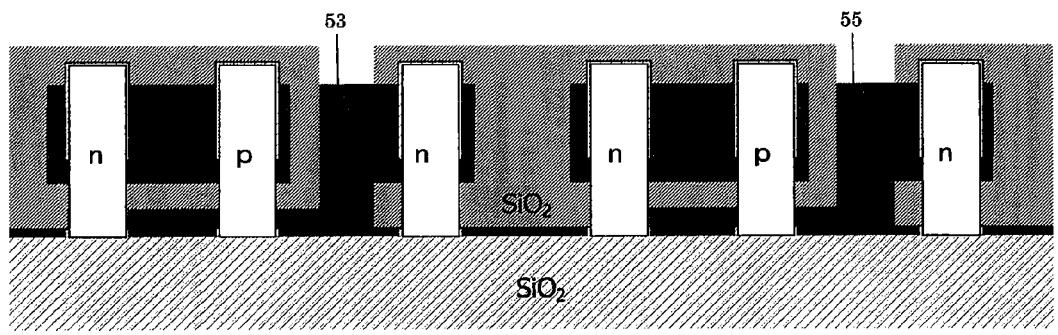
Figure 130:
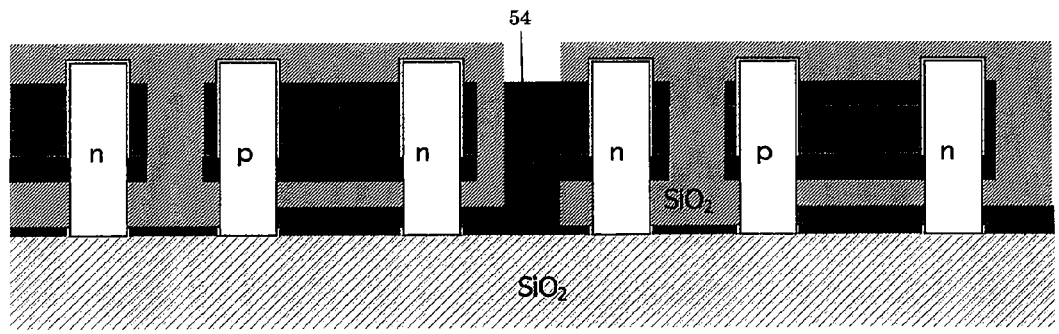
Figure 131:
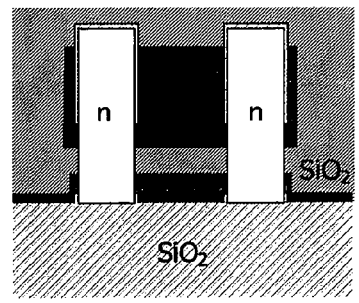

A polysilicon film is deposited, and flattened by CMP. Then, the polysilicon film is etched back to form contacts 53, 54, 55 between the respective ones of the gates and the island-shaped semiconductor lower layers (FIG. 129 ($X_1$-$X'_1$), FIG. 130 ($X_2$-$X'_2$), FIG. 131 ($Y_1$-$Y'_1$) and FIG. 132 ($Y_2$-$Y'_2$)).

The oxide film is removed (FIG. 133 ($X_1$-$X'_1$), FIG. 134 ($X_2$-$X'_2$), FIG. 135 ($Y_1$-$Y'_1$) and FIG. 136 ($Y_2$-$Y'_2$)).

A surface of each of the island-shaped semiconductor layers are oxidized (FIG. 137 ($X_1$-$X'_1$), FIG. 138 ($X_2$-$X'_2$), FIG. 139 ($Y_1$-$Y'_1$) and FIG. 140 ($Y_2$-$Y'_2$)).

Resists 563, 564, 565 are formed to allow a drain diffusion layer and a source diffusion layer for an n-channel semiconductor device to be formed (FIG. 141 ($X_1$-$X'_1$), FIG. 142 ($X_2$-$X'_2$), FIG. 143 ($Y_1$-$Y'_1$) and FIG. 144 ($Y_2$-$Y'_2$)).

Arsenic (As) is implanted into the p-type silicon pillars by an ion-implantation process or the like, to form drain diffusion layers 9, 20, 31, 42 and source diffusion layers 11, 22, 33, 44 therein (FIG. 145 ($X_1$-$X'_1$), FIG. 146 ($X_2$-$X'_2$), FIG. 147 ($Y_1$-$Y'_1$) and FIG. 148 ($Y_2$-$Y'_2$)).

Resists 566, 567, 568 are formed to allow a drain diffusion layer and a source diffusion layer for a p-channel semiconductor device to be formed (FIG. 149 ($X_1$-$X'_1$), FIG. 150 ($X_2$-$X'_2$), FIG. 151 ($Y_1$-$Y'_1$) and FIG. 152 ($Y_2$-$Y'_2$)).

Boron (B) is implanted into the n-type silicon pillars by an ion-implantation process or the like, to form drain diffusion layers 13, 16, 24, 27, 35, 38, 46, 49 and source diffusion layers 15, 18, 26, 29, 37, 40, 48, 51 therein (FIG. 153 ($X_1$-$X'_1$), FIG. 154 ($X_2$-$X'_2$), FIG. 155 ($Y_1$-$Y'_1$) and FIG. 156 ($Y_2$-$Y'_2$)).

After removing the resists, the silicon pillars are subjected to a thermal process to ionize the impurity (FIG. 157 ($X_1$-$X'_1$), FIG. 158 ($X_2$-$X'_2$), FIG. 159 ($Y_1$-$Y'_1$) and FIG. 160 ($Y_2$-$Y'_2$)).

The oxide films are removed (FIG. 161 ($X_1$-$X'_1$), FIG. 162 ($X_2$-$X'_2$), FIG. 163 ($Y_1$-$Y'_1$) and FIG. 164 ($Y_2$-$Y'_2$)).

A metal 568, such as cobalt (Co) or nickel (Ni), is deposited by sputtering or CVD (FIG. 165 ($X_1$-$X'_1$), FIG. 166 ($X_2$-$X'_2$), FIG. 167 ($Y_1$-$Y'_1$) and FIG. 168 ($Y_2$-$Y'_2$)).

The resulting product is subjected to a thermal process so as to produce a reaction between the metal and silicon to form salicide (FIG. 169 ($X_1$-$X'_1$), FIG. 170 ($X_2$-$X'_2$), FIG. 171 ($Y_1$-$Y'_1$) and FIG. 172 ($Y_2$-$Y'_2$)).

The remaining metal unreacted with silicon is etched away (FIG. 173 ($X_1$-$X'_1$), FIG. 174 ($X_2$-$X'_2$), FIG. 175 ($Y_1$-$Y'_1$) and FIG. 176 ($Y_2$-$Y'_2$)).

An oxide film 569 is deposited, and flattened by CMP. Then, the oxide film 569 is etched back (FIG. 177 ($X_1$-$X'_1$), FIG. 178 ($X_2$-$X'_2$), FIG. 179 ($Y_1$-$Y'_1$) and FIG. 180 ($Y_2$-$Y'_2$)).

A resist 570 is formed to allow a contact to be formed (FIG. 181 ($X_1$-$X'_1$), FIG. 182 ($X_2$-$X'_2$), FIG. 183 ($Y_1$-$Y'_1$) and FIG. 184 ($Y_2$-$Y'_2$)).

The oxide film is etched (FIG. 185 ($X_1$-$X'_1$), FIG. 186 ($X_2$-$X'_2$), FIG. 187 ($Y_1$-$Y'_1$) and FIG. 188 ($Y_2$-$Y'_2$)).

The resist is removed (FIG. 189 ($X_1$-$X'_1$), FIG. 190 ($X_2$-$X'_2$), FIG. 191 ($Y_1$-$Y'_1$) and FIG. 192 ($Y_2$-$Y'_2$)).

A metal 571 is deposited, and flattened by CMP (FIG. 193 ($X_1$-$X'_1$), FIG. 194 ($X_2$-$X'_2$), FIG. 195 ($Y_1$-$Y'_1$) and FIG. 196 ($Y_2$-$Y'_2$)).

Resists 572, 573, 574, 575, 576 are formed to allow a first power supply line and a second power supply line to be formed (FIG. 197 ($X_1$-$X'_1$), FIG. 198 ($X_2$-$X'_2$), FIG. 199 ($Y_1$-$Y'_1$) and FIG. 200 ($Y_2$-$Y'_2$)).

The metal is etched to form first power supply lines Vssl 57, 59 as a Vss lines and form second power supply lines Vccl 56,

58, 60 as Vcc lines (FIG. 201 ($X_1$-$X'_1$), FIG. 202 ($X_2$-$X'_2$), FIG. 203 ($Y_1$-$Y'_1$) and FIG. 204 ($Y_2$-$Y'_2$)).

The resists are removed (FIG. 205 ($X_1$-$X'_1$), FIG. 206 ($X_2$-$X'_2$), FIG. 207 ($Y_1$-$Y'_1$) and FIG. 208 ($Y_2$-$Y'_2$)).

An oxide film 577 is deposited, and flattened by CMP (FIG. 209 ($X_1$-$X'_1$), FIG. 210 ($X_2$-$X'_2$), FIG. 211 ($Y_1$-$Y'_1$) and FIG. 212 ($Y_2$-$Y'_2$)).

As described above, the conventional SGT-based two-stage CMOS inverter employs a structure where a first power supply potential Vss and a second power supply potential Vcc are supplied to respective diffusion layers in a silicon substrate SGTs through a plurality of contacts. Specifically, two power supply lines for the nMOS and pMOS SGTs are arranged on one side of a lower portion of a gate region which is different from an on-substrate region where nMOS and pMOS layers are arranged.

In contrast, the semiconductor device according to the above embodiment comprises a first power supply line Vss1 and a second power supply line Vcc1 each arranged to supply a respective one of a first power supply potential Vss and a second power supply potential Vcc to a corresponding one of an nMOS SGT and a pMOS SGT from thereabove, wherein: the first power supply line Vss1 includes a first power supply line Vss1 connected to a source diffusion layer of an n-channel semiconductor device in a first inverter, and a first power supply line Vss1 connected to a source diffusion layer of an n-channel semiconductor device in a second inverter; and the second power supply line Vcc1 includes a second power supply line Vcc1 connected to respective source diffusion layers of two p-channel semiconductor devices in the first inverter, and a second power supply line Vcc1 connected to respective source diffusion layers of two p-channel semiconductor device in the second inverter. This makes it possible to reduce an area of the first power supply line Vss1 and the second power supply line Vcc1, to allow the semiconductor device to have an SGT-based highly-integrated CMOS inverter cascade circuit.

In addition, the above feature in which each of the first power supply line Vss1 and the second power supply line Vcc1 is arranged to supply a respective one of a first power supply potential Vss and a second power supply potential Vcc to a corresponding one of an nMOS SGT and a pMOS SGT from thereabove, wherein: the first power supply line Vss1 includes a first power supply line Vss1 connected to a source diffusion layer of an n-channel semiconductor device in a first inverter, and a first power supply line Vss1 connected to a source diffusion layer of an n-channel semiconductor device in a second inverter; and the second power supply line Vcc1 includes a second power supply line Vcc1 connected to respective source diffusion layers of two p-channel semiconductor devices in the first inverter, and a second power supply line Vcc1 connected to respective source diffusion layers of two p-channel semiconductor device in the second inverter, makes it possible reduce a resistance of the first power supply line Vss1 and the second power supply line Vcc1, to allow the semiconductor device to have an SGT-based high-speed CMOS inverter cascade circuit.

Further, the semiconductor device according to the above embodiment comprises an output terminal arranged to interconnect the drain diffusion layer of the n-channel semiconductor device and the drain diffusion layers of the p-channel semiconductor devices, through an island-shaped semiconductor lower layer. This makes it possible to eliminate a need for providing a contact for use in connecting a metal line and the drain diffusion layer of the n-channel semiconductor device, a contact for use in connecting a metal line and each of the drain diffusion layers of the p-channel semiconductor devices, and the metal lines to be connected to the contacts, to allow the semiconductor device to have an SGT-based highly-integrated CMOS inverter cascade circuit.

In the semiconductor device according to the above embodiment, the two p-MOS SGTs of the first inverter are arranged at respective ones of the intersection of the 1st row and the 1st column and the intersection of the 2nd row and the 1st column, and the n-MOS SGT of the first inverter is arranged at the intersection of the 1st row and the 2nd column. Further, the two p-MOS SGTs of the second inverter are arranged at respective ones of the intersection of the 1st row and the 3rd column and the intersection of the 2nd row and the 3rd column, and the n-MOS SGT of the second inverter is arranged at the intersection of the 2nd row and the 2nd column. This makes it possible to allow the semiconductor device to have an SGT-based highly-integrated CMOS inverter cascade circuit.

What is claimed is:

1. A semiconductor device comprising a CMOS inverter cascade circuit having a plurality of CMOS inverters cascade-connected in at least two stages, wherein the CMOS inverter cascade circuit includes a first CMOS inverter and a second CMOS inverter which are formed as a two-stage CMOS inverter made up of six MOS transistors arranged on a substrate in a two-row by three-column array, and wherein: each of two MOS transistors in a respective one of the 1st column and the 3rd column is a p-channel MOS transistor; and two MOS transistors in the 2nd column is an n-channel MOS transistor, each of the p-channel MOS transistors and the n-channel MOS transistors having a structure where a drain, a source and a gate thereof are arranged in a direction perpendicular to the substrate while allowing the gate to surround an island-shaped semiconductor layer, and wherein:

the first inverter CMOS inverter includes the two p-channel MOS transistors in the 1st column, a first one of the two n-channel MOS transistors in the 2nd column, a first-CMOS-inverter input terminal arranged to interconnect the gate of the first n-channel MOS transistor in the 2nd column, and the gate of each of the two p-channel MOS transistors in the 1st column, a first-CMOS-inverter output terminal arranged to interconnect a drain diffusion layer of the first n-channel MOS transistor in the 2nd column, and a drain diffusion layer of each of the two p-channel MOS transistors in the 1st column, through an island-shaped semiconductor lower layer, a first power supply line provided for the first CMOS inverter and arranged on a source diffusion layer of the first n-channel MOS transistor in the 2nd column, and a second power supply line provided for the first CMOS inverter and arranged on a source diffusion layer of each of the two p-channel MOS transistors in the 1st column; and the second CMOS inverter has the two p-channel MOS transistors in the 3rd column, a second one of the two n-channel MOS transistors in the 2nd column, other than the first n-channel MOS transistor in the 2nd column, a second-CMOS-inverter input terminal arranged to interconnect the gate of the second n-channel MOS transistor in the 2nd column, and the gate of each of the two p-channel MOS transistors in the 3rd column, a second-CMOS-inverter output terminal arranged to interconnect a drain diffusion layer of the second n-channel MOS transistor in the 2nd column, and a drain diffusion layer of each of the two p-channel MOS transistors in the 3rd column, through an island-shaped semiconductor lower layer, a first power supply line provided for the second CMOS inverter and arranged on a source diffusion layer of the second n-channel MOS transistor in the 2nd column, and a second power supply line provided for the second CMOS inverter and arranged on a source diffusion layer of each of the two p-channel MOS transistors in the 3rd column, and wherein:

the first power supply line provided for the first CMOS inverter and the first power supply line provided for the second CMOS inverter are connected to each other on the source diffusion layers of the two n-channel MOS transistors in the 2nd column; and the first-CMOS-inverter output terminal is connected to the second-CMOS-inverter input terminal.

2. The semiconductor device as defined in claim 1, wherein the CMOS inverter cascade circuit includes a (2×N)-stage CMOS inverter having a number N of the two-stage CMOS inverters arranged on the substrate in a row direction (wherein N is an integer of 2 or more), and wherein:

each of the first-CMOS-inverter output terminal and the second-CMOS-inverter output terminal is connected to a respective one of the second-CMOS-inverter input terminal and the first-CMOS-inverter input terminal adjacent thereto; and the second power supply lines arranged on the source diffusion layers of adjacent four of the p-channel MOS transistors are connected to each other on the source diffusion layers of the adjacent four p-channel MOS transistors.

3. The semiconductor device as defined in claim 2 having an re-channel MOS transistor comprising:

a drain, a gate and a source which are arranged in a direction perpendicular to a substrate while allowing the gate to surround an island-shaped semiconductor layer;

a dielectric layer formed above and below the gate;

a polysilicon line formed as an island-shaped semiconductor lower layer to surround a part of a drain diffusion layer; and a metal line formed on a source diffusion layer, wherein each of the drain diffusion layer, the polysilicon line, the gate and the source diffusion layer has a salicided structure.

4. The semiconductor device as defined in claim 2 having a p-channel MOS transistor comprising:

a drain, a gate and a source which are arranged in a direction perpendicular to a substrate while allowing the gate to surround an island-shaped semiconductor layer;

a dielectric layer formed above and below the gate;

a polysilicon line formed as an island-shaped semiconductor lower layer to surround a part of a drain diffusion layer; and a metal line formed on a source diffusion layer, wherein each of the drain diffusion layer, the polysilicon line, the gate and the source diffusion layer has a salicided structure.

5. The semiconductor device as defined in claim 1, wherein the CMOS inverter cascade circuit includes, on the substrate, a CMOS inverter array configured such that a number N of the two-stage CMOS inverters are arranged in a row direction, and a number M of the two-stage CMOS inverters are arranged in a column direction (wherein N is an integer of 2 or more, and M is an integer of 2 or more), and wherein the second power supply lines provided for respective ones of the M first CMOS inverters arranged in the column direction are connected to each other on the source diffusion layers of the p-channel MOS transistors in the M first CMOS inverters;

the second power supply lines provided for respective ones of the M second CMOS inverters arranged in the column direction are connected to each other on the source diffusion layers of the p-channel MOS transistors in the M second CMOS inverters; and the first power supply lines provided for respective ones of the M first CMOS inverters arranged in the column direction, and the first power supply lines provided for respective ones of the M second CMOS inverters arranged in the column direction are connected to each other on the source diffusion layers of the n-channel MOS transistors in the M first CMOS inverters and the M second CMOS inverters.

6. The semiconductor device as defined in claim 5 having an re-channel MOS transistor comprising:

a drain, a gate and a source which are arranged in a direction perpendicular to a substrate while allowing the gate to surround an island-shaped semiconductor layer;

a dielectric layer formed above and below the gate;

a polysilicon line formed as an island-shaped semiconductor lower layer to surround a part of a drain diffusion layer; and a metal line formed on a source diffusion layer, wherein each of the drain diffusion layer, the polysilicon line, the gate and the source diffusion layer has a salicided structure.

7. The semiconductor device as defined in claim 5 having a p-channel MOS transistor comprising:

a drain, a gate and a source which are arranged in a direction perpendicular to a substrate while allowing the gate to surround an island-shaped semiconductor layer;

a dielectric layer formed above and below the gate;

a polysilicon line formed as an island-shaped semiconductor lower layer to surround a part of a drain diffusion layer; and a metal line formed on a source diffusion layer, wherein each of the drain diffusion layer, the polysilicon line, the gate and the source diffusion layer has a salicided structure.

8. The semiconductor device as defined in claim 1, wherein the CMOS inverter cascade circuit has, on the substrate, a CMOS inverter array configured such that a number N of the two-stage CMOS inverters are arranged in a row direction, and a number M of the two-stage CMOS inverters are arranged in a column direction (wherein N is an integer of 2 or more, and M is an integer of 2 or more, and wherein:

the first power supply lines provided for respective ones of the first and second CMOS inverters successively arranged in the column direction are connected to each other on the source diffusion layers of the n-channel MOS transistors of the first and second CMOS inverters over the column direction;

the second power supply lines provided for respective ones of the first CMOS inverters successively arranged in the column direction are connected to each other on the source diffusion layers of the p-channel MOS transistors of the first CMOS inverters over the column direction;

the second power supply lines provided for respective ones of the first and second CMOS inverters adjacent to each other in the row direction are further connected to each other in the row direction on the p-channel transistors of the adjacent CMOS inverters; and each of the first-CMOS-inverter output terminal and the second-CMOS-inverter output terminal is connected to a respective one of the second-CMOS-inverter input terminal and the first-CMOS-inverter input terminal adjacent thereto in the row direction.

9. The semiconductor device as defined in claim 8 having an re-channel MOS transistor comprising:
   a drain, a gate and a source which are arranged in a direction perpendicular to a substrate while allowing the gate to surround an island-shaped semiconductor layer;
   a dielectric layer formed above and below the gate;
   a polysilicon line formed as an island-shaped semiconductor lower layer to surround a part of a drain diffusion layer; and
   a metal line formed on a source diffusion layer,
   wherein each of the drain diffusion layer, the polysilicon line, the gate and the source diffusion layer has a salicided structure.

10. The semiconductor device as defined in claim 8 having a p-channel MOS transistor comprising:
    a drain, a gate and a source which are arranged in a direction perpendicular to a substrate while allowing the gate to surround an island-shaped semiconductor layer;
    a dielectric layer formed above and below the gate;
    a polysilicon line formed as an island-shaped semiconductor lower layer to surround a part of a drain diffusion layer; and
    a metal line formed on a source diffusion layer,
    wherein each of the drain diffusion layer, the polysilicon line, the gate and the source diffusion layer has a salicided structure.

11. The semiconductor device as defined in claim 1 having an re-channel MOS transistor comprising:
    a drain, a gate and a source which are arranged in a direction perpendicular to a substrate while allowing the gate to surround an island-shaped semiconductor layer;
    a dielectric layer formed above and below the gate;
    a polysilicon line formed as an island-shaped semiconductor lower layer to surround a part of a drain diffusion layer; and
    a metal line formed on a source diffusion layer,
    wherein each of the drain diffusion layer, the polysilicon line, the gate and the source diffusion layer has a salicided structure.

12. The semiconductor device as defined in claim 1 having a p-channel MOS transistor comprising:
    a drain, a gate and a source which are arranged in a direction perpendicular to a substrate while allowing the gate to surround an island-shaped semiconductor layer;
    a dielectric layer formed above and below the gate;
    a polysilicon line formed as an island-shaped semiconductor lower layer to surround a part of a drain diffusion layer; and
    a metal line formed on a source diffusion layer,
    wherein each of the drain diffusion layer, the polysilicon line, the gate and the source diffusion layer has a salicided structure.

* * * * *

UNITED STATES PATENT AND TRADEMARK OFFICE
CERTIFICATE OF CORRECTION

| | | |
|---|---|---|
| PATENT NO. | : 7,919,990 B2 | Page 1 of 1 |
| APPLICATION NO. | : 12/697683 | |
| DATED | : April 5, 2011 | |
| INVENTOR(S) | : Fujio Masuoka et al. | |

It is certified that error appears in the above-identified patent and that said Letters Patent is hereby corrected as shown below:

In column 37, claim 3, line 39, before "MOS transistor" replace "re-channel" with --n-channel--.

In column 38, claim 6, line 23, before "MOS transistor" replace "re-channel" with --n-channel--.

In column 39, claim 9, line 10, before "MOS transistor" replace "re-channel" with --n-channel--.

In column 40, claim 11, line 5, before "MOS transistor" replace "re-channel" with --n-channel--.

Signed and Sealed this
Sixteenth Day of August, 2011

David J. Kappos
*Director of the United States Patent and Trademark Office*